(12) United States Patent
Yamazaki et al.

(10) Patent No.: US 7,745,293 B2
(45) Date of Patent: Jun. 29, 2010

(54) METHOD FOR MANUFACTURING A THIN FILM TRANSISTOR INCLUDING FORMING IMPURITY REGIONS BY DIAGONAL DOPING

(75) Inventors: Shunpei Yamazaki, Setagaya (JP); Atsuo Isobe, Atsugi (JP); Tetsuji Yamaguchi, Atsugi (JP); Hiromichi Godo, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 30 days.

(21) Appl. No.: 11/148,289

(22) Filed: Jun. 9, 2005

(65) Prior Publication Data
US 2006/0071210 A1   Apr. 6, 2006

(30) Foreign Application Priority Data
Jun. 14, 2004   (JP)   ............. 2004-176241

(51) Int. Cl.
 *H01L 21/336* (2006.01)
(52) U.S. Cl. ............... 438/286; 438/486; 257/E29.279; 257/57; 257/213; 257/347
(58) Field of Classification Search ................. 438/286, 438/486, E29.279; 257/E29.279, 286, 486
See application file for complete search history.

(56) References Cited

U.S. PATENT DOCUMENTS

| | | | |
|---|---|---|---|
| 4,769,686 A | 9/1988 | Horiuchi et al. | |
| 5,424,244 A | 6/1995 | Zhang et al. | |
| 5,459,090 A | 10/1995 | Yamazaki et al. | |
| 5,576,556 A | 11/1996 | Takemura et al. | |
| 5,592,008 A | 1/1997 | Yamazaki et al. | |
| 5,650,340 A * | 7/1997 | Burr et al. .................... | 438/286 |
| 5,751,003 A | 5/1998 | Rose et al. | |

(Continued)

FOREIGN PATENT DOCUMENTS

CN    1211082    3/1999

(Continued)

OTHER PUBLICATIONS

Office Action (Application No. 200510079030.7) Dated Mar. 20, 2009.

(Continued)

*Primary Examiner*—Davienne Monbleau
*Assistant Examiner*—Christopher M Roland
(74) *Attorney, Agent, or Firm*—Eric J. Robinson; Robinson Intellectual Property Law Office, P.C.

(57) ABSTRACT

It is an object of the present invention to manufacture a thin film transistor having a required property without complicating steps and devices. It is another object of the present invention to provide a technique for manufacturing a semiconductor device having high reliability and better electrical characteristics with a higher yield at lower cost. In the present invention, a lightly doped impurity region is formed in a source region side or a drain region side of a semiconductor layer covered with a gate electrode layer in a thin film transistor. The semiconductor layer is doped diagonally to the surface thereof using the gate electrode layer as a mask to form the lightly doped impurity region. Therefore, the properties of the thin film transistor can be minutely controlled.

9 Claims, 34 Drawing Sheets

U.S. PATENT DOCUMENTS

| | | | |
|---|---|---|---|
| 5,767,930 A * | 6/1998 | Kobayashi et al. | 349/42 |
| 5,811,338 A * | 9/1998 | Kao et al. | 438/286 |
| 5,825,038 A | 10/1998 | Blake et al. | |
| 5,834,786 A | 11/1998 | White et al. | |
| 5,849,043 A | 12/1998 | Zhang et al. | |
| 5,892,235 A | 4/1999 | Yamazaki et al. | |
| 5,898,179 A | 4/1999 | Smick et al. | |
| 5,985,701 A | 11/1999 | Takei et al. | |
| 6,011,607 A | 1/2000 | Yamazaki et al. | |
| 6,017,783 A | 1/2000 | Yamazaki et al. | |
| 6,083,794 A * | 7/2000 | Hook et al. | 438/286 |
| 6,180,982 B1 | 1/2001 | Zhang et al. | |
| 6,251,712 B1 | 6/2001 | Tanaka et al. | |
| 6,291,325 B1 * | 9/2001 | Hsu | 438/525 |
| 6,355,512 B1 | 3/2002 | Yamazaki et al. | |
| 6,355,942 B1 | 3/2002 | Yamazaki et al. | |
| 6,358,784 B1 | 3/2002 | Zhang et al. | |
| 6,384,427 B1 * | 5/2002 | Yamazaki et al. | 257/59 |
| 6,486,014 B1 * | 11/2002 | Miyanaga et al. | 438/217 |
| 6,489,952 B1 | 12/2002 | Tanaka et al. | |
| 6,498,060 B2 | 12/2002 | Zhang et al. | |
| 6,507,069 B1 * | 1/2003 | Zhang et al. | 257/336 |
| 6,512,299 B1 | 1/2003 | Noda | |
| 6,518,102 B1 | 2/2003 | Tanaka et al. | |
| 6,521,912 B1 * | 2/2003 | Sakama et al. | 257/57 |
| 6,534,373 B1 * | 3/2003 | Yu | 438/372 |
| 6,555,843 B1 | 4/2003 | Yamazaki et al. | |
| 6,608,324 B1 | 8/2003 | Yamazaki et al. | |
| 6,624,013 B2 * | 9/2003 | Kawasaki et al. | 438/160 |
| 6,624,455 B2 | 9/2003 | Miyanaga et al. | |
| 6,635,505 B2 | 10/2003 | Tanaka et al. | |
| 6,655,767 B2 | 12/2003 | Zhang et al. | |
| 6,703,643 B2 | 3/2004 | Yamazaki et al. | |
| 6,734,446 B1 | 5/2004 | Yamazaki et al. | |
| 6,747,325 B2 * | 6/2004 | Shih | 257/408 |
| 6,773,971 B1 | 8/2004 | Zhang et al. | |
| 6,784,456 B2 | 8/2004 | Sera | |
| 6,831,333 B2 | 12/2004 | Zhang et al. | |
| 6,855,580 B2 | 2/2005 | Tanaka et al. | |
| 6,897,526 B1 | 5/2005 | Miyanaga et al. | |
| 7,009,205 B2 | 3/2006 | Gotoh et al. | |
| 7,015,084 B2 | 3/2006 | Sera | |
| 2003/0122131 A1 | 7/2003 | Zhang et al. | |
| 2003/0197133 A1 | 10/2003 | Turner et al. | |
| 2004/0007678 A1 | 1/2004 | Ferrara | |
| 2004/0007679 A1 | 1/2004 | Viviani | |
| 2004/0065924 A1 * | 4/2004 | Shih | 257/359 |
| 2004/0115940 A1 | 6/2004 | Zhang et al. | |
| 2005/0017246 A1 | 1/2005 | Sekiguchi et al. | |
| 2005/0263721 A1 | 12/2005 | Renau et al. | |
| 2005/0274952 A1 * | 12/2005 | Yamazaki et al. | 257/66 |
| 2007/0063147 A1 | 3/2007 | Yamazaki et al. | |

FOREIGN PATENT DOCUMENTS

| | | |
|---|---|---|
| CN | 1402357 | 3/2003 |
| CN | 1432856 | 7/2003 |
| EP | 1282173 | 2/2003 |
| JP | 06-349439 A | 12/1994 |
| JP | 08-070032 A | 3/1996 |
| JP | 09-27624 | 1/1997 |
| JP | 10-162770 | 6/1998 |
| JP | 2001-210605 | 8/2001 |

OTHER PUBLICATIONS

"Office Action (Application No. 200510079030.7) Dated Jul. 18, 2008".

Office Action (Application No. 200510078541.7) dated Jun. 13, 2008.

* cited by examiner

FIG.2
(A)
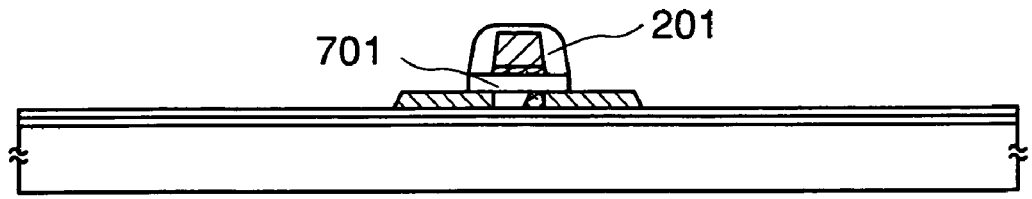
(B)
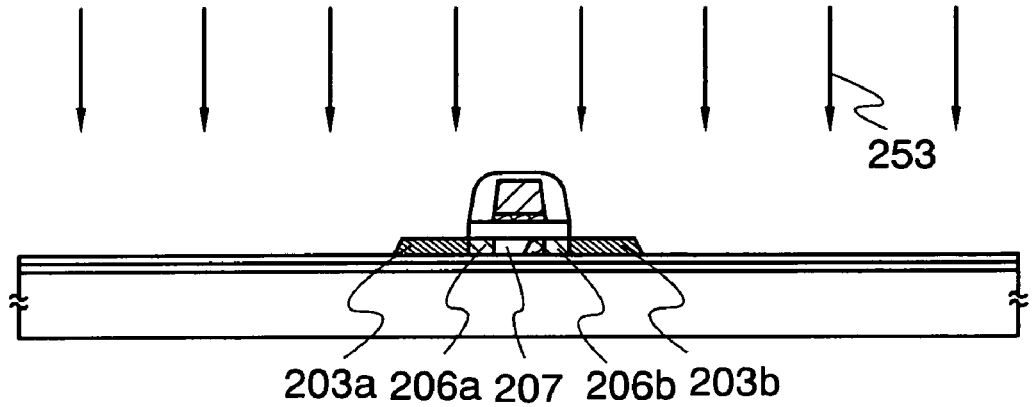
(C)
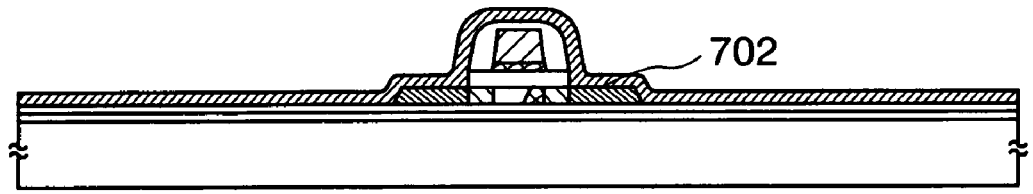
(D)
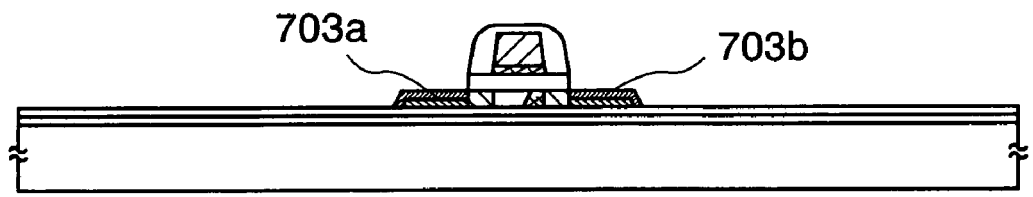
(E)
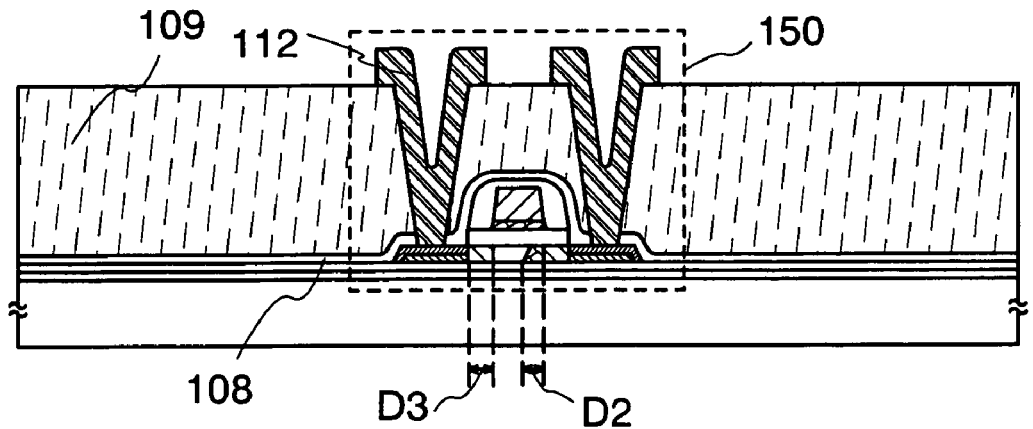

FIG. 4
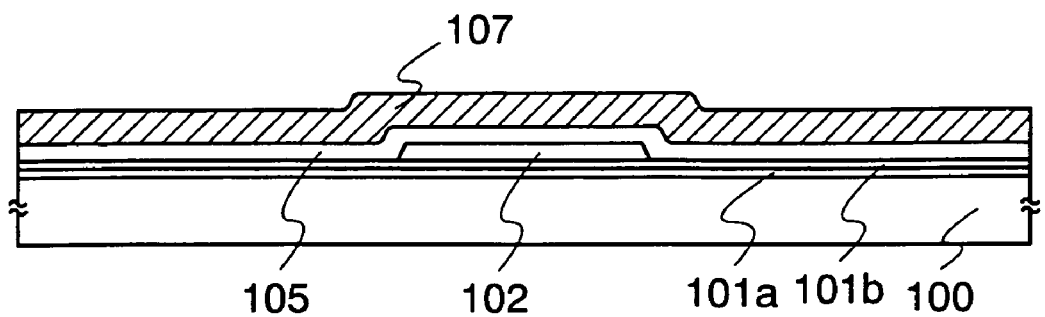
(A)
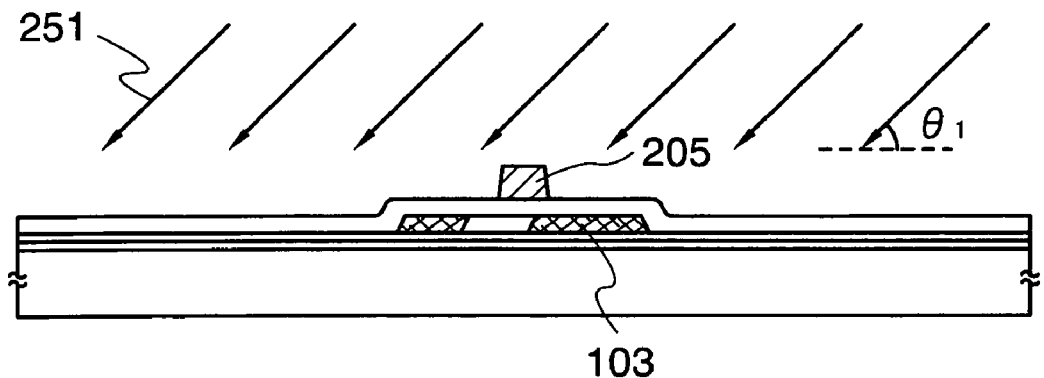
(B)
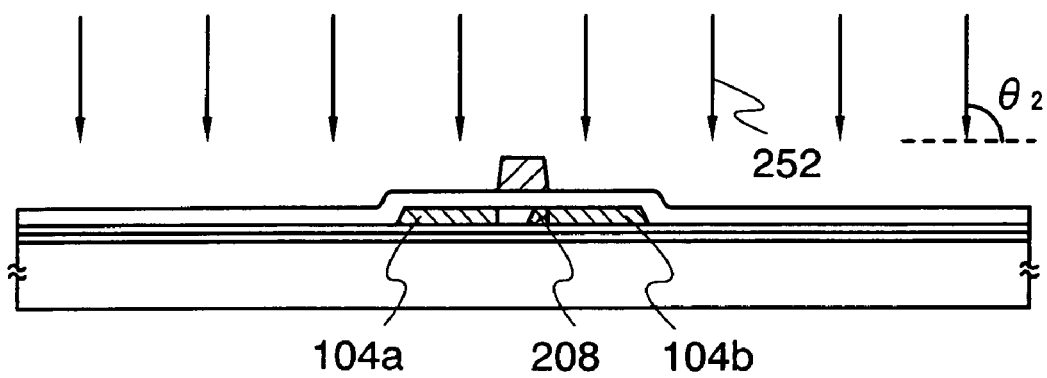
(C)
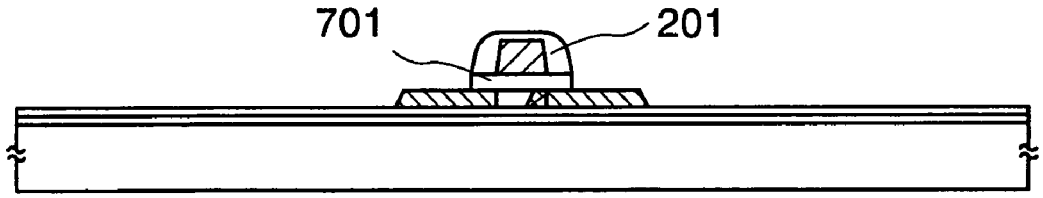
(D)

FIG.5
(A)
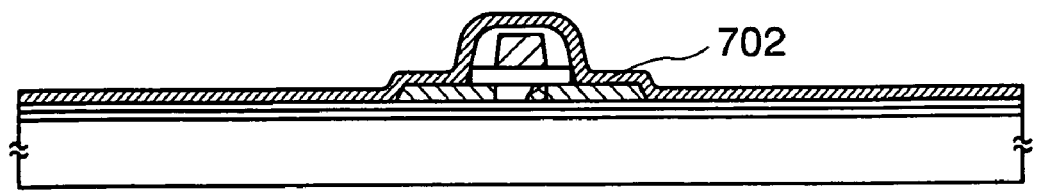
(B)
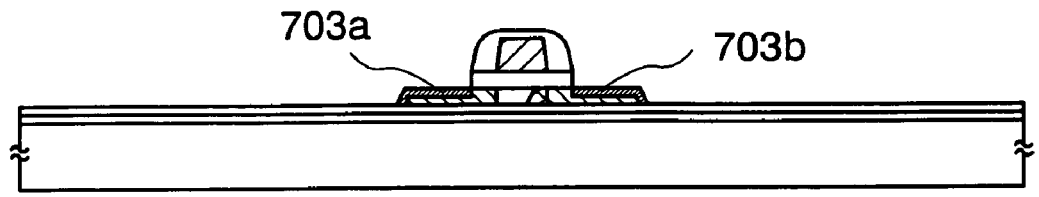
(C)
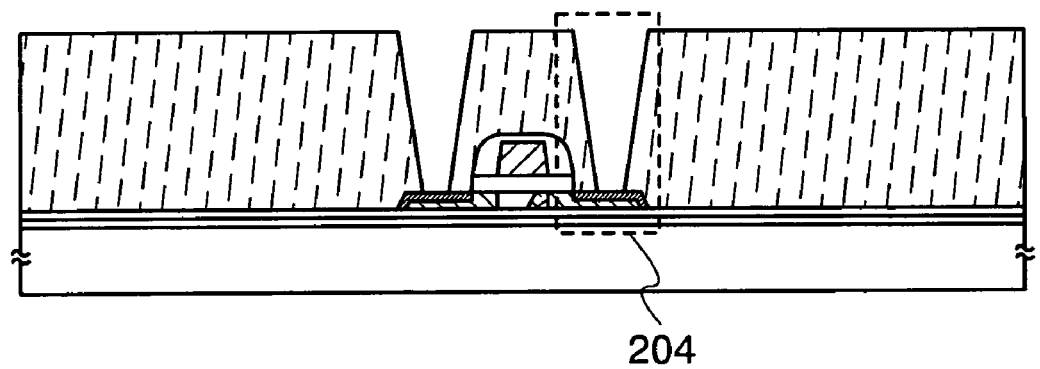
(D)
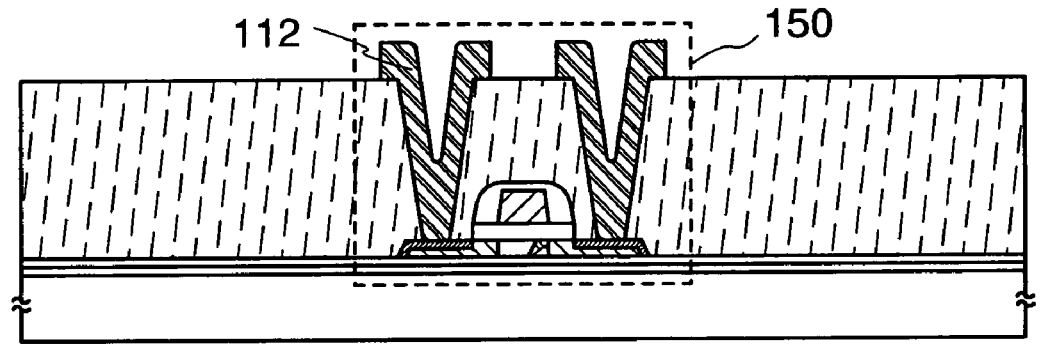

FIG. 8
(A)
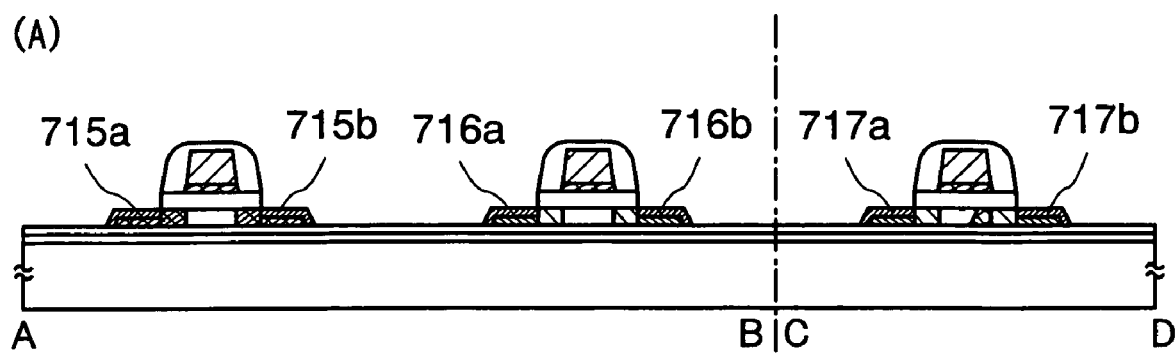
(B)
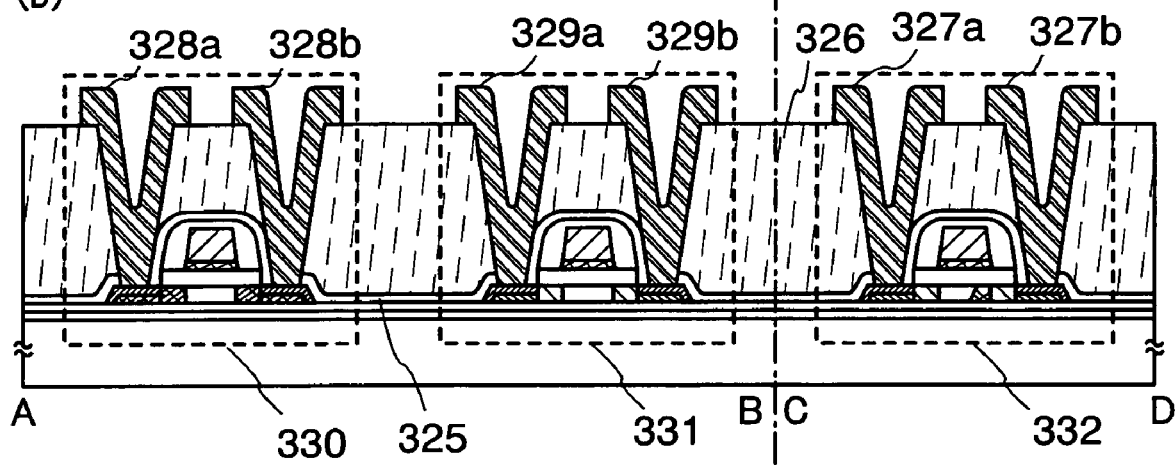

FIG.17
(A)
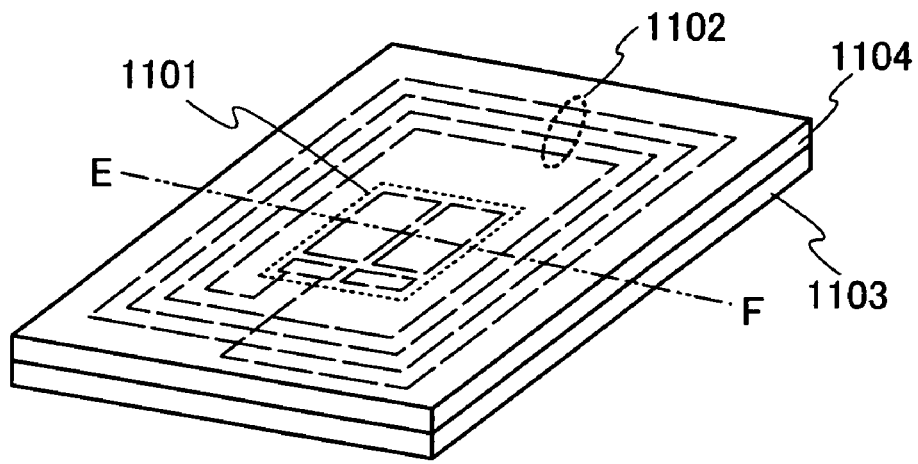
(B)
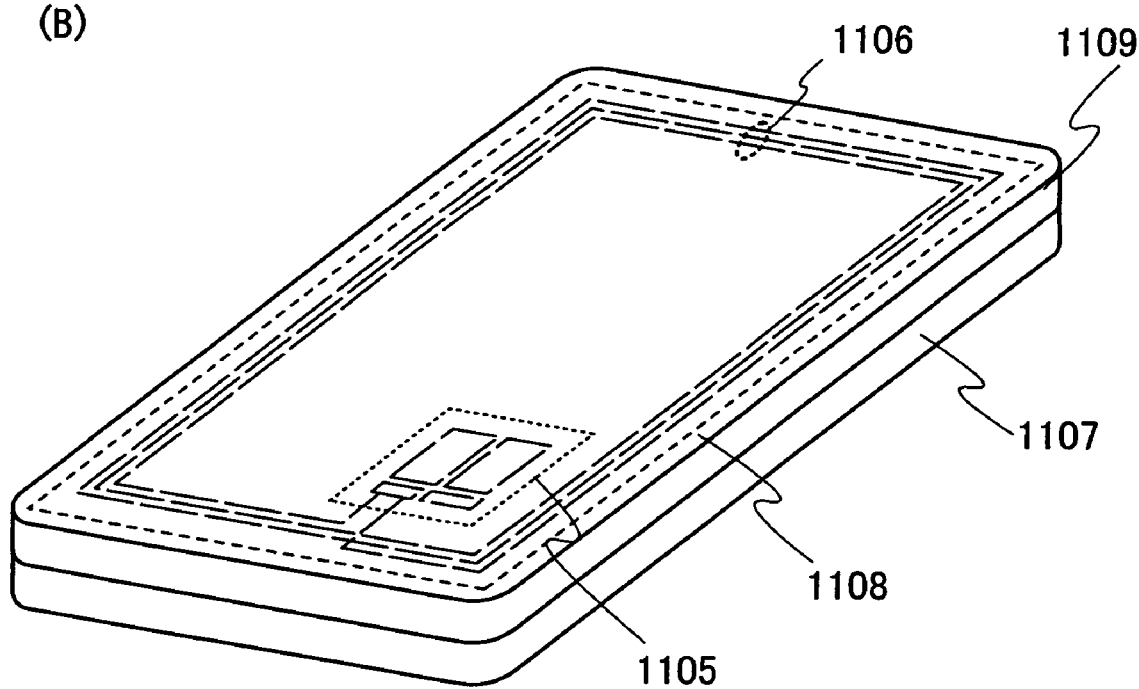

FIG.18
(A)
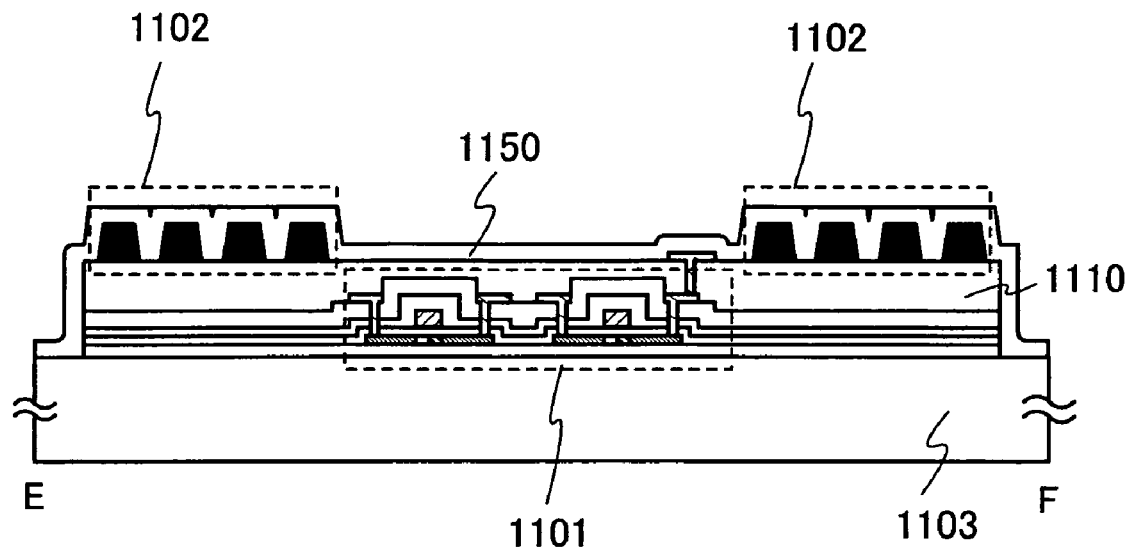
(B)
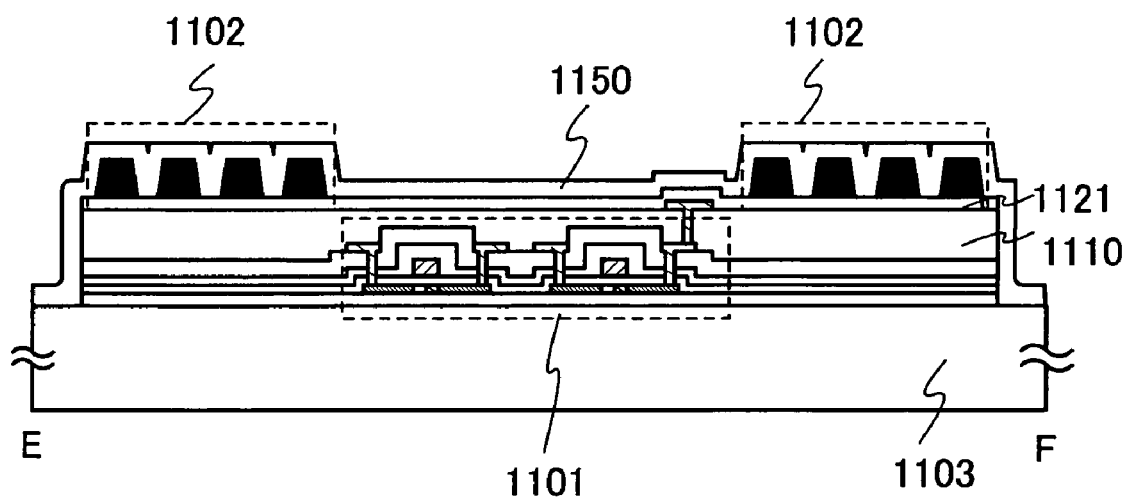

FIG. 19
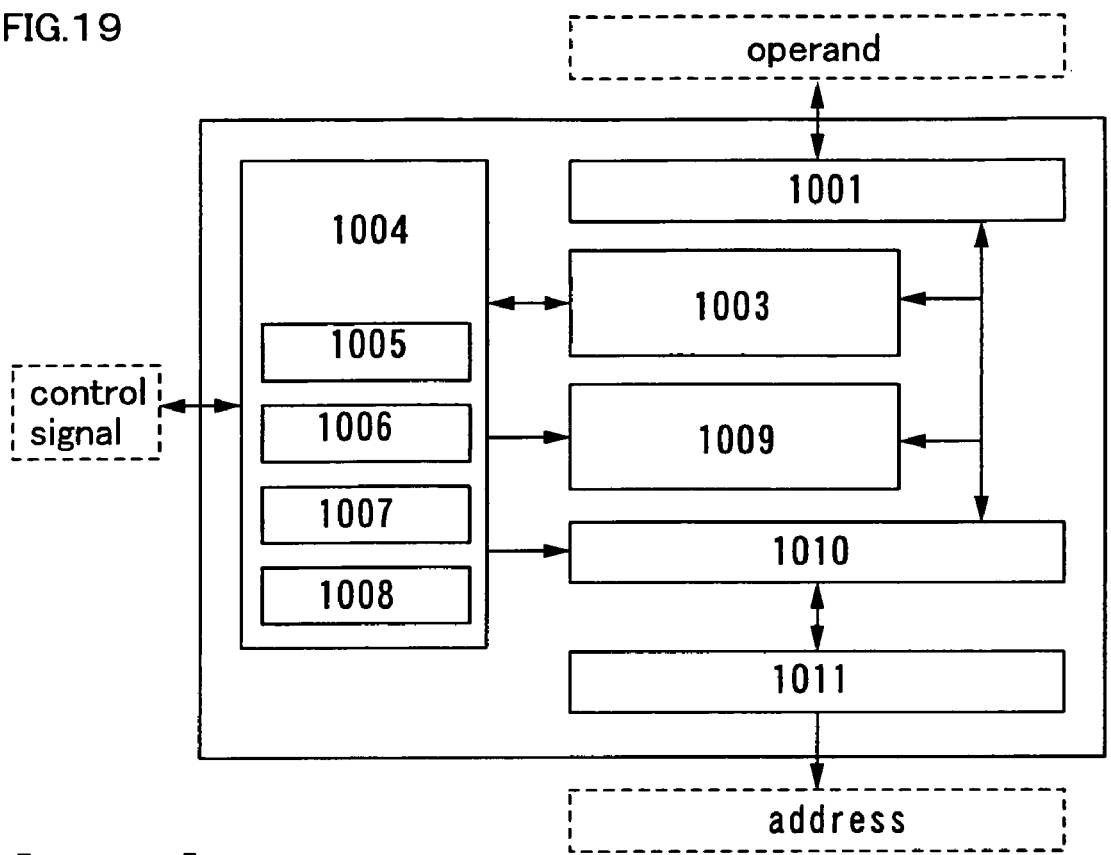
【FIG. 20】
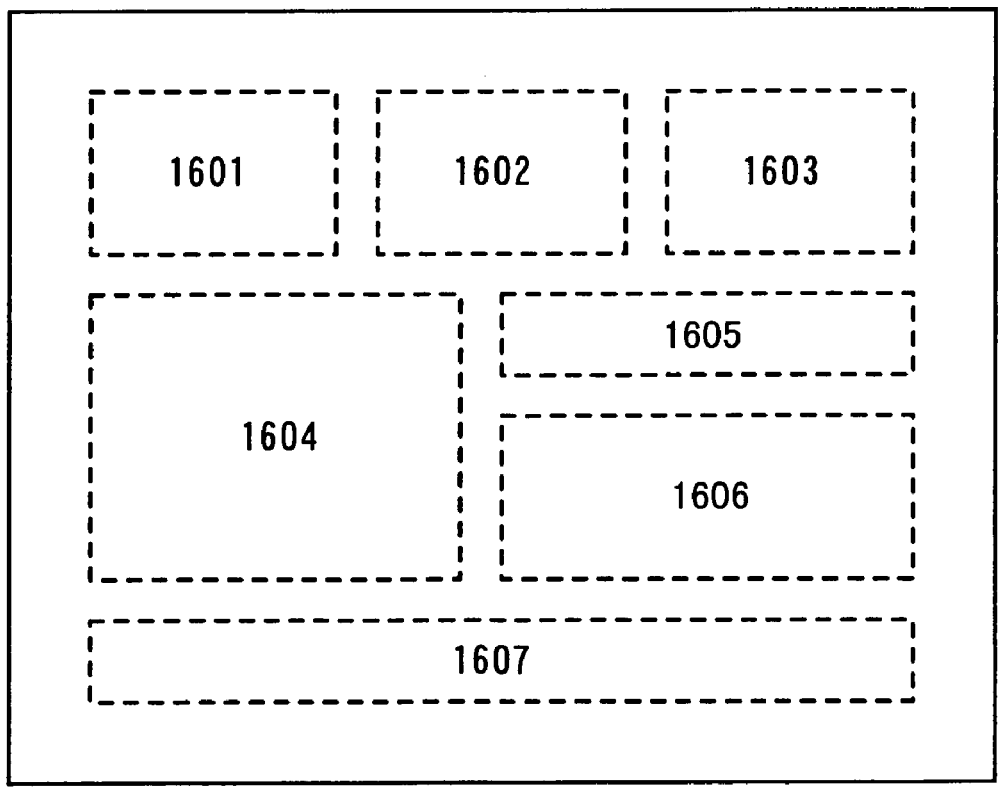

FIG.21
(A)
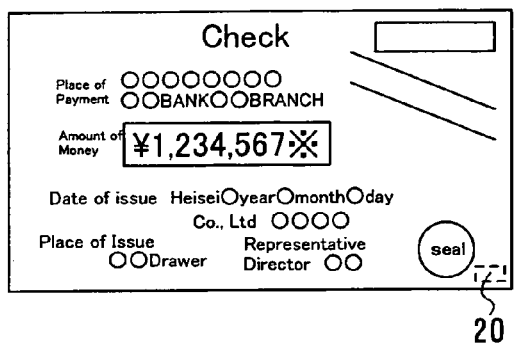
(B)
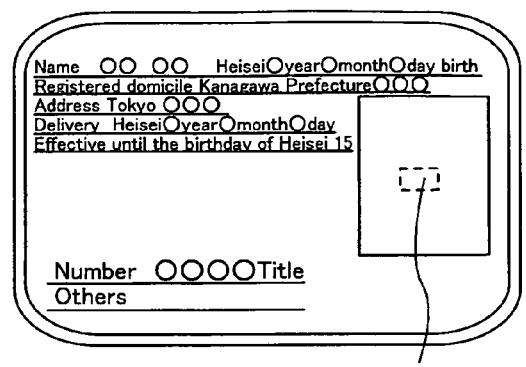
(C)
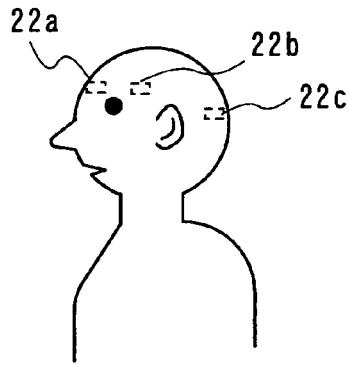
(D)
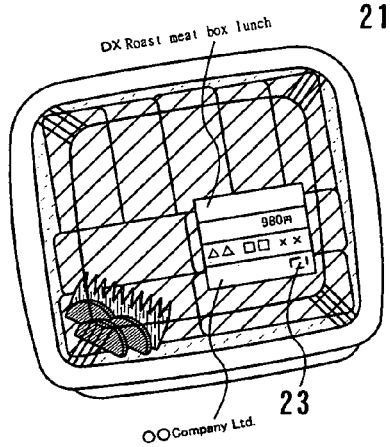
(E)
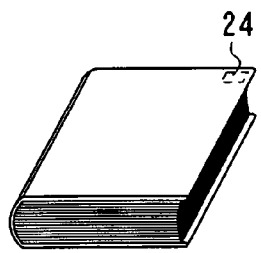
(F)
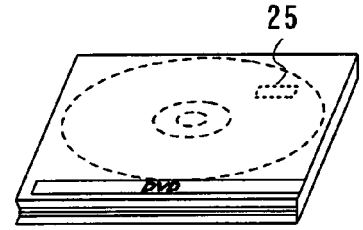
(G)
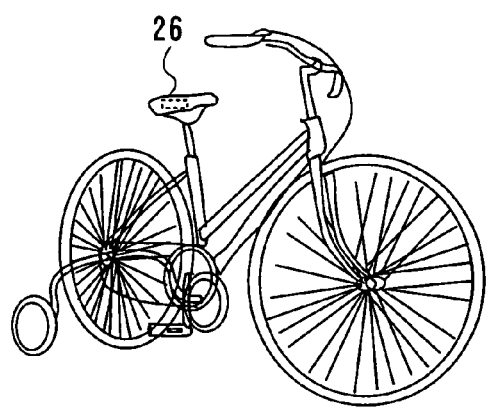
(H)
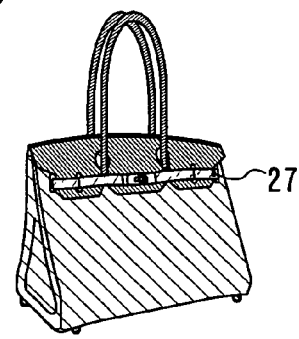

FIG.22
(A)
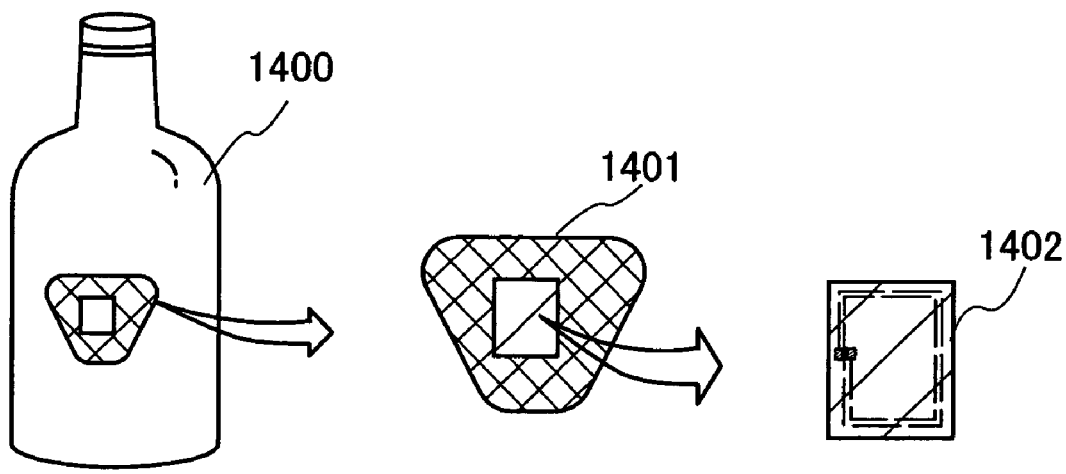
(B)
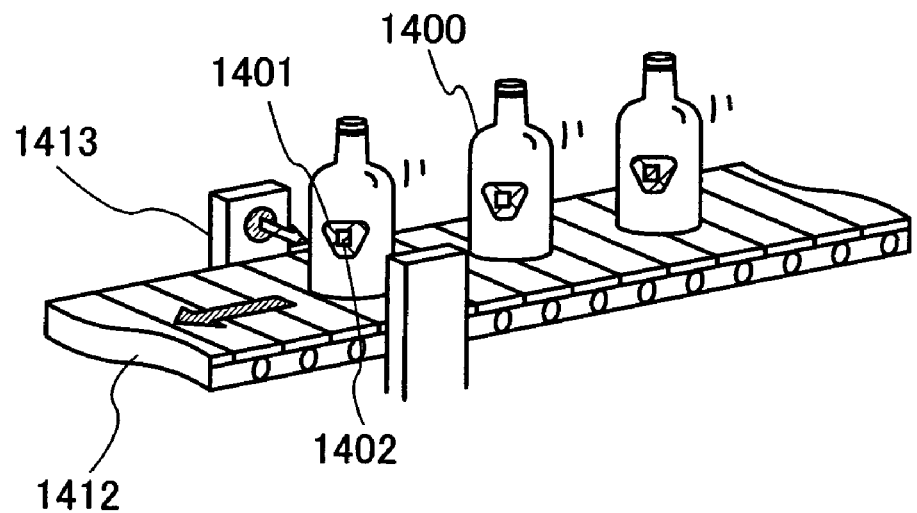

FIG.23
(A)
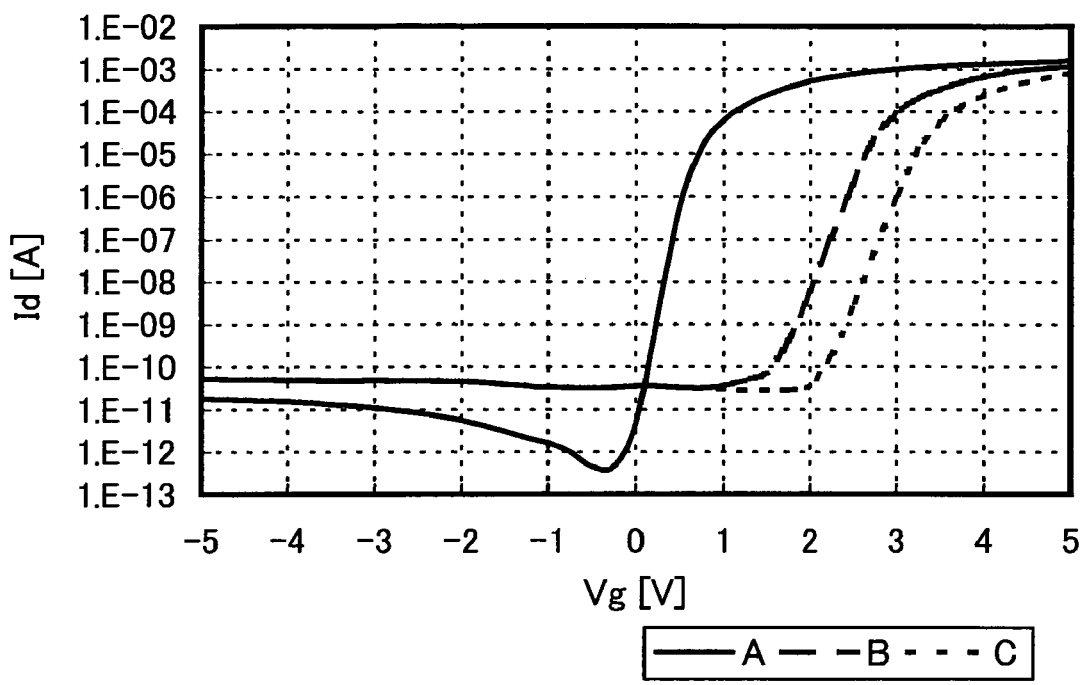
(B)
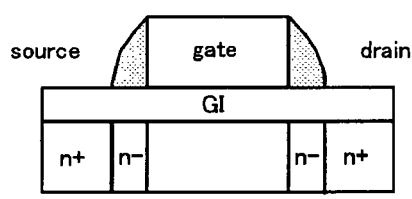
StructureA
L/W= 1000/20000nm
width of Loff= 300nm
film thickness of GI= 20nm
n+  1E+20 [1/cm$^3$]
n−  1E+18 [1/cm$^3$]
p−  1E+18 [1/cm$^3$]
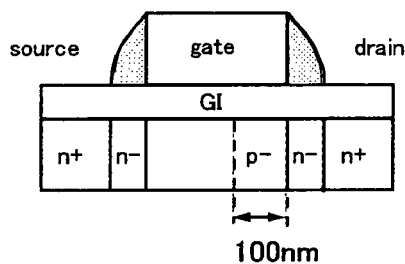
StructureB
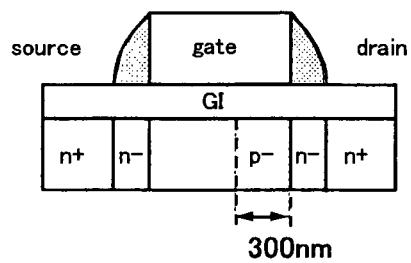
StructureC

FIG.24
(A)
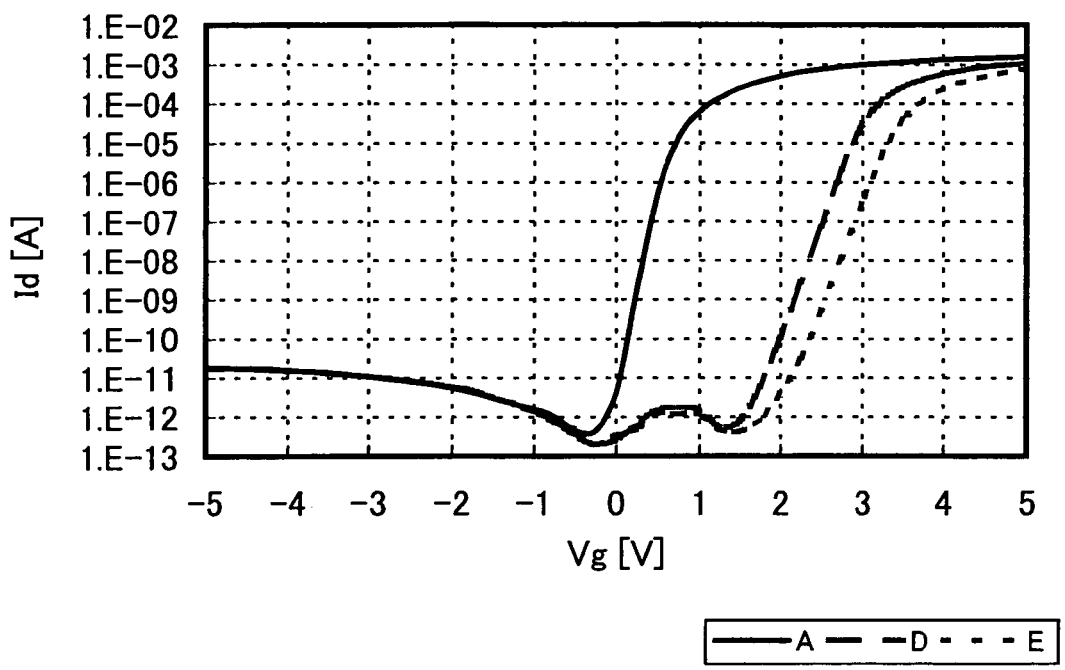
(B)
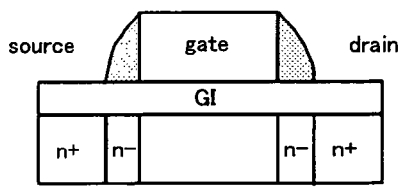
StructureA
L/W= 1000/20000nm
width of Loff= 300nm
film thickness of GI= 20nm
n+ 1E+20 [1/cm$^3$]
n− 1E+18 [1/cm$^3$]
p− 1E+18 [1/cm$^3$]
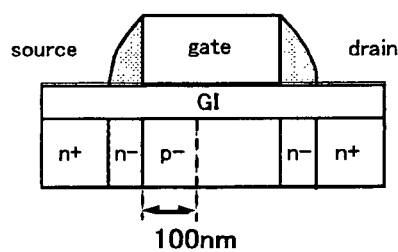
StructureD
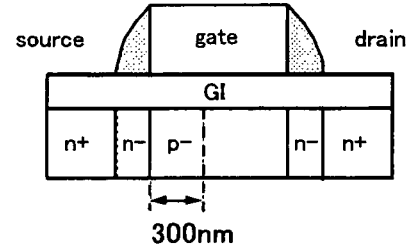
StructureE

FIG.25
(A)
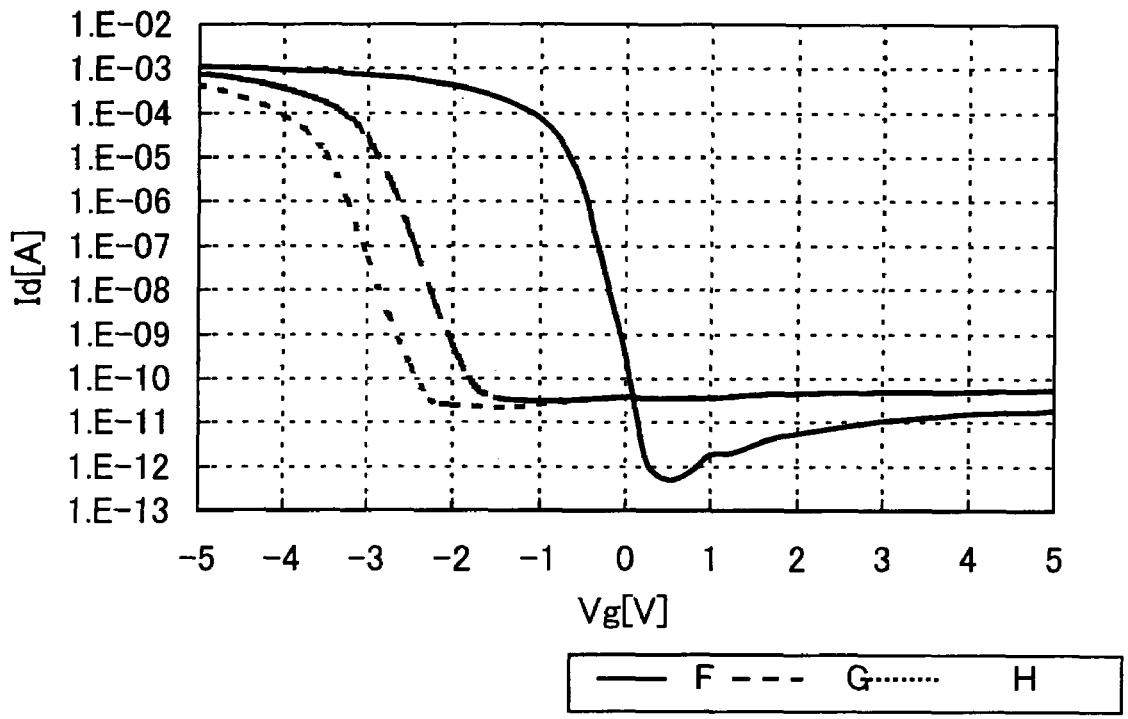
(B)
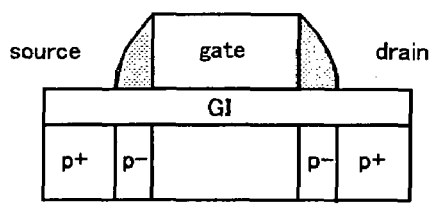
StructureF
```
L/W= 1000/20000nm
width of Loff = 300nm
film thickness of GI =
      20nm
 p+  1E+20 [1/cm³]
 p-  1E+18 [1/cm³]
 n-  1E+18 [1/cm³]
```
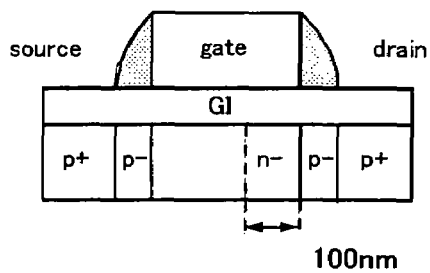
StructureG
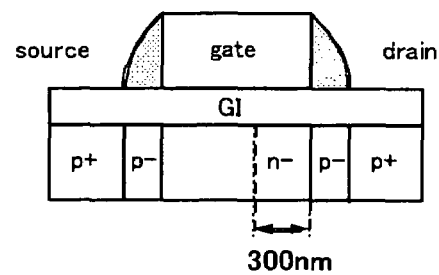
StructureH

FIG.26
(A)
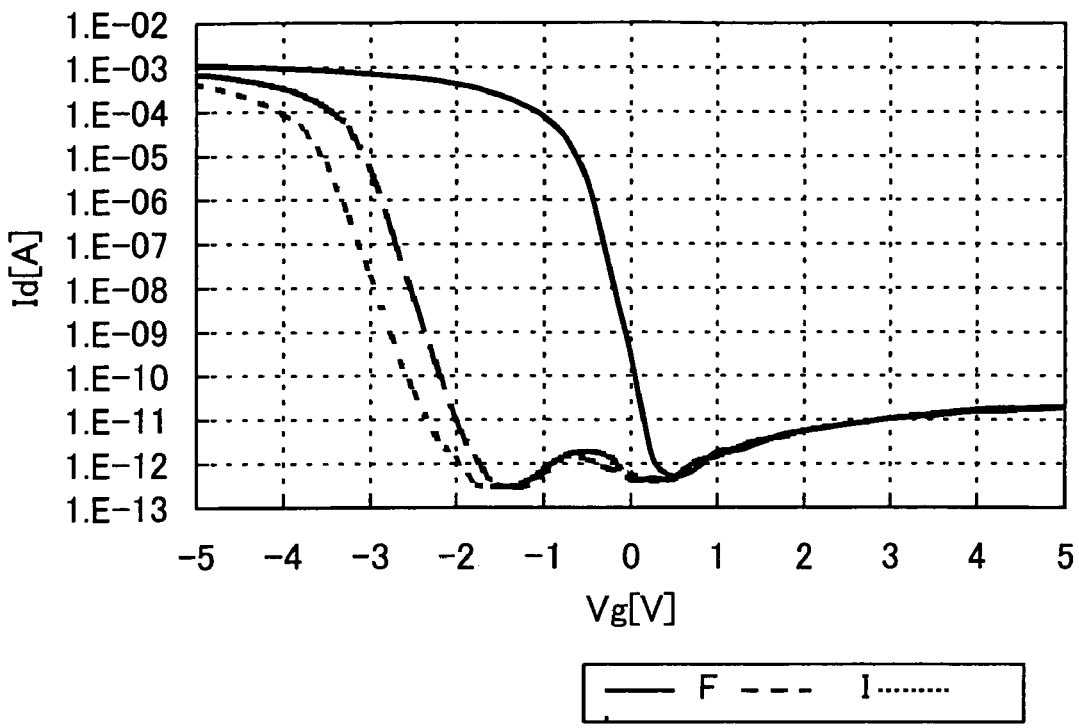
(B)
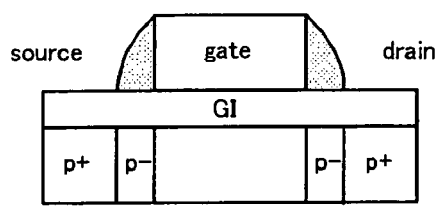
StructureF
L/W= 1000/20000nm
width of Loff = 300nm
film thickness of GI = 20nm
p+ 1E+20 [1/cm$^3$]
p− 1E+18 [1/cm$^3$]
n− 1E+18 [1/cm$^3$]
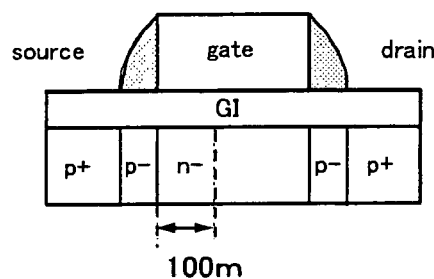
100m
StructureI
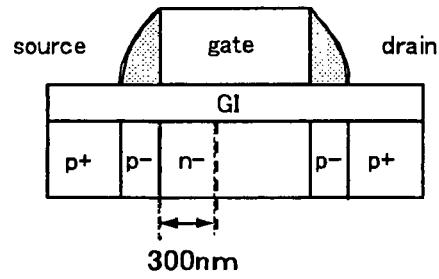
300nm
StructureJ

FIG.27
(A)
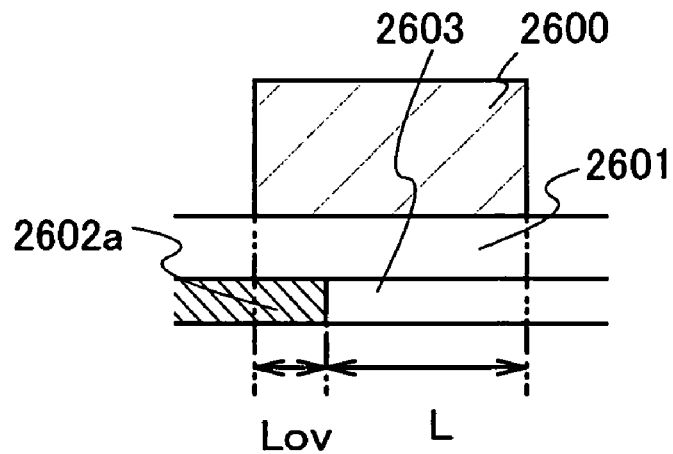
(B)
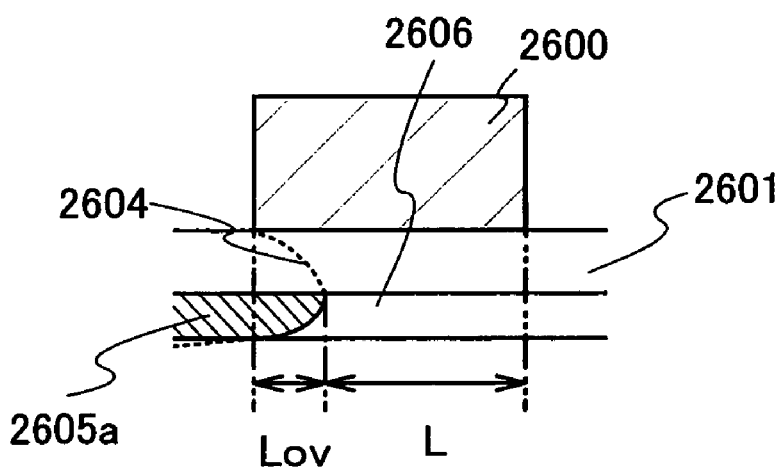
(C)
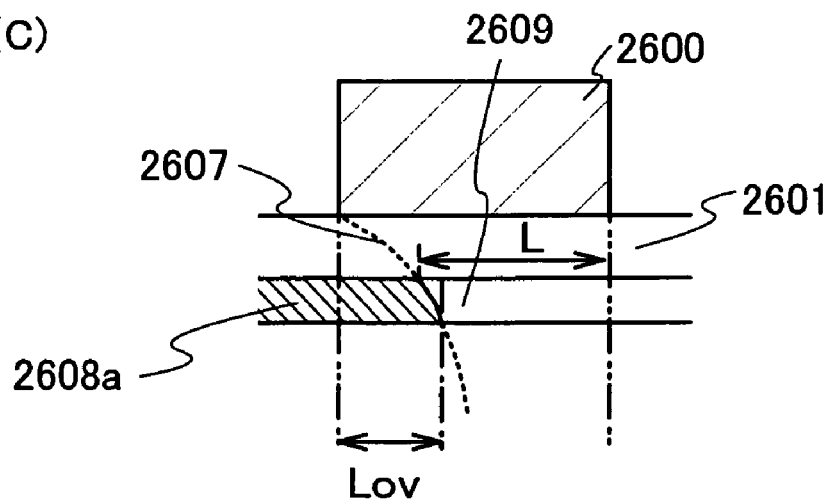

FIG. 28
(A)
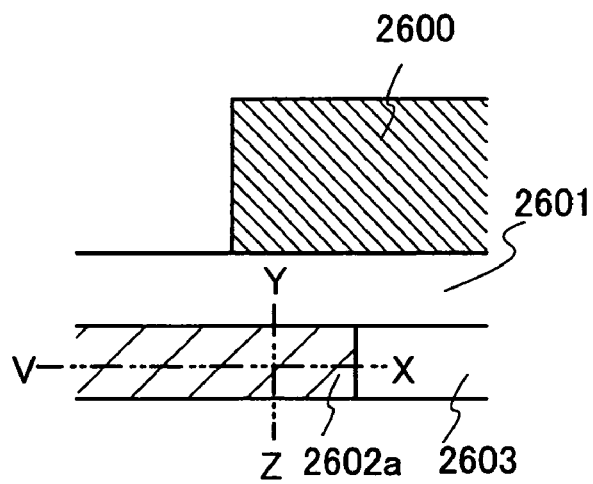
(B)
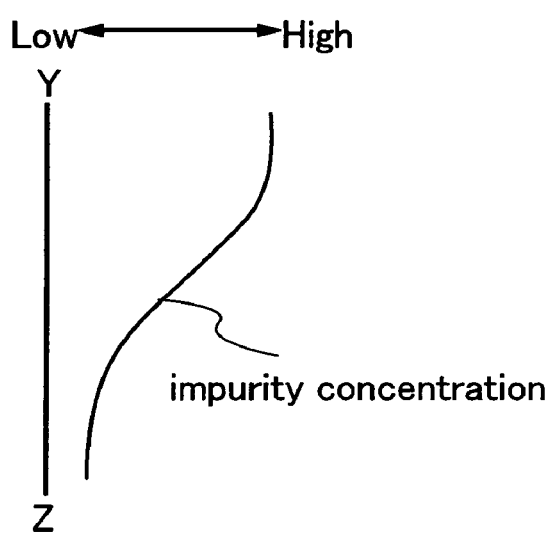
(C)
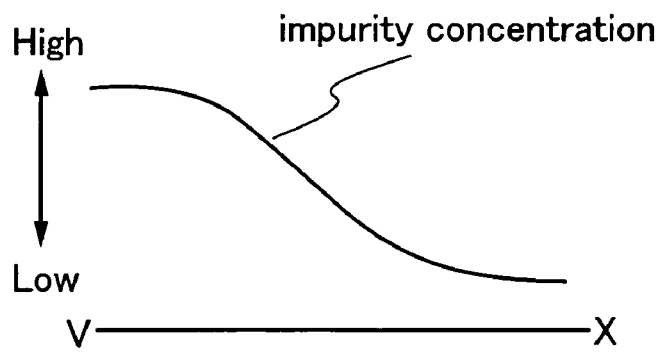

FIG. 29
(A)
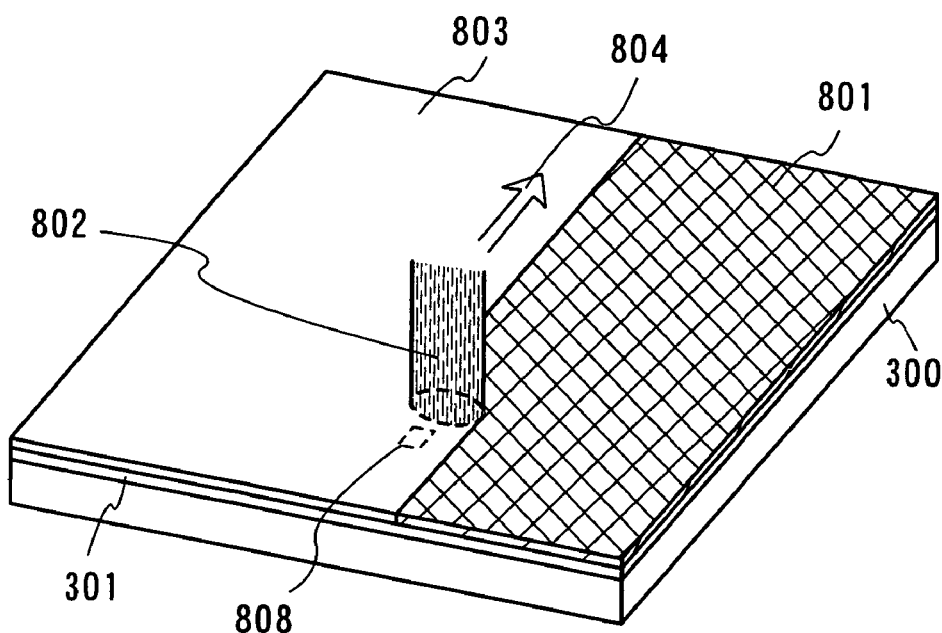
(B)
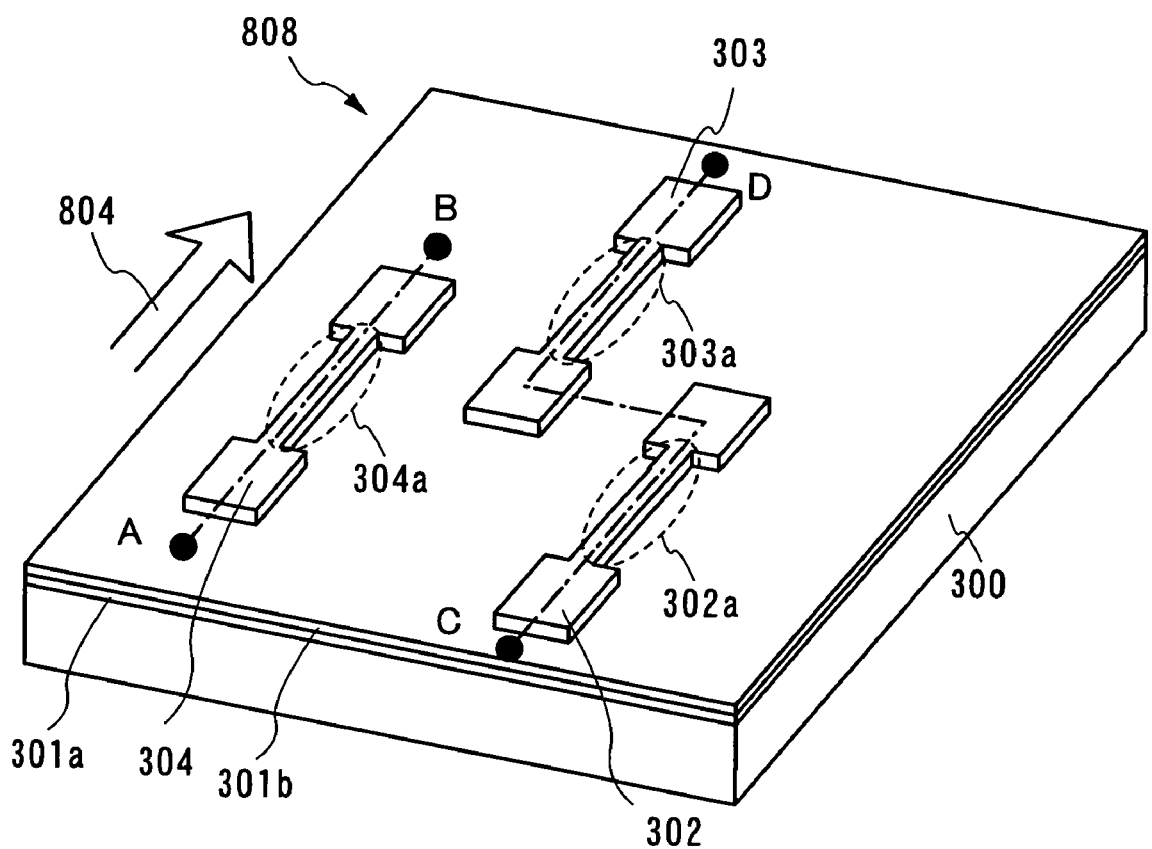

FIG.31
(A)
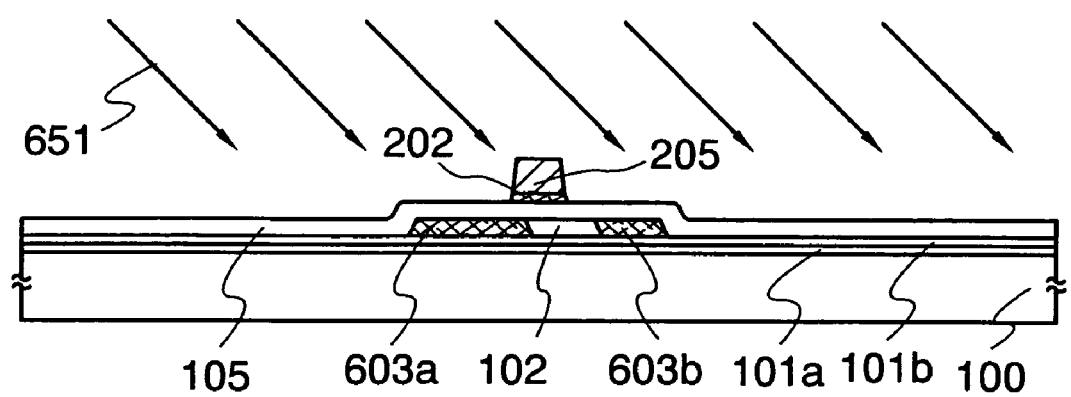
(B)
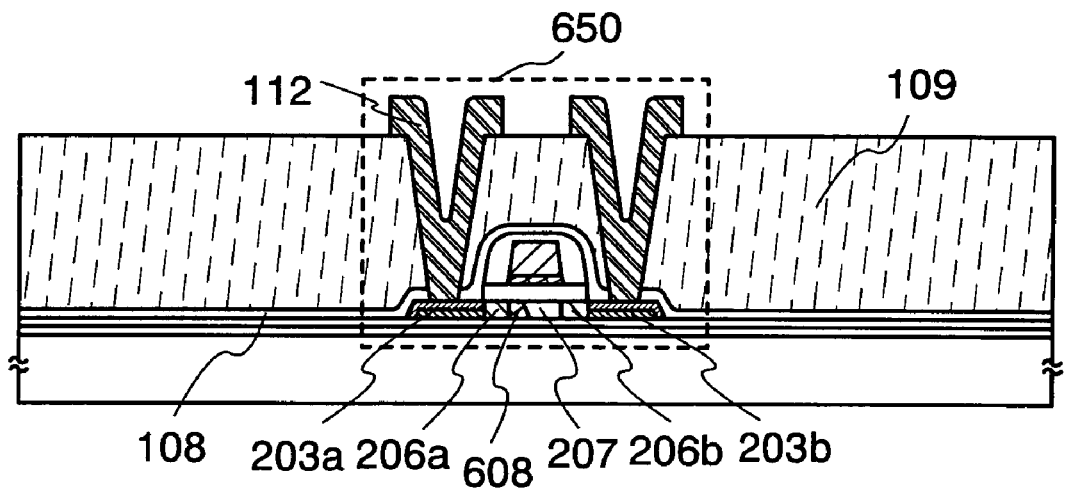

FIG.33
(A)
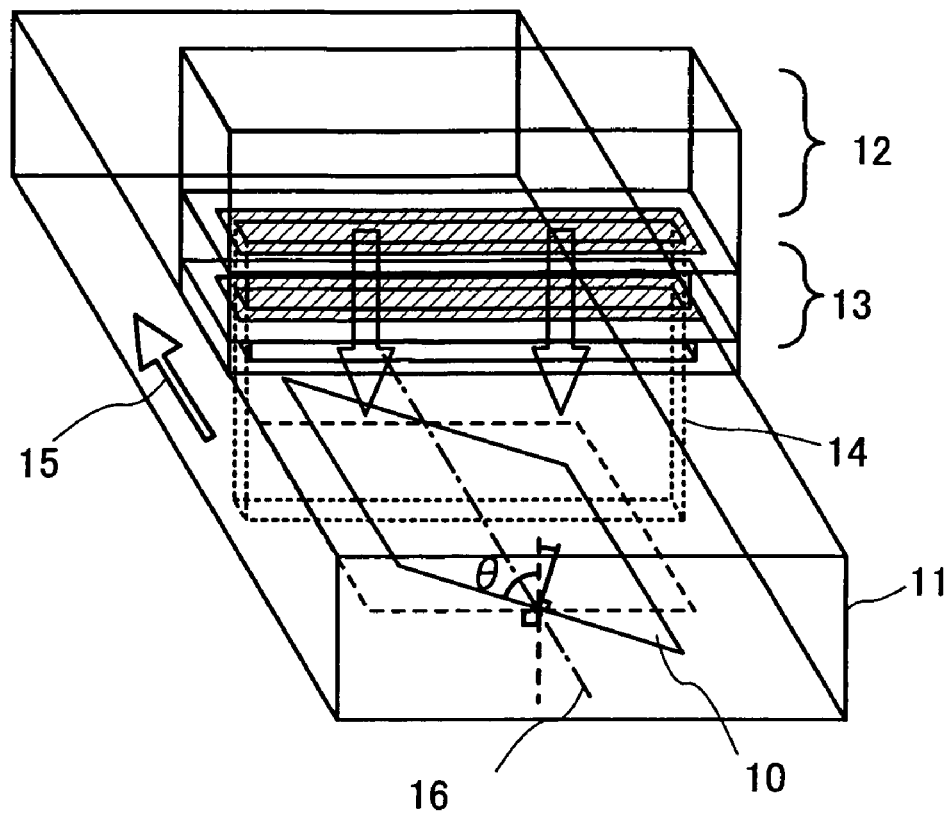
(B)
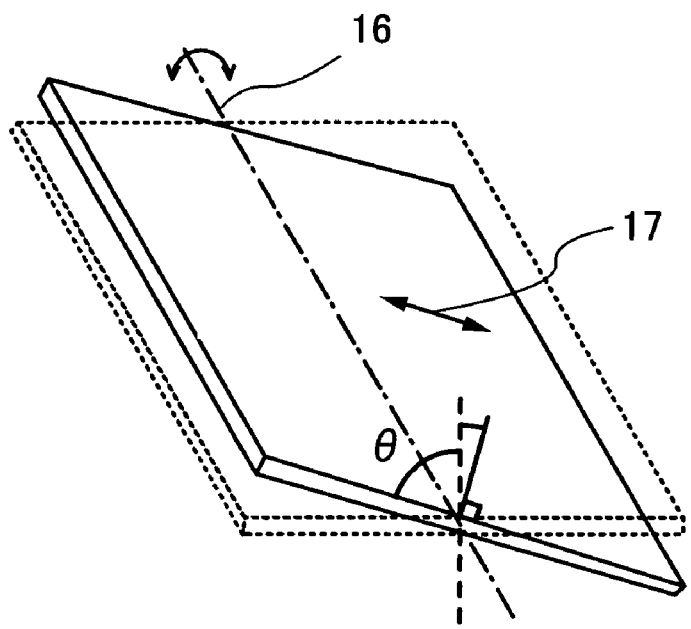

FIG.35
(A)
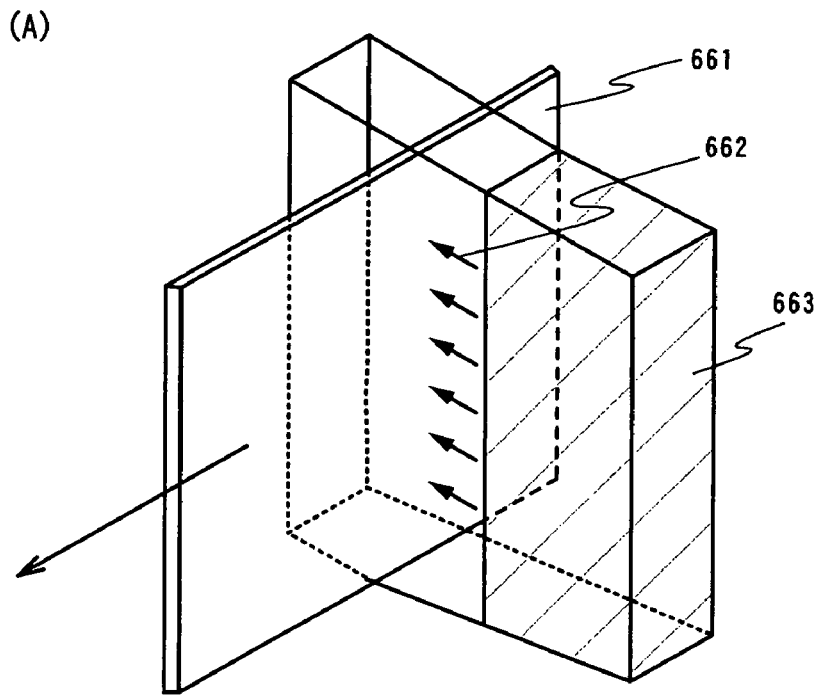
(B) (C)
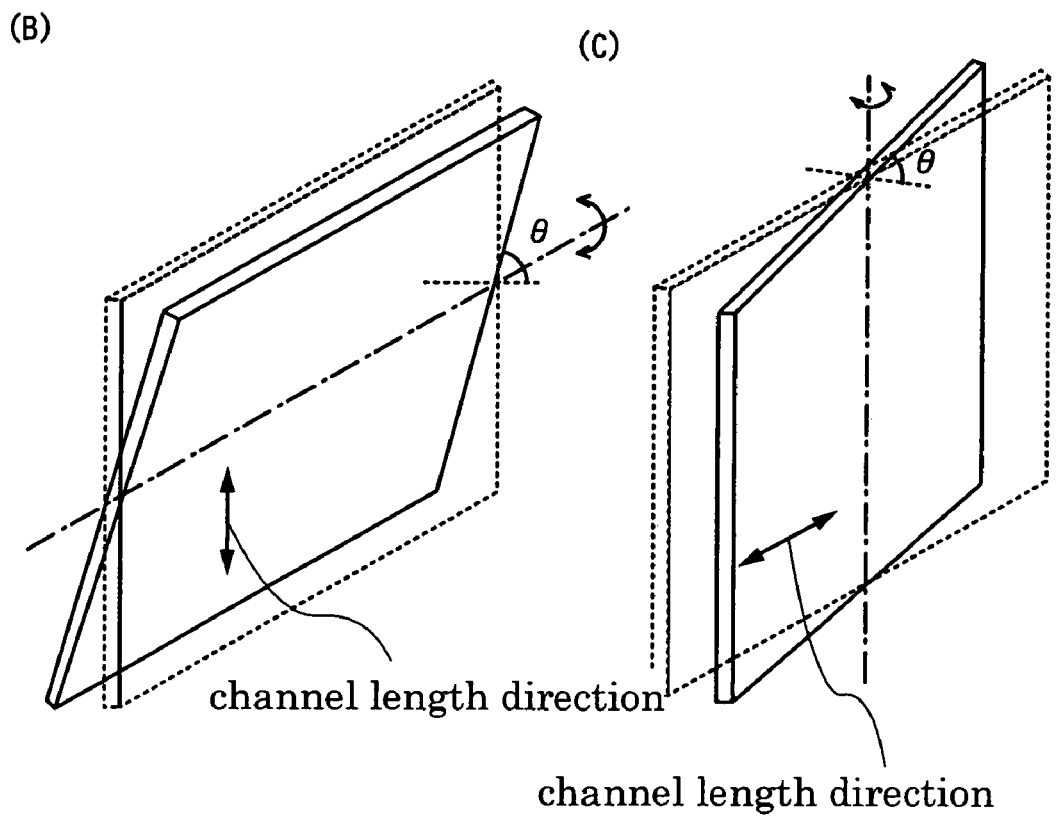
channel length direction
channel length direction

METHOD FOR MANUFACTURING A THIN FILM TRANSISTOR INCLUDING FORMING IMPURITY REGIONS BY DIAGONAL DOPING

BACKGROUND OF THE INVENTION

1. Field of the Invention

The present invention relates to a semiconductor device and the manufacturing method thereof.

2. Description of the Related Art

A thin film transistor used for a semiconductor device is required to have different properties according to the object and the function of the semiconductor device. It is important to control the properties of the thin film transistor to satisfy the requirement, and the technique for manufacturing the thin film transistor to have a property appropriate for the intended use has been researched (for example, refer to the patent document 1).

In the patent document 1, a thin film transistor including an impurity region having a lightly doped drain (LDD) structure is formed using a sidewall, thereby making leak current small when a thin film transistor is in OFF-state.

Patent Document 1
  Japanese Patent Laid-Open No. H9-27624

SUMMARY OF THE INVENTION

Problems to be Solved by the Invention

It is an object of the present invention to manufacture a thin film transistor having a required property without complicating steps and devices. It is another object of the present invention to provide a technique for manufacturing a semiconductor device having high reliability and better electrical characteristics with a higher yield at a lower cost.

Means for Solving the Problems

In the present invention, a lightly doped impurity region is formed in either of a source region side or a drain region side of a semiconductor layer covered with a gate electrode layer in a thin film transistor. The semiconductor layer is doped diagonally to the surface thereof using the gate electrode layer as a mask to form the lightly doped impurity region. The semiconductor layer is formed to have an impurity region including an impurity element for imparting a conductivity which is different from that of the thin film transistor, thereby making it possible to minutely control the properties of the thin film transistor. In addition, a semiconductor film is crystallized by laser irradiation to form a crystal grain of a single crystal which is long extended along a scanning direction of laser light, thereby becoming it possible to form a semiconductor film at least having little crystal boundary which prevents a carrier of a thin film transistor from moving. Additionally, in a semiconductor device of the present invention, a silicide (metal silicide) is formed in a source region and a drain region; therefore, the source region and the drain region become low-resistant and electrical properties of the semiconductor device is improved so as to make high speed operation possible.

Note that a semiconductor device in this specification means devices which can function by using properties of a semiconductor. The present invention enables a semiconductor device of a multilayer wiring layer, an ID chip, or the like to be manufactured.

In addition, a display device can be manufactured using the present invention. The display device which can adopt the present invention includes a light emitting display device in which a light emitting element having a medium including an organic matter referred to as electroluminescence (hereinafter, also referred to as EL) for producing luminescence or a mixture of an organic matter and an inorganic matter, interposed between electrodes is connected to a TFT, a liquid crystal display device in which a liquid crystal element having a liquid crystal material is used as a display element, or the like.

One semiconductor device of the present invention has a gate insulating layer over a semiconductor layer having a channel formation region, a source region, a drain region, an impurity region formed between the channel formation region and the source region in which the channel formation region is formed in contact with the drain region, a gate electrode layer which is formed over the channel formation region and the impurity region via the gate insulating layer, and a silicide formed on the surfaces of the source region and the drain region.

One semiconductor devices of the present invention has a gate insulating layer over a semiconductor layer having a channel formation region, a source region, a drain region, and an impurity region formed between the channel formation region and the drain region in which the channel formation region is formed in contact with the source region, and a gate electrode layer which is formed over the channel formation region and the impurity region via the gate insulating layer.

One semiconductor device of the present invention has a gate insulating layer over a semiconductor layer having a channel formation region, a source region, a drain region, a first impurity region formed between the channel formation region and the source region, a second impurity region formed between the source region and the first impurity region, a third impurity region formed between the drain region and the channel formation region in which the channel formation region is formed in contact with the third impurity region, a gate electrode layer formed over the channel formation region and the first impurity region via the gate insulating layer, a silicide formed on the surfaces of the source region and the drain region, wherein the second impurity region, the third impurity region, the source region, and the drain region have an impurity element for imparting one conductive type, and the concentration of the impurity element for imparting one conductive type in the second impurity region and the third impurity region is lower than that of the impurity element for imparting one conductive type in the source region and the drain region.

One semiconductor device of the present invention has a gate insulating layer, over a semiconductor layer having a channel formation region, a source region, a drain region, a first impurity region formed between the channel formation region and the drain region, a second impurity region formed between the source region and the channel formation region in which the channel formation region is formed in contact with the second impurity region, a third impurity region formed between the drain region and the first impurity region, a gate electrode layer formed over the channel formation region and the first impurity region via the gate insulating layer, a silicide formed on the surfaces of the source region and the drain region, wherein the second impurity region, the third impurity region, the source region, and the drain region have an impurity element for imparting one conductive type, and the concentration of the impurity element for imparting one conductive type in the second impurity region and the third impurity region is lower than that of the impurity element for imparting one conductive type in the source region and the drain region.

One semiconductor device of the present invention has a gate insulating layer formed over a first semiconductor layer and a second semiconductor layer, in which the first semiconductor layer has a first channel formation region, a first source region, and a first drain region, and the second semiconductor layer has a second channel formation region, a second source region, and a second drain region; a first impurity region formed between the first channel formation region, and the first source region; a second impurity region formed between the second channel formation region and the second drain region; in which the first channel formation region is formed in contact with the first drain region, and the second channel formation region is formed in contact with the second source region; a first gate electrode layer over the first channel formation region and the first impurity region via the gate insulating layer, a second gate electrode layer over the second channel formation region and the second impurity region via the gate insulating layer, and a silicide formed on the surfaces of the first source, the second source region, the first drain region, and the second drain region.

One method for manufacturing a semiconductor device of the present invention includes steps of forming an amorphous semiconductor film over an insulating surface; forming a crystalline semiconductor film by emitting laser light to the amorphous semiconductor film; forming a semiconductor layer by patterning the crystalline semiconductor film; forming a gate insulating layer over the semiconductor layer; forming a gate electrode layer over the gate insulating layer; forming a first impurity region by doping an impurity element for imparting a first one conductive type to the semiconductor layer from one direction diagonally to the surface thereof using the gate electrode layer as a mask; forming a second impurity region, a third impurity region, a fourth impurity region, and a channel formation region by doping an impurity element for imparting a second one conductive type to the semiconductor layer perpendicularly to the surface thereof using the gate electrode layer as a mask; forming an insulating layer of a side-wall structure on a side surface of the gate electrode layer; removing the gate insulating layer over the third impurity region and the fourth impurity region of the semiconductor layer using the gate electrode layer and the insulating layer of the side-wall structure as a mask; forming a source region, a fifth impurity region which is in contact with the source region, a drain region, and a sixth impurity region which is in contact with the drain region by doping an impurity element for imparting a third one conductive type to the semiconductor layer perpendicularly to the surface thereof using the gate electrode layer and the insulating layer of the side-wall structure as a mask; and forming a silicide in the source region and the drain region, in which each concentration of the impurity element for imparting the second one conductive type and the impurity element for imparting the third one conductive type in the fifth impurity region and the sixth impurity region is lower than that of the impurity element for imparting the second one conductive type and the impurity element for imparting the third one conductive type in the source region and the drain region, the second impurity region is formed in the semiconductor layer covered with the gate electrode layer between the channel formation region and the fifth impurity region, and the sixth impurity region is formed in contact with the channel formation region.

One method for manufacturing a semiconductor device of the present invention includes steps of forming an amorphous semiconductor film over an insulating surface; forming a crystalline semiconductor film by emitting laser light to the amorphous semiconductor film; forming a semiconductor layer by patterning the crystalline semiconductor film; forming a gate insulating layer over the semiconductor layer; forming a gate electrode layer over the gate insulating layer; forming a first impurity region by doping an impurity element for imparting a first one conductive type to the semiconductor layer from one direction diagonally to the surface thereof with using the gate electrode layer as a mask; forming a second impurity region, a third impurity region, a fourth impurity region, and a channel formation region by doping an impurity element for imparting a second one conductive type to the semiconductor layer perpendicularly to the surface thereof using the gate electrode layer as a mask; forming an insulating layer of a side-wall structure on a side surface of the gate electrode layer; removing the gate electrode layer over the third impurity region and the fourth impurity region of the semiconductor layer, using the gate electrode layer and the insulating layer of the side-wall structure as a mask; forming a source region, a fifth impurity region which is in contact with the source region, a drain region, and a sixth impurity region which is in contact with the drain region by doping an impurity element for imparting a third one conductive type to the semiconductor layer from one direction perpendicular to the surface thereof using the gate electrode layer and the insulating layer of the side-wall structure as a mask; and forming a silicide in the source region and the drain region, in which each concentration of the impurity element for imparting the second one conductive type and the impurity element for imparting the third one conductive type in the fifth impurity region and the sixth impurity region is lower than that of the impurity element for imparting the second one conductive type and the impurity element for imparting the third one conductive type in the source region and the drain region, the second impurity region is formed in the semiconductor layer covered with the gate electrode layer between the channel formation region and the sixth impurity region, and the fifth impurity region is formed in contact with the channel formation region.

One method for manufacturing a semiconductor device of the present invention includes steps of forming an amorphous semiconductor film over an insulating surface; forming a crystalline semiconductor film by emitting laser light to the amorphous semiconductor film; forming a first semiconductor layer and a second semiconductor layer by patterning the crystalline semiconductor film; forming a gate insulating layer over the first semiconductor layer and the second semiconductor layer; forming a first gate electrode layer and a second gate electrode layer over the gate insulating layer; forming a first impurity region in the first semiconductor layer by doping an impurity element for imparting a first one conductive type to the first semiconductor layer and the second semiconductor layer from one direction diagonally to the surfaces thereof using the first gate electrode layer and the second gate electrode layer as a mask; forming a second impurity region in the second semiconductor layer; forming a third impurity region, a first source region, a first drain region, and a first channel formation region in the first semiconductor layer by doping an impurity element for imparting a second one conductive type to the first semiconductor layer and the second semiconductor layer perpendicularly to the surfaces thereof using the first gate electrode layer and the second gate electrode layer as a mask; forming a fourth impurity region, a second source region, a second drain region, and a second channel formation region in the second semiconductor layer; forming a silicide on surfaces of the first source region, the second source region, the first drain region, and the second drain region; and forming the first source electrode layer, the second source electrode layer, the first drain electrode layer, and the second drain electrode layer to be in contact with the silicide, in which the third impurity region is formed in the first semiconductor layer covered with the first gate electrode layer between the first channel formation region and the first source region, the fourth impurity region is formed in the second semiconductor layer covered with the second gate electrode layer between the second channel formation region and the second drain region, the first drain region is formed in contact with the first channel formation region, and the second source region is formed in contact with the second channel formation region.

EFFECT OF THE INVENTION

The present invention enables a thin film transistor having a required property to be manufactured without complicating steps and devices. In addition, by controlling properties of the thin film transistor minutely and freely, a semiconductor device having high reliability and better electrical characteristics can be manufactured with a higher yield at a lower cost.

BRIEF DESCRIPTION OF THE DRAWINGS

FIGS. 2A to 2E are diagrams for describing the present invention.

FIGS. 4A to 4D are diagrams for describing a manufacturing method of a semiconductor device of the present invention.

FIGS. 5A to 5D are diagrams for describing a manufacturing method of a semiconductor device of the present invention.

FIGS. 8A to 8B are diagrams for describing a manufacturing method of a semiconductor device of the present invention.

FIGS. 17A and 17B are perspective views showing a semiconductor device of the present invention.

FIGS. 18A and 18B are cross sectional views of the semiconductor device of the present invention.

FIG. 19 is a block diagram showing a structure of the semiconductor device of the present invention.

FIG. 20 is a block diagram showing a structure of the semiconductor device of the present invention.

FIGS. 21A to 21H are diagrams showing applications using a semiconductor device of the present invention.

FIGS. 22A and 22B are diagrams showing applications using a semiconductor device of the present invention.

FIGS. 23A and 23B are model diagrams used for simulation and the result thereof.

FIGS. 24A and 24B are model diagrams used for simulation and the result thereof.

FIGS. 25A and 25B are model diagrams used for simulation and the result thereof.

FIGS. 26A and 26B are model diagrams used for simulation and the result thereof.

FIGS. 27A to 27C are diagrams showing Lov definitions.

FIGS. 28A to 28C are diagrams showing concentration distribution of an impurity element in a crosswise direction and a lengthwise direction of a semiconductor layer.

FIGS. 29A and 29B are diagrams for describing a manufacturing method of a semiconductor device of the present invention.

FIGS. 31A and 31B are diagrams for describing a manufacturing method of a semiconductor device of the present invention FIGS. 33A and 33B are schematic views of a doping device which can be used in the present invention.

FIGS. 35A and 35C are schematic views of a doping device which can be used in the present invention.

DETAILED DESCRIPTION OF THE INVENTION

Figure 1:
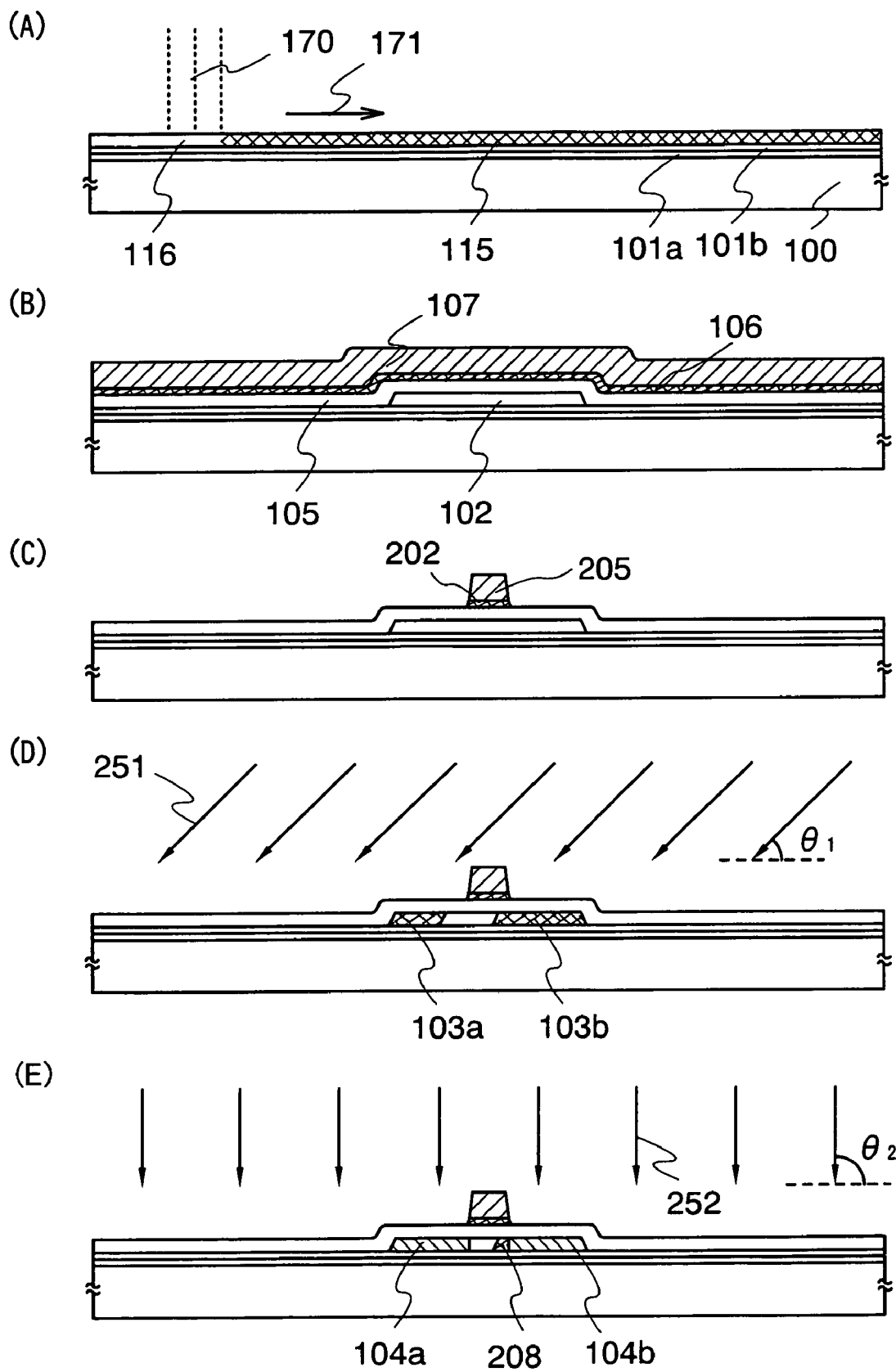
FIGS. 1A to 1E are diagrams for describing the present invention.

Best Mode for Carrying Out the Invention

Embodiment Modes of the present invention will be described in detail with reference to the accompanying drawings. However, it is to be understood that the present invention is not limited to the description below and various changes and modifications will be apparent to those skilled in the art, unless such changes and modifications depart from the content and scope of the present invention. Therefore, the present invention is not interpreted with limiting to the description in the embodiment modes. Note that the same reference numerals denote the same parts or parts having the same function in different drawings and the explanation will not be repeated in a constitution of the present invention hereinafter explained.

Embodiment Mode 1

A method for manufacturing a thin film transistor in this embodiment mode is described with reference to FIGS. 1A to 1E, 2A to 2E, and 3A to 3F.

A base film 101a is formed to have a film thickness of from 10 to 200 nm (preferably, from 50 to 100 nm) using a silicon nitride oxide (SiNO) film by a sputtering method, a physical vapor deposition (PVD) method, a low-pressure CVD (LPCVD) method, a chemical vapor deposition (CVD) method such as a plasma CVD method, or the like over a substrate 100 having an insulating surface, and a base film 101b is stacked thereon to have a film thickness of from 50 to 200 nm (preferably, from 100 to 150 nm) using a silicon oxynitride (SiON) film. In this embodiment mode, a plasma CVD method is used to form the base film 101a and the base film 101b. As the substrate 100, a glass substrate, a quartz substrate, a silicon substrate, a metal substrate, or a stainless substrate over which an insulating film is formed may be used. Additionally, a plastic substrate having heat-resistance which can withstand a process temperature of this embodiment mode, or a flexible substrate like a film may be also used. Alternatively, a two-layer structure may be used for the base film, or a single-layer film structure of the base (insulating) film or a structure in which the base (insulating) films are stacked to have two layers or more may be also used.

Subsequently, a semiconductor film is formed over the base film. The semiconductor film may be formed to have a thickness of from 25 to 200 nm (preferably, from 30 to 150 nm) by a known method (a sputtering method, an LPCVD method, a plasma CVD method, or the like). In this embodiment mode, an amorphous semiconductor film which is crystallized with a laser to be a crystalline semiconductor film is preferably used.

An amorphous semiconductor (hereinafter, also referred to as an "AS") manufactured using a semiconductor material gas typified by silane or germane by a vapor phase growth method or a sputtering method; a polycrystalline semiconductor that is formed by crystallizing the amorphous semiconductor, utilizing light energy or thermal energy; a semi-amorphous (also referred to as microcrystalline, and hereinafter, also referred to as an "SAS") semiconductor; or the like can be used as a material which forms a semiconductor film.

The SAS is a semiconductor having an intermediate structure between an amorphous structure and a crystalline structure (including a single crystal and a poly-crystal) and having a third state which is stable in terms of free energy, and includes a crystalline region having short-range order and lattice distortion. A crystalline region of from 0.5 to 20 nm can be observed in at least a part of a region in the film. When silicon is contained as the main component, a Raman spectrum is shifted to a lower frequency side than 520 cm$^{-1}$. A diffraction peak of (111) or (220) to be caused by a crystal lattice of silicon is observed in X-ray diffraction. Hydrogen or halogen of at least 1 atomic % or more is contained to terminate a dangling bond. The SAS is formed by glow discharge decomposition (plasma CVD) of a silicon source gas. SiH$_4$ is used as a silicon source gas. In addition, Si$_2$H$_6$, SiH$_2$Cl$_2$, SiHCl$_3$, SiCl$_4$, SiF$_4$, or the like can also be used as the silicon source gas. Further, F$_2$ or GeF$_4$ may be mixed. This silicon source gas may be diluted with H$_2$ or rare gas elements of H$_2$ and one or more selected from He, Ar, Kr, and Ne. The dilution ratio ranges from 1:2 to 1:1000. The pressure ranges approximately from 0.1 Pa to 133 Pa, and the power frequency ranges from 1 MHz to 120 MHz, preferably from 13 MHz to 60 MHz. The substrate heating temperature is preferably 300° C. or less, and the film can also be formed at substrate heating temperatures of from 100 to 200° C. It is desirable that an impurity element formed of an atmospheric component such as oxygen, nitrogen, or carbon is $1\times10^{20}$ cm$^{-3}$ or less as an impurity element taken when the film is formed; specifically, an oxygen concentration is $5\times19$ cm$^{-3}$ or less, preferably $5\times10^{19}$ cm$^{-3}$ or less. A preferable SAS can be obtained by further promoting lattice distortion by adding a rare gas element such as helium, argon, krypton or neon to enhance stability. Additionally, an SAS layer formed using a hydrogen-based silicon source gas stacked over an SAS layer formed using a fluorine-based silicon source gas may be used as the semiconductor film.

The amorphous semiconductor is typified by hydrogenated amorphous silicon and a crystalline semiconductor is typified by polysilicon. Polysilicon (polycrystalline silicon) includes a so-called high temperature polysilicon using polysilicon which is formed at a temperature of 800° C. or more as a main material, a so-called low temperature polysilicon using polysilicon which is formed at a temperatures of 600° C. or less as a main material, polysilicon crystallized by being added with an element or the like which promotes crystallization, or the like. As described above, of course, a semiconductor which contains a crystal phase in a part of the semiamorphous semiconductor or a semiconductor film can also be used.

When a crystalline semiconductor film is used as the semiconductor film, a known method (a laser crystallization method, a heat crystallization method, a heat crystallization method using an element promoting crystallization such as nickel, or the like) may be employed as a method for manufacturing the crystalline semiconductor film. A microcrystalline semiconductor which is an SAS can be crystallized by being irradiated with laser light to enhance the crystallinity. In the case where an element promoting crystallization is not used, the hydrogen is released until hydrogen concentration contained in an amorphous silicon film becomes $1\times10^{20}$ atoms/cm$^3$ or less by heating the amorphous silicon film for one hour at a temperature of 500° C. in an atmosphere of nitrogen before irradiating the amorphous silicon film with laser light. This is because an amorphous silicon film is damaged when the amorphous silicon film containing much hydrogen is irradiated with laser light.

Any method can be used for introducing a metal element into the amorphous semiconductor film without limitation as long as the method is capable of making the metal element exist on the surface or inside of the amorphous semiconductor film. For example, a sputtering method, a CVD method, a plasma treatment method (including a plasma CVD method), an adsorption method, or a method for applying a metal salt solution can be employed. Among them, the method using a solution is simple and easy and is advantageous in terms of easy concentration adjustment of the metal element. It is preferable to form an oxide film by UV light irradiation in oxygen atmosphere, a thermal oxidation method, treatment with ozone water or hydrogen peroxide including a hydroxyl radical, or the like in order to improve wettability of the surface of the amorphous semiconductor film and to spread the aqueous solution over the entire surface of the amorphous semiconductor film.

The semiconductor film is irradiated with the laser light having any one of second to fourth harmonics of the fundamental wave from a continuous wave solid-state laser. Thus, a crystal having a large grain size can be obtained. For example, typically, it is preferable to use the second harmonic (532 nm) or the third harmonic (355 nm) of an Nd:YVO$_4$ laser (fundamental wave 1064 nm). Specifically, the laser light emitted from the continuous wave YVO$_4$ laser is converted into the harmonic by a non-linear optical element to obtain laser light having the output of several W or more. It is preferable to shape the laser light into rectangular or elliptical on an irradiated surface through an optical system to irradiate a semiconductor film. The laser light needs to have the energy density of approximately from 0.001 to 100 MW/cm$^2$ (preferably, from 0.1 to 10 MW/cm$^2$). The scanning speed is set in the range of approximately from 0.5 to 2000 cm/sec (preferably, from 10 to 200 cm/sec) for the irradiation.

The laser may be a known continuous wave gas laser or solid-state laser. As the gas laser, there are an Ar laser, a Kr laser, and the like. As the solid-state laser, there are a YAG laser, a YVO$_4$ laser, a YLF laser, a YAlO$_3$ laser, a Y$_2$O$_3$ laser, a glass laser, a ruby laser, an alexandrite laser, or a Ti: Sapphire laser, and the like.

Moreover, pulsed laser light may be employed to conduct laser crystallization. In this case, the pulse repetition frequency is set to 0.5 MHz or more. This frequency band is extremely higher than the frequency band of from several ten Hz to several hundred Hz, which is used usually. It is said that it takes from several ten nanoseconds to several hundred nanoseconds to completely solidify the semiconductor film after the semiconductor film is irradiated with the pulsed laser light. When the pulsed laser light has the foregoing frequency band, it is possible to irradiate the semiconductor layer with the pulsed laser light with next pulsed laser light after the semiconductor film is melted by the previous pulsed laser light and before the semiconductor film is solidified. Therefore, the interface between the solid phase and the liquid phase can be continuously moved in the semiconductor film, and the semiconductor film having a crystal grain continuously grown toward the scanning direction is formed. Specifically, it is possible to form an aggregation of crystal grains each of which has a width of from 10 to 30 µm in the scanning direction and a width of approximately from 1 to 5 µm in a direction perpendicular to the scanning direction. It is also possible to form a semiconductor film having almost no crystal grain boundaries at least in the channel direction of the thin film transistor by forming a crystal grain of a single crystal long extended along the scanning direction.

The irradiation with the laser light may be conducted in inert gas atmosphere such as a rare gas or nitrogen. This enables the roughness of a semiconductor surface to be controlled by the irradiation with the laser light and variations in threshold value generated by variations in interface state density to be controlled.

The amorphous semiconductor film may be crystallized by combining thermal treatment and laser light irradiation, or thermal treatment or laser light irradiation may be separately performed several times.

A semiconductor can be formed from an organic semiconductor material by a printing method, a spray method, spin coating, a droplet discharge method, or the like. In this case, since the above etching step is not required, the number of steps can be reduced. A low molecular weight material, a high molecular weight material, or the like is used for the organic semiconductor, and in addition, a material such as an organic pigment, a conductive high molecular weight material can be used. A π-electron conjugated high molecular weight material having a skeleton constituted by a conjugated double bonds is preferably used as an organic semiconductor material used in the present invention. Typically, a soluble high molecular weight material such as polythiophene, polyfluoren, poly(3-alkylthiophene), a polythiophene derivative, or pentacene can be used.

A material with which a semiconductor layer can be formed by performing a process after depositing a soluble precursor is given as an example of an organic semiconductor material which can be used in the present invention. Note that polythienylenevinylene, poly(2,5-thienylenevinylene), polyacetyrene, polyacetyrene derivative, polyallylenevinylene or the like is given as an example of such an organic semiconductor material.

In converting the precursor to an organic semiconductor, a reaction catalyst such as a hydrogen chloride gas is added additionally to heat treatment. The following can be applied as a typical solvent which dissolves the organic semiconductor material having solubility: toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like.

In this embodiment mode, an amorphous semiconductor film 115 is formed over the base film 101b using amorphous silicon. The amorphous semiconductor film 115 is irradiated with laser light 170 scanned to a direction of an arrow 171 to be crystallized, thereby forming a crystalline semiconductor film 116 (FIG. 1A).

Such obtained semiconductor film may be doped with a minute amount of impurity element (boron or phosphorous) in order to control a threshold value of a thin film transistor; however, in this embodiment mode, the threshold value of the thin film transistor is controlled by manufacturing an n-channel thin film transistor to have a lightly doped p-channel impurity region. Thus, according to the present invention, it is not necessarily to conduct a doping step for controlling the threshold value; therefore, the steps are simplified.

The crystalline semiconductor film 116 is patterned using a mask. In this embodiment mode, a photo mask is formed and a patterning process is conducted by a photolithography method to form a semiconductor layer 102.

Either plasma etching (dry etching) or wet etching may be adopted for the etching in patterning. However, plasma etching is suitable to treat a large substrate. A fluorine-based gas such as CF$_4$ or NF$_3$ or chlorine-based gas such as Cl$_2$ or BCl$_3$ is used as the etching gas, and an inert gas such as He or Ar may be appropriately added. In addition, a local discharge process can be performed when an atmospheric pressure discharge etching process is applied, and so a mask layer need not be entirely formed over the substrate.

In the present invention, a conductive layer for forming a wiring layer or an electrode layer, a mask layer for forming a predetermined pattern, or the like may be formed by a method where a pattern can be selectively formed, such as a drop discharging method. In the drop discharging method (also referred to as an inkjet method according to the system thereof), a predetermined pattern (a conductive layer, an insulating layer, and the like) can be formed by selectively discharging (ejecting) liquid of a composition prepared for a specific purpose. In this case, a titanium oxide film or the like may be preformed in a region where the mask layer or the like is formed. Additionally, a method for transferring or describing a pattern, for example, a printing method (a method for forming a pattern of a screen print, an offset print, or the like) or the like can be used.

In this embodiment mode, a resin material such as an epoxy resin, an acrylic resin, a phenol resin, a novolac resin, a melamine resin, or an urethane resin is used as a mask. Alternatively, the mask may also be made of an organic material such as benzocyclobutene, parylene, flare and polyimide having a transmitting property; a compound material formed by polymerization of a siloxane polymer or the like; a composition material containing a water-soluble homopolymer and a water-soluble copolymer; and the like. In addition, a commercially available resist material containing a photosensitive agent may be also used. For example, it is possible to use a typical positive resist including a novolac resin and a naphthoquinonediazide compound that is a photosensitive agent; a base resin that is a negative resist, diphenylsilanediol, an acid generating material, and the like. The surface tension and the viscosity of any material are appropriately adjusted by controlling the solvent concentration, adding a surfactant, or the like, when a droplet discharging method is used.

A gate insulating layer 105 covering the semiconductor layer 102 is formed. The gate insulating layer 105 is formed of an insulating film containing silicon to have a thickness of from 10 to 150 nm by a plasma CVD method, a sputtering method or the like. The gate insulating layer 105 may be formed of a known material such as an oxide material of silicon or nitride material of silicon, and may be a laminated layer or a single layer. In this embodiment mode, a laminated structure is used for the gate insulating layer. A thin silicon oxide film is formed over the semiconductor layer 102 to have a film thickness of from 1 to 100 nm, preferably from 1 to 10 nm, and further preferably from 2 to 5 nm, as an insulating film of a first layer. The semiconductor surface is oxidized by a GRTA (gas rapid thermal anneal) method, a LRTA (lamp rapid thermal anneal) method, or the like and a thermal oxide film is formed, thereby forming the insulating layer of the first layer to be thin. In this embodiment mode, a laminated layer of three-layer: a silicon nitride film, a silicon oxide film, and a silicon nitride film is used over the insulating film of the first layer. Alternatively, a single layer of a silicon oxynitride film or a laminated layer of two layers thereof may be also used. Preferably, a precise silicon nitride film may be used. Note that a rare gas element such as argon may be added to a reactive gas and be mixed into an insulating film to be formed in order to form a precise insulating film having little gate leak current at low film formation temperature.

A first conductive film 106 having a film thickness of from 20 to 100 nm and a second conductive film 107 having a film thickness of from 100 to 400 nm, each of which serves as a gate electrode are stacked over the gate insulating layer 105 (FIG. 1B). The first conductive film 106 and the second conductive film 107 can be formed by a known method such as a sputtering method, a vapor deposition method, or a CVD method. The first conductive film and the second conductive film may be formed of an element selected from tantalum (Ta), tungsten (W), titanium (Ti), molybdenum (Mo), aluminum (Al), copper (Cu), chromium (Cr), or neodymium (Nd), or an alloy material or compound material having the foregoing elements as a main component. A semiconductor film typified by a polycrystalline silicon film that is doped with an impurity element such as phosphorus or an AgPdCu alloy may be used as the first conductive film and the second conductive film. The conductive film is not limited to the two-layer structure, and, for example, may have a three-layer structure in which a 50 nm thick tungsten film, a 500 nm thick alloy film of aluminum and silicon (Al—Si), and a 30 nm thick titanium nitride film are sequentially stacked. In the case of the three-layer structure, tungsten nitride may be used in stead of tungsten of the first conductive film; an alloy film of aluminum and titanium (Al—Ti) may be used in stead of the alloy film of aluminum and silicon (Al—Si) of the second conductive film; or a titanium film may be used in stead of the titanium nitride film of a third conductive film. Further, a single layer structure may be also used. In this embodiment mode, tantalum nitride (TaN) is used for the first conductive film 106 and tungsten (W) is used for the second conductive film 107.

Then, a mask using a resist is formed by a photolithography method and the first conductive film 107 is patterned to form a first gate electrode layer 205. The first conductive film can be etched to have a desired tapered shape by appropriately adjusting an etching condition (electric power applied to a coil-shaped electrode layer, electric power applied to an electrode layer on a substrate side, electrode temperature on a substrate side, or the like) by an ICP (Inductively Coupled Plasma) etching method. As an etching gas, a chlorine-based gas typified by $Cl_2$, $BCl_3$, $SiCl_4$, $CCl_4$ or the like, a fluorine-based gas typified by $CF_4$, $SF_6$, $NF_3$, or the like, or $O_2$ can be appropriately used.

Figure 3:
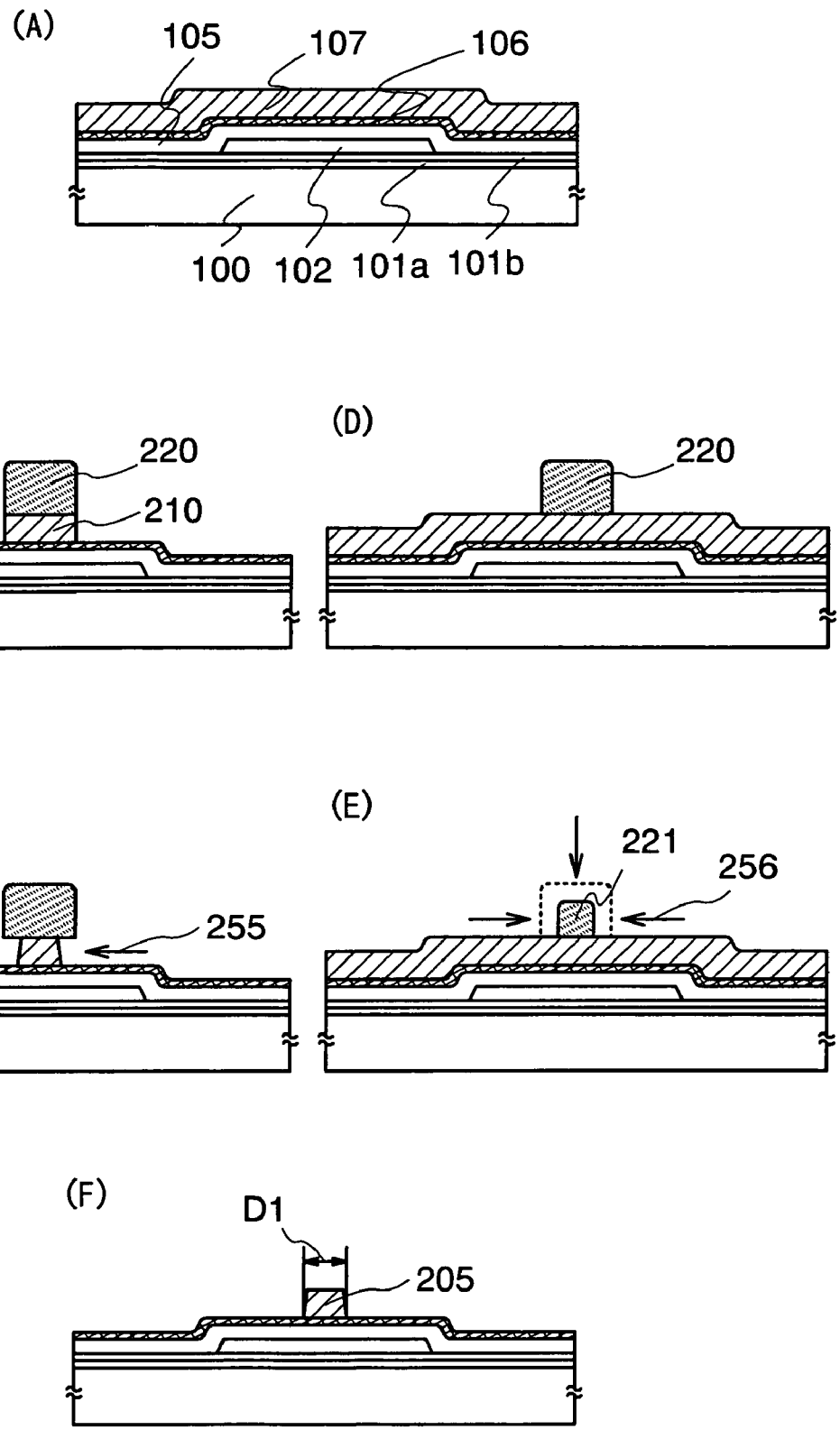
FIGS. 3A to 3F are diagrams for describing the present invention.

A thin film transistor capable of high speed operation can be formed by narrowing the width D1 of the gate electrode layer. Two methods for forming the first gate electrode layer 205 to have a narrow width are shown in FIGS. 3A to 3F. FIG. 3A corresponds to FIG. 1B and shows up to a step for forming the first conductive film 107 over the substrate 100.

First, a first method is described with reference to FIGS. 3B, 3C, and 3F. A mask 220 is formed of a resist over the first conductive film 107 by a photolithography method or a droplet discharging method. As shown in FIG. 3B, the first conductive film 107 is etched using the mask 220 to form a first gate electrode layer 210. Then, the first gate electrode layer 210 is etched in the direction of an arrow 225 without removing the mask 220. The first gate electrode layer 210 is narrowed to have the width of the first gate electrode layer 205 to form the first gate electrode layer 205 (FIG. 3C). The mask 220 is removed and the first gate electrode layer 205 can be completed to have the width D1 of the gate electrode of from 10 nm to 1000 nm, preferably from 200 nm to 700 nm (FIG. 3F).

A second method is described with reference to FIGS. 3D, 3E, and 3F. A mask 220 is formed of a resist over the first conductive film 107 by a photolithography method or a droplet discharging method. The mask 220 is made further slim by etching, ashing, or the like in a direction of an arrow 256 to form a mask 221 to have a narrower width (FIG. 3E). The first conductive film 107 is patterned using the mask 221 formed to have an elongated shape and the mask 221 is removed. Thereby, the first gate electrode layer 205 of the narrow width D1 can be similarly formed.

FIG. 33A is a perspective view showing a doping device of the present invention.

An ion source 12 includes a thermoelectronic emission filament provided for a chamber in which plasma is generated and a plurality of ring-shaped permanent magnets disposed with alternating polar characters around the chamber.

An accelerating electrode portion 13 includes an ion containment electrode which keeps the same electric potential as the chamber which is an anode, an extraction electrode which keeps the lower electric potential than the ion containment electrode by several kV, and an acceleration electrode which keeps the lower electric potential than the extraction electrode by several ten kV, in an opening at the bottom of the chamber. The ion containment electrode, the extraction electrode, and the acceleration electrode are grid electrodes.

The on-state or off-state of the irradiation may be controlled by switching operation with a shutter provided to shadow an ion beam.

An electron emitted from the filament functions on an operation gas (hydrogen, phosphine, diborane, or the like) which is introduced into the chamber from a gas introduction opening to generate plasma. The ion is contained in the chamber by a magnetic field of the permanent magnetic and simultaneously an electric field is impressed by the extraction electrode, thereby extracting the ion in the plasma through the ion containment electrode. The ion is accelerated by an electric field of the acceleration electrode, and then an ion beam 14 is generated.

A doping chamber 11 is irradiated with the ion beam 14 to inject the ion into a slanted substrate 10. The substrate 10 is slanted using an axis of tilt 16 as a center and is kept. The cross sectional view of the ion beam is made to be a linear shape or a rectangle and the substrate is moved in a direction perpendicular to a longer side of the ion beam 14 to conduct a doping process to the entire surface of the substrate.

The gradient angle of the substrate is changed by a substrate stage or a transfer robot, when the gradient of the substrate is changed into a horizontal position or a slanted position. A rail or a driving geared motor may be used to move the substrate in the scanning direction, without limiting to a robot. The angle of the stage is adjusted by an angular adjustor such as a goniometer. A stage provided with the goniometer is also referred to as a goniostage. The goniostage has a center of a slant at the top of the stage and is slanted using the center of the slant as a supporting point. An angle θ is an angle between the longer side of the ion beam 14 and the main surface of the substrate 10. The substrate is slanted using the axis of tilt 16 as an axis. The axis of tilt 16 may be provided for any position of the substrate. In FIGS. 33A and 33B the axis of tilt 16 is provided for the substrate surface parallel to one side of the substrate; however, it may be provided for the substrate surface diagonally. In this case, the substrate 10 is slanted using a diagonal line as an axis of tilt.

The doping device of the present invention enables a large sized substrate to be processed, since a substrate is moved while being kept slanted by the substrate stage when conducting the doping. A shape of cross section of the ion beam is quadrangular. Therefore, the substrate can be irradiated with every ion beam and thus, ion irradiation can be efficiently conducted. Additionally, the width of the longer side of the ion beam can be narrowed, since the substrate is slanted.

In addition, the present invention is not limited to the above described structure of a device. The substrate may be irradiated with the ion beam in a horizontal position while keeping the substrate in a slanted position that is approximately perpendicular, since there is a problem with a particle.

FIGS. 35A to 35C shows an example of doping with a substrate kept in a perpendicular position. A doping device shown in FIG. 35A has a structure where a substrate 661 kept in a perpendicular position is irradiated with an ion beam 662 in a horizontal position by an ion beam irradiation unit 663. A substrate stage for keeping a substrate is connected to a robot and provided with an axis of tilt for slanting the substrate stage while conveying the substrate. That leads to the two kinds of operations of the substrate to be possible. One kind of the operation is a method where doping is conducted conveying the substrate while slanting the substrate 661 to have an angle θ between the substrate surface and the ion beam irradiation direction, as shown in FIG. 35B. Another kind of the operation is a method where the substrate slanted as shown in FIG. 35C and conveyed is irradiated with an ion beam at an angle θ. Additionally, while being irradiated with an ion beam, an substrate stage may be held at a certain angle and may ever vary its angle in a certain rang.

The present invention is not limited to the above described structure of the device. A substrate conveying roller may be used to hold and convey the slanted substrate in stead of the substrate stage. In this case, a bottom of the substrate is held by a holding member such as a conveying roller and a bottom of tilt is held by a side guide. By using the side guide, the bottom of the substrate which is in contact with the bottom support roller is held from the side and the substrate is prevented from moving blow.

Further, the doping device of the present invention may include an ion convergent device or an ion mass separator which is known in the conventional ion doping technique.

It is required to consider arrangement of a TFT in order to form an impurity region below a gate electrode by doping while keeping a substrate in a slanted position. FIG. 33B shows a substrate in a doping chamber 11 with ease. As shown in FIG. 33B, a circuit including the TFT is preferably configured so that the substrate stage for slanting the substrate is moved according to a channel length direction 17. Therefore, the arrangement of the circuit including the TFT is required to be decided in accordance with the position of providing an axis of tilt 16 for deciding the movement of the substrate stage.

Figure 34:
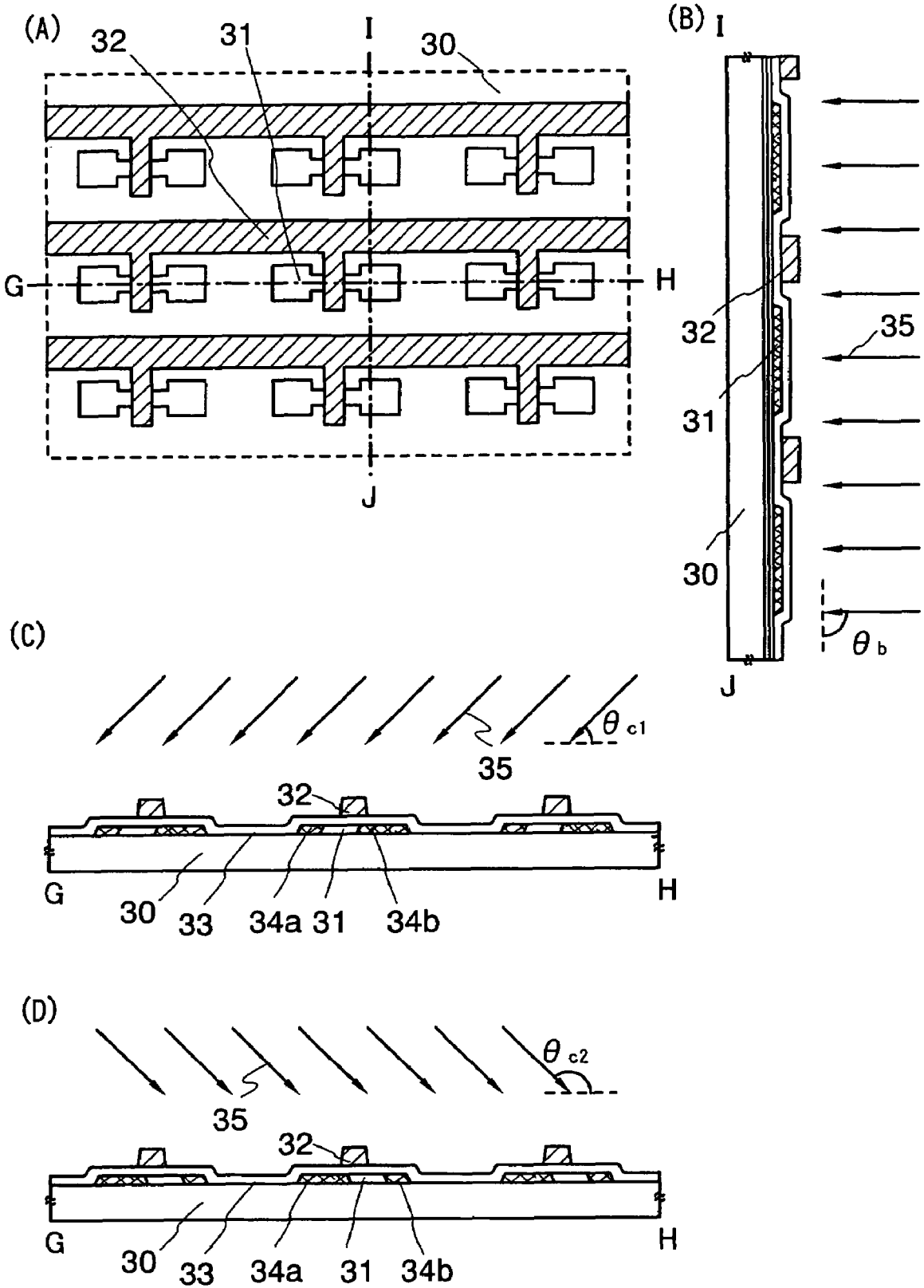
FIGS. 34A to 34D are diagrams for describing a brief summary of the present invention.

FIGS. 34A to 34D are a top view A for describing a doping step of a semiconductor device in this embodiment mode; a cross sectional view B of a line I-J of the top view A; and cross sectional views C and D of a line G-H of the top view A. As shown in FIGS. 34A to 34D, a plurality of semiconductor layers 31, a plurality of gate electrode layers 32, and a plurality of gate insulating layers 33 are formed over a substrate 30. In the present invention, the semiconductor layer 31 is doped with an impurity element diagonally so that an incidence angle of the impurity element to the surface thereof has an angle θ. The substrate 30 shown in FIG. 34A is slanted using an axis of tilt which is parallel to the line I-J. While being kept slanted, the substrate 30 is doped with an impurity element. As a result, the substrate 30 is doped with impurity element 35 diagonally as shown in FIGS. 34C and 34D. However, the cross sectional view 34B of the line I-J which is parallel to the axis of tilt shows that the semiconductor layer 31 is doped with impurity element 35 so that an incidence angle of the impurity element to the surface thereof always has a right angle $\theta_b$. FIGS. 34C and 34D which are the cross sectional views of the line G-H which is perpendicular to the axis of tilt shows that the semiconductor layer 31 is doped with the impurity element 35 diagonally to have an angle $\theta_{c1}$ or an angle $\theta_{c2}$ according to a slope angle of the substrate 30. An impurity region 34a and an impurity region 34b can be formed to be different in a structure as shown in FIGS. 34C and 34D by changing the angle $\theta_{c1}$ and the angle $\theta_{c2}$.

An incidence angle θ of the impurity element 35 to the surface of the semiconductor layer which is doped is preferably from 30° to 90° or from 90° to 150°. Additionally, it is preferable to set angular difference between the angle $\theta_{c1}$ and the angle $\theta_{c2}$ at 5° or more when two kinds of dopings are carried out.

The first conductive film 106 is etched using the first gate electrode layer 205 as a mask, and a second gate electrode layer 202 having the approximately same width as that of the first gate electrode layer 205 is formed (FIG. 1C). A gate electrode layer formed of the first gate electrode layer 205 and the second gate electrode layer 202 can be formed to have a narrow width D1. Setting the width D1 of the gate electrode layer within the aforesaid limits enables a thin film transistor which has a short channel length to be subsequently formed and a semiconductor device capable of high speed operation to be formed. In this embodiment mode, a material used for the first conductive film 106 and a material used for the second conductive film 107 have a high etching selectivity; therefore, the gate electrode layer is formed of the first gate electrode layer 205 and the second gate electrode layer 202 by a two-stage etching step. However, in the case of using a material which does not have a high etching selectivity between the first conductive film 106 and the second conductive film 107, the first gate electrode layer 205 and the second gate electrode layer 202 may be formed by etching them at the same time.

A semiconductor layer is doped with an impurity element 251 for imparting a p-type using the first gate electrode layer 205 and the second gate electrode layer 202 as a mask. Here, the semiconductor layer 102 is doped with the impurity element 251 for imparting a p-type at the incident angle $\theta_1$ to the surface thereof which is set at from 30° to 90° or from 90° to 150°, thereby forming a first p-type impurity region 103a and a first p-type impurity region 103b (FIG. 1C). In this embodiment mode, the angle $\theta_1$ is set at the range of from 30° to 90°. The semiconductor layer is doped with the impurity element for imparting a p-type diagonally to the surface thereof. Therefore, a region to be covered with the first gate electrode layer 205 in the semiconductor layer 102 is also doped, thereby forming a first p-type impurity region 103b. However, some impurity elements for imparting a p-type are blocked by the first gate electrode layer 205; therefore, the first p-type impurity region 103a is not formed in the region to be covered with the first gate electrode layer 205 in the semiconductor layer. In other words, the semiconductor layer 102 is selectively doped with the impurity elements for imparting a p-type, thereby forming the first p-type impurity region 103a and the first p-type impurity region 103b (FIG. 1D). The doping is conducted so that the first p-type impurity region 103a and the first p-type impurity region 103b include the impurity elements for imparting a p-type with a concentration of approximately from $5\times10^{17}$ to $5\times10^{18}/cm^3$. In addition, the concentration thereof may be set at approximately from $5\times10^{16}$ to $5\times10^{17}/cm^3$. In this embodiment mode, boron (B) is used as the impurity elements for imparting a p-type.

In this embodiment mode, a region where the impurity region is overlapped with the gate electrode layer via the gate insulating layer means a Lov region and a region where the impurity region is not overlapped with the gate electrode layer via the gate insulating layer means a Loff region. A channel length L of the thin film transistor and a length $L_{OV}$ of a Lov region 2602a in a channel length direction are explained with reference to FIGS. 27A to 27C and 28A to 28C. In this embodiment mode, the channel length L of the thin film transistor and the length $L_{OV}$ of the Lov region 2602a are defined as those in FIG. 27A. Basically, these lengths and a width of a gate electrode layer 2600 have the equality, that is, width=L+$L_{OV}$, as shown in FIG. 27A. In the case that doped impurity elements are dispersed by heat treatment at comparatively high temperature after doping the substrate with the impurity elements diagonally, boundaries of the channel formation region 2603 become vague. FIG. 27A shows a simple structural diagram of the channel formation region 2603 to distinguish the boundaries. In FIGS. 27A to 27C, the Lov regions are shown using a hatching and a blank; however, this does not mean that the blank portion has not been doped with the impurity element. This is to make it clear that the concentration distribution of the impurity element in this region reflects the doping condition. Note that this is the same as in other diagrams of this specification. The shapes of the first p-type impurity region 103a and the first impurity region 103b in FIG. 1D are also intended to make it clear that the concentration distribution reflects the incident angle $\theta_1$.

Depending on a doping condition, as indicated by a dotted line in FIG. 27B, a peak of a concentration profile 2604 may be positioned at an upper portion of the channel formation region 2606 or at a gate insulating layer 2601. In FIG. 27B, a length Lov of an Lov region 2605a that is overlapped with the gate electrode layer 2600 and a channel length L of the channel formation region 2606 are the same as those in FIG. 27A.

Depending on the doping condition, as indicated by a dotted line in FIG. 27C, a peak of a concentration profile 2607 may be positioned at a base insulating film under the semiconductor layer or the substrate. In this case, the lengths and the width of the gate electrode 2600 cannot have the equality, that is, width=L+$L_{OV}$. Since the channel is formed at an interface between a channel formation region 2609 and a gate insulating layer 2601, the channel length L has a length as illustrated in FIG. 27C and a Lov region 2608a overlapped with the gate electrode layer 2600 indicates the portion where the length Lov is the longest. In the case of using a semiconductor substrate, the structure shown in FIG. 27C is the structure that is manufactured by only a thin film transistor having a long channel length since concentration profiles of the semiconductor substrates are overlapped with each other or too close to each other at the bottom portion of the gate.

In FIG. 27A, concentration distribution of impurity elements in a crosswise direction and a lengthwise direction of the Lov region 2602a is explained with reference to FIGS. 28A to 28C. FIG. 28A is an enlarged view of one Lov region 2602a illustrated in FIG. 27A. FIG. 28B shows concentration distribution of the impurity elements in a depth direction (Y-Z) of the Lov region in FIG. 28A. FIG. 28C shows concentration distribution of the impurity elements in a crosswise direction (V-X: a perpendicular direction to the depth direction) of the Lov region in FIG. 28A.

As shown in FIG. 28B, concentration gradient of the impurity elements at the substrate side and the gate electrode layer side in the Lov region is generated. As shown in FIG. 28C, concentration gradient in the Lov region is generated.

As shown in FIGS. 27B and 27C, the concentration gradient in a depth direction and a crosswise direction is various gradient.

The semiconductor layer is doped with an impurity element 252 for imparting an n-type using the first gate electrode layer 205 again as a mask. The semiconductor layer 102 is doped with the impurity element 252 for imparting an n-type at the incident angle $\theta_2$ to the surface which is set at approximately 90°, thereby forming a first n-type impurity region 104a and a first n-type impurity region 104b (FIG. 1E). Regions to be the first n-type impurity region 104a and the first n-type impurity region 104b have been doped with the impurity element for imparting a p-type; therefore, they are required to be doped with an impurity element for imparting an n-type which has a higher concentration than that of the impurity element for imparting a p-type of the first p-type impurity region 103a and the first p-type impurity region 103b in order to change a p-type to an n-type. The first n-type impurity region 104a and the first n-type impurity region 104b are formed to include the impurity elements for imparting an n-type typically in a concentration of from $1\times10^{17}$ to $5\times10^{18}/cm^3$. In this embodiment mode, phosphorous (P) is used as the impurity elements for imparting an n-type.

Here, the semiconductor layer 102 is doped in a self-alignment manner with the impurity element 252 for imparting an n-type using the first gate electrode layer 205. Therefore a region which is overlapped with the first gate electrode layer 205 in the first p-type impurity region 103b remains the p-type impurity region, without being doped with the impurity element 252 for imparting an n-type. Therefore, a second p-type impurity region 208 is formed in the semiconductor layer 102 and the second p-type impurity region 208 is an Lov region. On the other hand, the first n-type impurity region 104a and the first n-type impurity region 104b are Loff regions since they are not covered with the gate electrode layer 205 and the gate electrode layer 202.

Next, after forming an insulating layer covering the first conductive film 106, the gate electrode layer 205, and the like, this insulating layer is processed by anisotropic etching of an RIE (reactive ion etching) method to form a sidewall (sidewall spacer) 201 on a sidewall of the gate electrode layer 205 in a self-alignment manner (FIG. 2A). In addition, when forming the sidewall 201, the semiconductor layer 102 is exposed as an etching stopper and an insulating layer 701 is formed. Here, the insulating layer is not particularly limited. However, it is preferable that the insulating layer contains silicon oxide formed to have a favorable step coverage by reacting TEOS (Tetra-Ethyl-Orso-Silicate), silane, or the like with oxygen, nitrous oxide, or the like. The insulating layer can be formed by a thermal CVD method, a plasma CVD method, an atmospheric pressure CVD method, a bias ECR CVD method, a sputtering method, or the like. Additionally, the sidewall prevents the gate electrode layer and the silicide contained in the source region and the drain region in the semiconductor layer from being short-circuited.

In this embodiment mode, when etching the insulating layer, the sidewall 201 is formed so that the insulating layer is left over the first gate electrode layer 205. Additionally, a protective film may be formed over the first gate electrode layer 205 after the insulating layer is etched until the gate electrode layer 205 is exposed and the sidewall is formed. Protecting the first gate electrode layer 205 prevents the first gate electrode layer 205 from being reduced while the etching is carried out. As an etching method, a known method of a dry-etching method or a wet-etching method can be employed. In this embodiment mode, a dry etching method is used. Note that a chlorine-based gas typified $Cl_2$, $BCl_3$, $SiCl_4$, and $CCl_4$, a fluorine-based gas typified by $CF_4$, $SF_6$, and $NF_3$; or $O_2$ can be appropriately used for the etching gas.

The semiconductor layer 102 is doped with an impurity element 253 for imparting an n-type to have a perpendicular incident angle to the surface thereof using the sidewall 201 and the first gate electrode layer 205 as a mask, thereby forming a second n-type impurity region 203a and a second n-type impurity region 203b (FIG. 2B). Here, the second n-type impurity region 203a and the second n-type impurity region 203b are formed to include the impurity elements for imparting an n-type in a concentration of approximately from $5\times10^{19}$ to $5\times10^{20}$/cm$^3$. In this embodiment mode, phosphorous (P) is used as the impurity elements for imparting a n-type. Regions which are not doped with the impurity elements for imparting an n-type, blocked by the sidewall 201 which functions as a mask become a third n-type impurity region 206a and a third n-type impurity region 206b. The second n-type impurity region 203a, the second n-type impurity region 203b, the third n-type impurity region 206a, and the third n-type impurity region 206b are Loff regions which are not covered with the gate electrode layer 202. Note that a channel formation region 207 is formed in the semiconductor layer 102 (FIG. 2B).

The second n-type impurity region 203a and the second n-type impurity region 203b are highly doped impurity regions which have high concentrations of the impurity elements for imparting an n-type, and they function as a source region and a drain region. On the other hand, the third n-type impurity region 206a and the third n-type impurity region 206b which are lightly doped impurity regions are Loff regions. Consequently, deterioration due to hot carrier injection can be controlled by alleviating an electrical field adjacent to a drain and an off-state current can be reduced. Hereby, a semiconductor device capable of high speed operation can be formed.

Heat treatment, irradiation of intense light, or irradiation of laser light may be carried out to activate the impurity elements. Plasma damage to the gate insulating layer or plasma damage to the interface between the gate insulating layer and the semiconductor layers can be recovered simultaneously with the activation.

A conductive film 702 is formed over the semiconductor layer 102 and the sidewall 201 (FIG. 2C). As the material for the conductive film 702, titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like are used. Here, a titanium film is formed by a sputtering method.

Silicides 703a and 703b are formed by the reaction of silicon of the semiconductor layer in exposed source and drain regions, and the conductive film 702 by heat treatment, a GRTA method, an LRTA method, or the like. Additionally, a silicide may be formed using laser irradiation or exposure to the light by a lamp. Thereafter, a part of the conductive film 702 which does not react with the semiconductor layer is removed (FIG. 5D).

Next, an insulating film 108 containing hydrogen is formed as a passivation film. The insulating film 108 is formed of an insulating film containing silicon to a thickness from 100 to 200 nm by a plasma CVD method or a sputtering method. The insulating film 108 is not limited to a silicon nitride film, and a silicon nitride oxide (SiNO) film by plasma CVD, or a single layer or a lamination structure of other insulating films containing silicon may be used.

Moreover, the step for hydrogenating the semiconductor layers is performed by heat treatment at a temperature of from 300 to 550° C. for 1 to 12 hours in a nitrogen atmosphere. The step is preferably performed at a temperature of from 400 to 500° C. The step is a step for terminating dangling bonds of the semiconductor layers due to hydrogen contained in the insulating film 108.

The insulating film 108 is formed of a material selected from silicon nitride, silicon oxide, silicon oxynitride (SiON), silicon nitride oxide (SiNO), aluminum nitride (AlN), aluminum oxynitride (AlON), aluminum nitride oxide having more nitrogen content than oxygen content (AlNO), aluminum oxide, diamond like carbon (DLC), and a nitrogen-containing carbon film (CN). Alternatively, a material in which a skeletal structure is constructed by allowing silicon (Si) and oxygen (O) to bond with each other, and a substituent contains at least hydrogen, or at least one of fluorine, an alkyl group, and aromatic hydrocarbon may be used.

Then, an insulating layer 109 to be an interlayer insulating film is formed (FIG. 2B). In the present invention, an interlayer insulating film for planarization is required to be highly heat resistant and electrically insulative, and having high planarization coefficient. Such an interlayer insulating film is preferably formed by a coating method typified by a spin coating method.

In this embodiment mode, a siloxane resin is used as a material of the insulating layer 109. The siloxane rein corresponds to a resin containing a Si—O—Si bond. Siloxane is composed of a skeletal structure formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. The film after being baked can be referred to as a silicon oxide film containing alkyl (SiOx). This silicon oxide film containing alkyl (SiOx) can withstand heat treatment of 300° C. or more.

Dip, spraying application, doctor knife, a roll coating machine, a curtain coating machine, a knife coating machine, a CVD method, a spin coating method, a vapor deposition method can be used for the insulating layer 109. In addition, the insulating layer 109 may be formed by a droplet discharge method. A material solution can be saved when the droplet discharge method is applied. A method capable of lithography or delineation of a pattern like a droplet discharge method, for example, a printing method (a method in which a pattern is formed such as screen printing or offset printing), or the like can also be used. A spin coat method or an inorganic material may be used, and in this case, silicon oxide, silicon nitride, and silicon oxynitride may be used.

In addition to an insulating film in which a skeletal structure is constituted by bonding silicon (Si) and oxygen (O), the insulating layer 109 can also be formed using a film formed of a kind or a plural kinds, or a lamination of an inorganic material (silicon oxide, silicon nitride, silicon oxynitride, silicon nitride oxide, a PSG (phosphorous glass), a BPSG (boron phosphorous glass), an alumina film, or the like); a photosensitive or non-photosensitive organic material (organic resin material) (polyimide, acryl, polyamide, polyimide amide, benzocyclobutene, or the like); a resist; or a Low k material having low dielectric constant, or the like.

A contact hole (an opening) reaching the semiconductor layer 102 is formed using a mask of a resist in the insulating layer 109, the insulating film 108, and the gate insulating layer 105. Etching may be conducted once or several times according to the selectivity of used materials. In this embodiment mode a first etching is conducted on a condition in which an etching selectivity is obtained between the insulating layer 109 and the insulating film 108 and the gate insulating layer 105, thereby removing the insulating layer 109 and the insulating film 108. Then a second etching is conducted to remove the gate insulating layer 105, thereby forming an opening reaching the silicides 703a and 703b which are a source region or a drain region.

The first etching for removing the insulating layer 109 and the insulating film 108 is conducted. The etching (wet etching or a dry etching) is conducted. An inert gas may be added into an used etching gas. An element or plural elements of He, Ne, Ar, Kr, and Xe can be used as an inert element to be added. Specifically, it is preferable to use argon having a comparatively large atomic radius and which is inexpensive. In this embodiment mode, $CF_4$, $O_2$, He, and Ar are used. An etching condition during a dry etching is set in a flow rate of $CF_4$ to be 380 sccm; a flow rate of $O_2$, 290 sccm; a flow rate of He, 500 sccm; a flow rate of Ar, 500 sccm; a RF power, 3000 W; and a pressure, 25 Pa. According to the above condition, an etching residue can be decreased.

Over etching is preferably conducted by increasing the etching time at a rate of approximately from 10 to 20% in order to conducting the etching without leaving a residue on the gate insulating layer 105. A taper shape may be formed by etching the insulating layer 109 just once or by etching it for several times. A taper shape may be formed by carrying out the second dry etching, further using $CF_4$, $O_2$, and He in a flow rate of $CF_4$ to be 550 sccm; a flow rate of $O_2$, 450 sccm; a flow rate of He, 350 sccm; a RF power, 3000 W; and a pressure, 25 Pa.

The gate insulating layer 105 is etched as the second etching to form an opening reaching the source region and the drain region. The opening may be formed by etching the insulating film 108 and the gate insulating layer 105 using a mask formed after etching the insulating layer 109 or using the etched insulating layer 109 as a mask. The gate insulating layer 105 is etched using $CHF_3$ and Ar as an etching gas. Through the etching according to the above conditions, an etching residue is reduced, and a flat contact hole with few depressions can be formed. Note that the etching time is preferably increased at a rate of approximately from 10 to 20% in order to conduct etching without leaving a residue over the silicide.

A conductive film is formed and etched to form a source or drain electrode layer 112 electrically connected to a part of the silicide 703a and the silicide 703b. This source or drain electrode layer 112 is in contact with a later formed wiring or the like, and is a wiring connects the thin film transistor to the wiring. The source or drain electrode layer 112 can be formed by forming a conductive film by a PVD method, a CVD method, a vapor deposition method, or the like, and etching the conductive film into a desired shape. A conductive layer can be formed at a predetermined position by a droplet discharging method, a printing method, an electroplating method, or the like. Moreover, a reflow method or a damascene method can be employed. As a material for the source or drain electrode layer 112, metal such as Ag, Au, Cu, Ni, Pt, Pd, Ir, Rh, W, Al, Ta, Mo, Cd, Zn, Fe, Ti, Si, Ge, Zr, or Ba; alloys of the foregoing metal; or metal nitride of the foregoing metal is used. In addition, a lamination structure of these materials such as Ti/Al/Ti may be adopted. In this embodiment mode, an alloy of Al and Ni is patterned into a desired shape to forme the source or drain electrode layer 112.

The thin film transistor 150 has a silicide structure, thereby enabling the resistance of the source region and the drain region to be lower and the semiconductor device to speed up. Further, power consumption can be reduced since the device can be moved with a lower voltage.

By the foregoing steps, a thin film transistor 150 having the second n-type impurity region 203a and the second n-type impurity region 203b which are highly doped impurity regions, and the third n-type impurity region 206a, the third n-type impurity region 206b, the second p-type impurity region 208, and the channel formation region 207 which are lightly doped impurity regions can be provided (FIG. 2E). In FIG. 2E, a width D2 of the second p-type impurity region 208 is preferably from 5 to 200 nm and a width of the third n-type impurity region 206a and the third n-type impurity region 206b is preferably from 10 to 200 nm. Threshold value is shifted by setting the width D2 of the second p-type impurity region and the width D1 of the third n-type impurity region in the above described ranges and an n-channel thin film transistor capable of reducing cutoff current can be manufactured.

In this embodiment mode, a lightly doped p-type impurity region is formed in an n-channel thin film transistor; however, a lightly doped n-type impurity region may be formed in a p-channel thin film transistor in a similarly way. Additionally, a second p-type impurity region 208 in the thin film transistor 150 manufactured in this embodiment mode may be doped with an impurity element for imparting an n-type to form an n-type impurity region. In this case, an n-channel thin film transistor having an n-type impurity region can be formed in either Lov region of a source side or a drain side. Similarly, a p-channel thin film transistor is diagonally doped to form a p-type impurity region, as enables a thin film transistor providing a p-type impurity region with either Lov region of a source side or a drain side to be formed.

The following method can exfoliate the thin film transistor 150 from the substrate 100 illustrated in FIGS. 1A to 1E and 2A to 2E. As a method for exfoliating, 1) a method that uses a substrate having heat resistance at approximately from 300 to 500° C. as the substrate 100, provides a metal oxide film between the substrate 100 and the thin film transistor 150, and makes the metal oxide film be fragile to exfoliate the thin film transistor 150; 2) a method that provides an amorphous silicon film containing hydrogen between the substrate 100 and the thin film transistor 150, and removes the amorphous silicon film by irradiation of laser light or an etching using a gas or solvent to exfoliate the thin film transistor 150; 3) a method that removes mechanically the substrate 100 provided with the thin film transistor 150, or remove the thin film transistor 150 by etching with solution or gas such as $CF_3$ to exfoliate the thin film transistor 150; or the like can be nominated. In addition, the exfoliated thin film transistor 150 can be pasted to materials of various qualities and properties according to the purposes. For example the thin film transistor 150 may be pasted onto a flexible substrate using a commercially available adhesive agent, an adhesive agent such as epoxy resin based adhesive agent or resin additive.

As noted above, by pasting the exfoliated thin film transistor 150 onto the flexible substrate, a semiconductor device that is thin, lightweight, and hardly shattered even when falling can be manufactured. Additionally, the flexible substrate has flexible property; therefore, the flexible substrate can be pasted to a curved surface and depressions, thereby realizing a wide variety of uses. When the substrate 100 is reused, the semiconductor device at a reasonable price can be provided. In addition, the thin film transistor manufactured in this embodiment mode has a sidewall structure; therefore, a LDD region can be also formed in a thin film transistor having a submicron structure.

According to the present invention, a semiconductor layer is provided with an impurity region having an impurity element for imparting a different conductivity type; therefore, properties of a thin film transistor can be minutely controlled. This enables a thin film transistor having required functions to be formed by brief steps and a semiconductor device with high reliability and better electrical characteristics to be manufactured at a low cost. In this embodiment mode, a thin film transistor is an n-channel thin film transistor having a lightly doped p-type impurity region; therefore, a semiconductor device capable of high speed operation and reducing power consumption can be formed.

Additionally, the semiconductor device manufactured in this embodiment mode can be formed using a crystalline semiconductor film; therefore, the semiconductor device can be formed without using an expensive single crystal semiconductor substrate. Thus, cost can be reduced. In addition, the thin film transistor 150 manufactured in this embodiment mode is peeled and adhered to a flexible substrate, thereby enabling a thin semiconductor device to be manufactured.

Embodiment Mode 2

An embodiment mode of the present invention is described with reference to FIGS. 1A to 1E, 2A to 2E, and 31A and 31B. This embodiment mode describes a case where a different incident angle $\theta_1$ of an impurity element are added to a semiconductor layer is used in the semiconductor device manufactured in Embodiment Mode 1. Then, repeated descriptions of the same portion and the portion having the same function are omitted.

As described in Embodiment Mode 1, a semiconductor layer 102 is formed over a substrate 100, and a gate insulating layer 105, a first gate electrode layer 205, and a second gate electrode layer 202 are formed (FIG. 1C).

In Embodiment Mode 1, the incident angle $\theta_1$ of the impurity element added to a semiconductor layer is set at from 30° to 90° (FIG. 1D). In this embodiment mode, the incident angle $\theta_1$ is set at from 90° to 150°. The semiconductor layer is doped with an impurity element 651 for imparting a p-type, diagonally to the surface thereof. Therefore, a region to be covered with the first gate electrode layer 205 in the semiconductor layer 102 is also doped, thereby forming a first p-type impurity region 603a. However, some impurity elements for imparting a p-type are blocked by the first gate electrode layer 205; therefore, a first p-type impurity region 603b is not formed in the semiconductor region to be covered with the first gate electrode layer 205. In other words, a p-type impurity region is selectively formed in the semiconductor layer 102, thereby forming the first p-type impurity region 603a and the first p-type impurity region 603b (FIG. 31A). The doping is conducted so that the first p-type impurity region 603a and the first p-type impurity region 603b include the impurity elements for imparting a p-type with a concentration of approximately from $5\times10^{17}$ to $5\times10^{18}/cm^3$. In addition, the concentration thereof may be set at approximately from $5\times10^{16}$ to $1\times10^{17}/cm^3$. In this embodiment mode, boron (B) is used as the impurity element for imparting a p-type.

FIG. 31B shows a thin film transistor 650 manufactured in this embodiment mode. In this embodiment mode, the incident angle $\theta_1$ of the impurity element 651 for imparting a p-type is set at from 90° to 150°; therefore, a second p-type impurity region 608 which is a lightly doped p-type impurity region is formed between a third n-type impurity region 206a and a channel formation region 207. As described above, controlling the incident angle $\theta$ to the semiconductor layer enables a thin film transistor which has a different structure of the impurity region to be manufactured and electrical characteristics of the thin film transistor to be controlled.

According to the present invention, a semiconductor layer is provided with impurity regions having impurity elements for imparting different conductivity types; therefore, properties of a thin film transistor can be minutely controlled. This enables a thin film transistor having required functions to be formed by brief steps and a semiconductor device with high reliability and better electrical characteristics to be manufactured at a low cost. In this embodiment mode, a thin film transistor is an n-channel thin film transistor having a lightly doped p-type impurity region; therefore, a semiconductor device capable of high speed operation and reducing power consumption can be formed.

Embodiment Mode 3

An embodiment mode of the present invention is described with reference to FIGS. 3A to 3F, 4A to 4D, and 5A to 5D. This embodiment mode describes a case where structures in a gate electrode layer and an impurity region in a semiconductor layer of a thin film transistor 150 are different from those of the semiconductor device manufactured in Embodiment Mode 1. Then, repeated descriptions of the same portion and the portion having the same function are omitted.

As in Embodiment Mode 1, a base film 101a and a base film 101b are stacked as a base film over a substrate 100 and a semiconductor layer 102 is formed. An amorphous semiconductor film is irradiated with laser light to be crystallized, and then the formed crystalline semiconductor film is patterned to form the semiconductor layer 102. A gate insulating layer 105 is formed over the semiconductor layer 102 and a second conductive film 107 is formed (FIG. 4A). In Embodiment Mode 1, the gate electrode layer has a lamination structure; however, in this embodiment mode, the gate electrode layer is a single layer structure, thus, only the second conductive film 107 is formed. The second conductive film 107 is etched to be a thin line as shown in FIGS. 3A to 3F and a first gate electrode layer 205 is formed.

The semiconductor layer 102 is doped with an impurity element 251 for imparting a p-type to the surface thereof at the incident angle $\theta_1$ of from 30° to 90° or from 90° to 150° using the first gate electrode layer 205 and a second gate electrode layer 202 as masks, thereby forming a first p-type impurity region 103a and a first p-type impurity region 103b (FIG. 4B). In this embodiment mode, the incident angle $\theta_1$ is set at the range of from 30° to 90°. The semiconductor layer is doped diagonally with the impurity element 251 for imparting a p-type. Therefore, the first p-type impurity region 103b is also formed in a portion to be covered with the first gate electrode layer 205 in the semiconductor layer. However, the impurity element 251 for imparting a p-type is blocked by the first gate electrode layer 205 which functions as a mask; therefore, the first p-type impurity region 103a is not formed in a region under the first gate electrode layer 205 in the semiconductor layer. The doping is conducted so that the first p-type impurity region 103a and the first p-type impurity region 103b include the impurity elements for imparting a p-type in a concentration of approximately from $5 \times 10^{17}$ to $5 \times 10^{18}/cm^3$. Alternatively, the concentration thereof may be set at approximately from $5 \times 10^{16}$ to $1 \times 10^{17}/cm^3$. In this embodiment mode, boron (B) is used as the impurity element for imparting a p-type.

Next, the semiconductor layer 102 is doped with an impurity element for imparting an n-type at the near-perpendicular incident angle $\theta_2$ to the surface thereof using the first gate electrode layer 205 as a mask, thereby forming a first n-type impurity region 104a and a first n-type impurity region 104b (FIG. 4C). Regions to be the first n-type impurity region 104a and the first n-type impurity region 104b have been doped with the impurity element for imparting a p-type; therefore, they are required to be doped with an impurity element for imparting an n-type which has a higher concentration than that of the impurity element for imparting a p-type of the first p-type impurity region 103a and the first p-type impurity region 103b in order to change a p-type to an n-type. The first n-type impurity region 104a and the first n-type impurity region 104b are formed to include the impurity elements for imparting an n-type typically in a concentration of from $1 \times 10^{17}$ to $5 \times 10^{18}/cm^3$. In this embodiment mode, phosphorous (P) is used as the impurity elements for imparting an n-type. The impurity element 252 for imparting an n-type is blocked by the first gate electrode layer 205 since the impurity element 252 is added nearly perpendicularly. Consequently, a portion to be covered with the first gate electrode layer 205 in the semiconductor layer is not doped with the impurity element 252. Therefore, a part of the first p-type impurity region under the first gate electrode 205 in a semiconductor layer is left, and becomes a second p-type impurity region 208. The second p-type impurity region 208 is a Lov region which is formed by being overlapped with the gate electrode layer 205 via the gate insulating layer 105, on the other hand, the first n-type impurity region 104a and the first n-type impurity region 104b are Loff regions.

In this embodiment mode, a sidewall 201 is formed on a side surface of the first gate electrode layer 205 by forming an insulating layer over the gate insulating layer 105 and the first gate electrode layer 205 and conducting anisotropic etching (FIG. 4D). When forming the sidewall 201, the semiconductor layer 102 is exposed as an etching stopper and an insulating layer 701 is formed (FIG. 4D). The sidewall prevents the gate electrode layer and the silicide contained in the source region and the drain region in the semiconductor layer from being short-circuited. The gate insulating layer 105 may be removed using the gate electrode layer 205 as a mask without forming the sidewall 201, and in this case, the insulating layer 701 has the same shape as the gate electrode layer 205.

A conductive film 702 is formed over the semiconductor layer 102 and the sidewall 201 (FIG. 5B). As the material for the conductive film 510, titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like are used. Here, a titanium film is formed by a sputtering method.

Silicides 703a and 703b are formed by the reaction of silicon of the semiconductor layer in exposed source and drain regions, and the conductive film 702 by heat treatment, a GRTA method, an LRTA method, or the like. Thereafter, a part of the conductive film 702 that does not react with the semiconductor layer is removed (FIG. 5C).

An insulating film 108 for hydrogenation is appropriately formed by heat treatment, laser irradiation, or the like for activating an impurity element. Hydrogenation is conducted by heat treatment to form an insulating layer 109 (FIG. 5C). The heat treatment for activating an impurity element may be conducted in conjunction with the heat treatment for hydrogenation; therefore, steps can be simplified.

An opening (a contact hole) 204 reaching a source region and a drain region is formed in the insulating layer 109, the insulating film 108, and the gate insulating layer 105 (FIG. 5C). A source or drain electrode layer 112 being in contact with a source region or a drain region is formed in the opening 204. Then, a thin film transistor 150 is formed in this embodiment mode (FIG. 5D). Additionally, in this embodiment mode, a thin film transistor having an impurity region doped with the opposite conductivity of the same region can be formed when exchanging the region doped with the impurity element for imparting an n-type for the region doped with the impurity element for imparting a p-type. In this case, the second p-type impurity region 208 become an n-type impurity region and the first n-type impurity region 104a and the first n-type impurity region 104b becomes p-type impurity regions, thus, a p-channel thin film transistor having a lightly doped n-type impurity region as a Lov region can be formed. Such a p-channel thin film transistor having a lightly doped n-type impurity region according to the present invention has high reliability and can operate at high speed.

The thin film transistor 150 has a silicide structure, thereby enabling the resistance of the source region and the drain region to be lower and the semiconductor device to speed up. Additionally, the operation at the lower voltage is possible, therefore, power consumption can be reduced.

According to the present invention, a semiconductor layer is provided with an impurity region having an impurity element for imparting a different conductivity type; therefore, properties of a thin film transistor can be minutely controlled. This enables a thin film transistor having required functions to be formed by brief steps and a semiconductor device with high reliability and better electrical characteristics to be manufactured at a low cost. In this embodiment mode, a thin film transistor is an n-channel thin film transistor having a lightly doped p-type impurity region; therefore, a semiconductor device capable of high speed operation and reducing power consumption can be formed.

This embodiment mode can be implemented in combination with each of Embodiment Modes 1 and 2.

Embodiment Mode 4

An embodiment mode of the present invention is described with reference to FIGS. 6A to 6D, 7A to 7D, and 29A and 29B. This embodiment mode describes an example where a processor such as a CPU is manufactured as a semiconductor device provided with the thin film transistor 150, an n-channel thin film transistor, and a p-channel thin film transistor which are formed in Embodiment Mode 1 over the same substrate. Then, repeated descriptions of the same portion and the portion having the same function are omitted.

As in Embodiment Mode 1, a base film 301a and a base film 301b are stacked as a base film over a substrate 300 and a semiconductor layer 302, a semiconductor layer 303, and a semiconductor layer 304 are formed. An amorphous semiconductor film is irradiated with laser light to be crystallized, and then the formed crystalline semiconductor film is patterned to form the semiconductor layer 302, the semiconductor layer 303, and the semiconductor layer 304. In this embodiment mode, a semiconductor layer is formed of silicon, and a crystalline silicon film having a serially grown crystal grain is formed by irradiating an amorphous silicon film with laser light.

A crystallization method of a semiconductor layer in this embodiment mode is described with reference to FIGS. 29A and 29B. FIG. 29A is a perspective view of a substrate provided with a semiconductor layer in this embodiment mode, and FIG. 29B is an enlarged view of a region 808 which is a part of a crystalline semiconductor film in FIG. 29A. The semiconductor layer 304, the semiconductor layer 302, and the semiconductor layer 303 in FIG. 29B correspond to semiconductor layers of a thin film transistor in FIGS. 6A to 6D and 7A to 7D. FIGS. 6A to 6D and 7A to 7D are cross sectional views in lines A-B and C-D in FIGS. 29A and 29B.

The base film 301a and the base film 301b are formed over the substrate 300, and an amorphous semiconductor film 801 is formed over the base film. In FIG. 29A, the base film 301a and the base film 301b are referred to as a base film 301 collectively. The amorphous semiconductor film 801 is irradiated with laser light 802 to form a crystalline semiconductor film 803. In this embodiment mode, as shown in FIG. 29A, the amorphous semiconductor film 801 is irradiated with pulsed laser light at a repetition rate of 80 MHz as the laser light 802, thereby forming the crystalline semiconductor film 803 having a serially grown crystalline grain toward a scanning direction 804 shown in an arrow. A crystal grain of a single crystal which is long extended along a scanning direction is formed, thereby becoming it possible to form a semiconductor film having little crystal grain boundary at least which prevents a carrier of a thin film transistor from moving.

Figure 6:
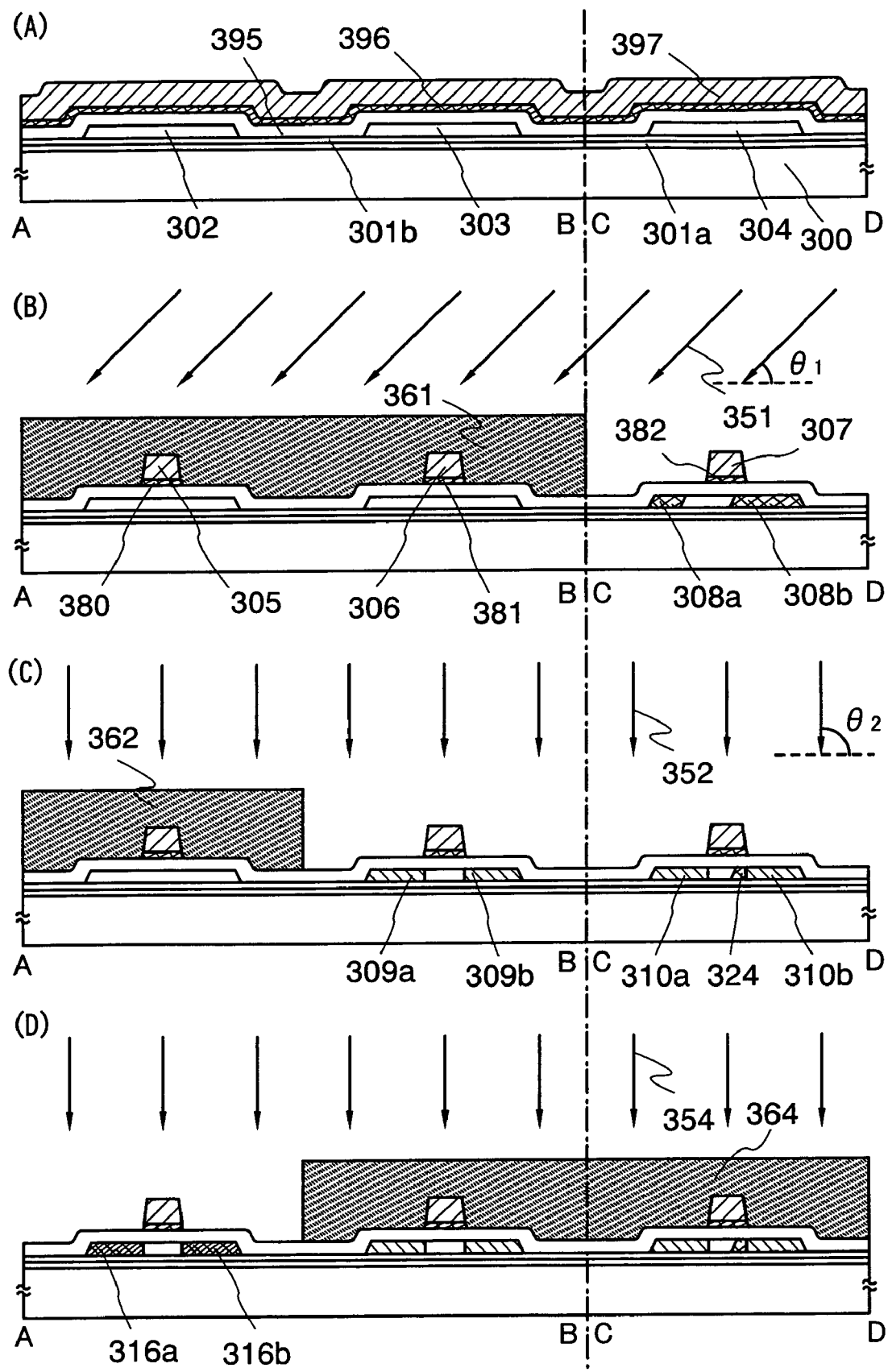
FIGS. 6A to 6D are diagrams for describing a manufacturing method of a semiconductor device of the invention.

Next, as shown in FIG. 6A, a mask is formed over the crystalline semiconductor film by a photolithography method and a part of the crystalline semiconductor film is etched using the mask, thereby forming the semiconductor layer 302, the semiconductor layer 303, and the semiconductor layer 304. Note that the etching is conducted to the semiconductor layer 302, the semiconductor layer 303, and the semiconductor layer 304 so that a channel formation region of a subsequently formed thin film transistor is formed parallel to the scanning direction 804 of the laser light 802.

As shown in FIG. 29B, a channel formation region 302a, and a channel formation region 303a, and a channel formation region 304a of the semiconductor layer 302, the semiconductor layer 303, and the semiconductor layer 304 are respectively parallel to the scanning direction 804 of the laser light. The semiconductor layer 302 functions as an active region of a subsequently formed p-channel thin film transistor 330; the semiconductor layer 303 functions as an active region a subsequently formed n-channel thin film transistor 331; and the semiconductor layer 304 functions as an active region of a subsequently formed n-channel thin film transistor 332 having a lightly doped p-type impurity region.

A gate insulating layer 395, a first conductive film 396, and a second conductive film 397 are formed over the semiconductor layer 302, the semiconductor layer 303, and the semiconductor layer 304 (FIG. 6A). In this embodiment mode, a thin silicon oxide film of from 2 to 5 nm thick is formed as a first insulating film over the semiconductor layer 302, the semiconductor layer 303, and the semiconductor layer 304 by a GRTA (gas rapid thermal anneal) method. A silicon nitride film, a silicon oxide film, and a silicon nitride film are stacked over the first insulating film and used as the gate insulating layer 395. The first conductive film 396 is formed of TaN and the second conductive film 397 is formed of W, by a sputtering method.

The first conductive film 396 and the second conductive film 397 are etched to be a thin line as shown in FIGS. 3A to 3F, thereby forming a first gate electrode layer 305, a first gate electrode layer 306, a first gate electrode layer 307, a second gate electrode layer 380, a second gate electrode layer 381, and a second gate electrode layer 382, then, a gate electrode layer is formed to have a lamination structure.

A mask 361 is formed of a resist so as to cover the semiconductor layer 302 and the semiconductor layer 303. The semiconductor layer 304 is doped with an impurity element 351 for imparting a p-type at the incident angle $\theta_1$ of from 30° to 90° or from 90°π to 150 to the surface thereof using the first gate electrode layer 307 and the gate electrode layer 382 as a mask, thereby forming a first p-type impurity region 308a and a first p-type impurity region 308b (FIG. 6B). In this embodiment mode, the incident angle $\theta_1$ is set at the range of from 30° to 90°. The semiconductor layer is doped diagonally with the impurity element 351 for imparting a p-type. Therefore, the first p-type impurity region 308b is also formed in a portion to be covered with the first gate electrode layer 307 in the semiconductor layer 304. However, the impurity element 351 for imparting a p-type is blocked by the first gate electrode layer 307 which functions as a mask; therefore, the first p-type impurity region 308a is not formed in a region under the first gate electrode layer 307 in the semiconductor layer 304. The doping is conducted so that the first p-type impurity region 308a and the first p-type impurity region 308b contain the impurity elements for imparting a p-type in a concentration of approximately from $5\times10^{17}$ to $5\times10^{18}/cm^3$. In addition, the concentration thereof may be set at approximately from $5\times10^{16}$ to $1\times10^{17}/cm^3$. In this embodiment mode, boron (B) is used as the impurity element for imparting a p-type.

Next, the mask 361 is removed and a mask 362 is formed of a resist to cover the semiconductor layer 302. The mask 362 may be newly formed or may be formed by processing the mask 361. The semiconductor layer 303 and the semiconductor layer 304 are doped with an impurity element for imparting an n-type using the first gate electrode layer 306 and the first gate electrode layer 307 as masks in a near-perpendicular incident angle $\theta_2$ to the surfaces thereof, thereby forming a first n-type impurity region 309a, a first n-type impurity region 309b, a first n-type impurity region 310a, and a first n-type impurity region 310b (FIG. 6C). The first p-type impurity region 308a and the first p-type impurity region 308b have been doped with the impurity element for imparting a p-type; therefore, they are required to be doped with an impurity element for imparting an n-type in order to be changed into an n-type impurity region. The first n-type impurity region 309a, the first n-type impurity region 309b, the first n-type impurity region 310a, and the first n-type impurity region 310b are formed to include the impurity elements for imparting an n-type typically in a concentration of from $1\times10^{17}$ to $5\times10^{18}/cm^3$. In this embodiment mode, phosphorous (P) is used as the impurity elements for imparting an n-type. The impurity element 352 for imparting an n-type is blocked by the first gate electrode layer 306 and the first gate electrode layer 307, since the impurity element 352 is added nearly perpendicularly. Consequently, regions to be covered with the first gate electrode layer 306 and the first gate electrode layer 307 in the semiconductor layer 303 and the semiconductor layer 304 are not doped with the impurity element 352 for imparting an n-type. Therefore, a part of the first p-type impurity region formed under the first gate electrode layer 307 in a semiconductor layer is left, and becomes a second p-type impurity region 324. The second p-type impurity region 324 is formed as a Lov region.

The mask 362 is removed by etching or the like, and a mask 364 is formed of a resist to cover the semiconductor layer 303 and the semiconductor layer 304. The semiconductor layer 302 is doped with an impurity element 354 for imparting a p-type in a near-perpendicular incident angle to the surface thereof using the mask 364, the first gate electrode layer 305, and the second gate electrode layer 380 as masks, thereby forming a third p-type impurity region 316a and a third p-type impurity region 316b (FIG. 6D). Here, the doping is conducted so that the third p-type impurity region 316a and the third p-type impurity region 316b include the impurity elements for imparting a p-type in a concentration of approximately from $1 \times 10^{20}$ to $5 \times 10^{21}/cm^3$. In this embodiment mode, boron (B) is used as the impurity element for imparting a p-type.

Figure 7:
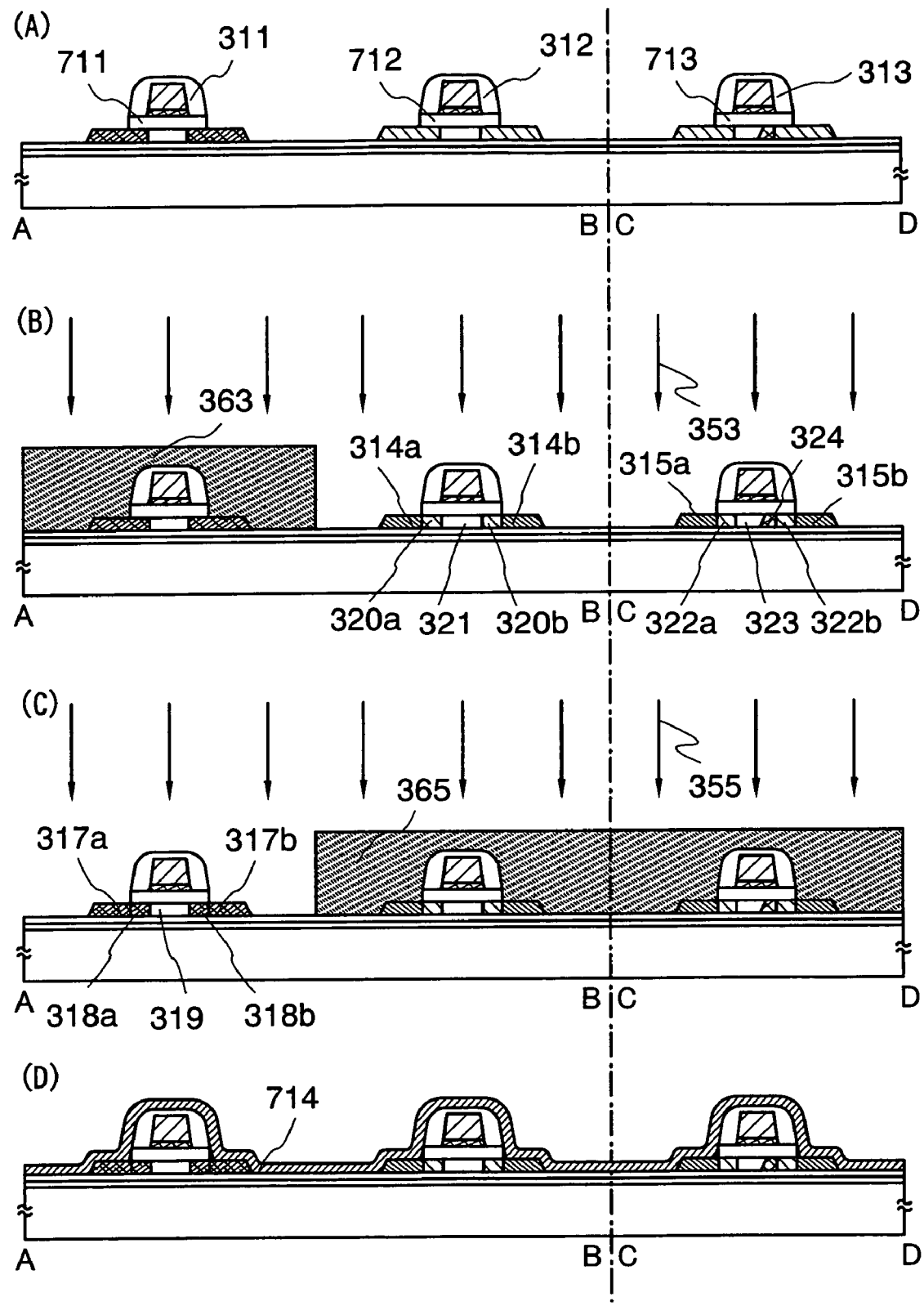
FIGS. 7A to 7D are diagrams for describing a manufacturing method of a semiconductor device of the present invention.

The mask 364 is removed by etching or the like. An insulating layer is formed over the gate insulating layer 395, the first gate electrode layer 305, the first gate electrode layer 306, the first gate electrode layer 307, the second gate electrode layer 380, the second gate electrode layer 381, and the first gate electrode layer 382. The insulating layer is etched by anisotropic etching, thereby forming a sidewall 311, a sidewall 312, a sidewall 313 on side surfaces of the first gate electrode layer 305, the second gate electrode layer 380, the first gate electrode layer 306, the second gate electrode layer 381, the first gate electrode layer 307, and the first gate electrode layer 382 (FIG. 7A). In this embodiment mode, silicon oxide is used as an insulating layer for forming sidewalls. When the sidewall 311, the sidewall 312, and the sidewall 313 are formed, etching is conducted using the semiconductor layer 302, the semiconductor layer 303, and the semiconductor layer 304 as etching stoppers, thereby exposing the semiconductor layer 302, the semiconductor layer 303, and the semiconductor layer 304, thus, an insulating layer 711, an insulating layer 712, and an insulating layer 713 are formed. The sidewall prevents the gate electrode layer and the silicide contained in the source region and the drain region in the semiconductor layer from being short-circuited.

In this embodiment mode, when etching the insulating layer, the sidewall 311, the sidewall 312, and the sidewall 313 are formed so that the insulating layer is left over the first gate electrode layer 305, the first gate electrode layer 306, the first gate electrode layer 307. Additionally, the insulating layer is etched until the first gate electrode layer 305, the first gate electrode layer 306, the first gate electrode layer 307 are exposed, and the sidewalls are formed, then, a protective film may be formed over the first gate electrode layer 305, the first gate electrode layer 306, the first gate electrode layer 307. Protecting the first gate electrode layer 305, the first gate electrode layer 306, the first gate electrode layer 307 prevents the first gate electrode layer 305, the first gate electrode layer 306, the first gate electrode layer 307 from being reduced when etching is conducted.

A mask 363 is formed of a resist to cover the semiconductor layer 302. The semiconductor layer 303 and the semiconductor layer 304 are doped with an impurity element 353 for imparting an n-type in a near-perpendicular incident angle to the surfaces thereof using the sidewall 312, the sidewall 313, the first gate electrode layer 306, and the first gate electrode layer 307 as masks, thereby forming a second n-type impurity region 314a, a second n-type impurity region 314b, a second n-type impurity region 315a, and a second n-type impurity region 315b (FIG. 7B). The semiconductor layers which are covered with the sidewalls are not doped with the impurity element 353 for imparting an n-type; therefore, they become a third n-type impurity region 320a, a third n-type impurity region 320b, a third n-type impurity region 322a, a third n-type impurity region 322b. Note that a channel formation region 321 and a channel formation region 323 are formed in the semiconductor layer 303, the semiconductor layer 304, and the semiconductor layer 370. The second n-type impurity region 314a, the second n-type impurity region 314b, the second n-type impurity region 315a, and the second n-type impurity region 315b are highly doped impurity regions; therefore, they function as a source region or a drain region. The second n-type impurity region 314a, the second n-type impurity region 314b, the second n-type impurity region 315a, and the second n-type impurity region 315b are formed to include the impurity elements for imparting an n-type in a concentration of approximately from $5 \times 10^{19}$ to $5 \times 10^{20}/cm^3$. In this embodiment mode, phosphorous (P) is used as the impurity element for imparting an n-type.

On the other hand, the third n-type impurity region 320a, the third n-type impurity region 320b, the third n-type impurity region 322a, and the third n-type impurity region 322b which are lightly doped impurity regions are Loff regions which are not covered with the gate electrode layer. Therefore, an electric field located adjacent to a drain can be relieved and deterioration of off-state current due to hot carrier injection can be controlled. Hereby, a semiconductor device capable of high speed operation with high reliability and low power consumption can be formed.

A mask 365 is formed of a resist to cover the semiconductor layer 303 and the semiconductor layer 304. The mask 365 may be formed using the mask 364 without removing the mask 364, may be formed by processing the mask 364, or may be formed newly, of course. The semiconductor layer 302 is doped with an impurity element 355 for imparting a p-type to have a perpendicular incident angle to the surface thereof using the mask 365 and the first gate electrode layer 305 as a mask, thereby forming a fourth p-type impurity region 317a, a fourth p-type impurity region 317b, a fifth p-type impurity region 318a, and a fifth p-type impurity region 318b (FIG. 7C). Here, the doping is conducted so that the fourth p-type impurity region 317a and the fourth p-type impurity region 317b include the impurity elements for imparting a p-type in a concentration of approximately from $1 \times 10^{20}$ to $5 \times 10^{21}/cm^3$. And the doping is conducted so that the fifth p-type impurity region 318a and the fifth p-type impurity region 318b include the impurity elements for imparting a p-type in a concentration of approximately from $5 \times 10^{18}$ to $5 \times 10^{19}/cm^3$. In this embodiment mode, boron (B) is used as the impurity element for imparting a p-type. Note that a channel formation region 319 is formed in the semiconductor layer 302.

The fourth p-type impurity region 317a and the fourth p-type impurity region 317b are highly doped impurity regions; therefore, they function as a source region or a drain region. On the other hand, the fifth p-type impurity region 318a and the fifth p-type impurity region 318b which are lightly doped impurity regions are Loff regions which are not covered with the gate electrode layer. Since the fifth p-type impurity region 318a and the fifth p-type impurity region 318b are not covered with the gate electrode layer, an electric field located adjacent to a drain can be relieved and deterioration due to hot carrier injection can be prevented, and additionally, off-state current can be reduced. Hereby, a semiconductor device with high reliability and low power consumption can be formed.

A conductive film 714 is formed over the semiconductor layer 302, the semiconductor layer 303, the semiconductor layer 304, the sidewall 311, the sidewall 312, and the sidewall 313 (FIG. 7D). As the material for the conductive film 714, titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like are used. Here, a titanium film is formed by a sputtering method.

Next, a silicide 715a, a silicide 715b, a silicide 716a, a silicide 716b, a silicide 717a, and a silicide 717b are formed by the reaction of silicon of exposed source and drain regions, and the conductive film 714 by heat treatment, a GRTA method, an LRTA method, or the like. Thereafter, a part of the conductive film 714 which does not react with the semiconductor layer is removed (FIG. 8A).

An insulating film 325 for hydrogenation is appropriately formed by heat treatment, laser irradiation, or the like for activating an impurity element. Hydrogenation is conducted by heat treatment to form an insulating layer 326. The heat treatment for activating an impurity element may be conducted in conjunction with the heat treatment for hydrogenation; therefore, steps can be simplified.

In this embodiment mode, the insulating layer 326 to be one interlayer insulating film is formed by a spin-coating method. An opening (a contact hole) reaching the silicide 715a, the silicide 715b, the silicide 716a, the silicide 716b, the silicide 717a, and the silicide 717b which are formed in a source region and a drain region is formed in the insulating layer 326, the insulating film 325, and the gate insulating layer 395. A source or drain electrode layer 328a, a source or drain electrode layer 328b, a source or drain electrode layer 329a, a source or drain electrode layer 329b, a source or drain electrode layer 327a, and a source or drain electrode layer 327b which are in contact with a source region or a drain region are formed in the opening (FIG. 8B). Then, a p-channel thin film transistor 330, an n-channel thin film transistor 331, and an n-channel thin film transistor 332 having a p-type impurity region are formed and a semiconductor device using them is formed. In this embodiment mode, a processor in which a CMOS circuit and a thin film transistor whose properties are controlled are provided over one substrate can be manufactured.

The p-channel thin film transistor 330, the n-channel thin film transistor 331, and the n-channel thin film transistor 332 having the p-type impurity region have a silicide structure, thereby enabling the resistance of the source region and the drain region to be lower and the semiconductor device to speed up. Additionally, the operation at the lower voltage is possible, therefore, power consumption can be reduced.

According to the present invention, a semiconductor layer is provided with an impurity region having an impurity element for imparting a different conductive type; therefore, properties of a thin film transistor can be minutely controlled. This enables a thin film transistor having required functions to be formed by brief steps and a semiconductor device with high reliability and better electrical characteristics to be manufactured at a low cost. That is, a functional circuit or the like which emphasizes a high speed operation, such as a processor, a DRAM, an image processing circuit, or a speech processing circuit and a driver circuit or the like which emphasizes high pressure resistance, such as a buffer circuit, a shift register circuit, a level shifter circuit, and a sampling circuit can be formed over the same substrate. Thus, a semiconductor device such as a system LSI, having an element of various functions and structures can be manufactured over the same substrate. In this embodiment mode, a thin film transistor is an n-channel thin film transistor having a lightly doped p-type impurity region; therefore, a semiconductor device capable of high speed operation and reducing power consumption can be formed.

This embodiment mode can be implemented in combination with each of Embodiment Modes 1 to 3.

Embodiment Mode 5

An embodiment mode of the present invention is described with reference to FIGS. 9A to 9C, 10A to 10C, 11A to 11C, and 12. This embodiment mode describes an example where an n-channel thin film transistor having two kinds of lightly doped p-type impurity regions is formed in the semiconductor device manufactured in Embodiment Mode 3. Then, repeated descriptions of the same portion and the portion having the same function are omitted.

As in Embodiment Mode 3, a base film 301a and a base film 301b are stacked as a base film over a substrate 300 and a semiconductor layer 302, a semiconductor layer 303, a semiconductor layer 304, and a semiconductor layer 370 are formed. An amorphous semiconductor film is irradiated with laser light to be crystallized, and then a formed crystalline semiconductor film is patterned to form the semiconductor layer 302, the semiconductor layer 303, the semiconductor layer 304, and the semiconductor layer 370. In this embodiment mode, a semiconductor layer is formed of silicon, and a crystalline silicon film having a serially grown crystal grain is formed by irradiating an amorphous silicon film with laser light. Note that the semiconductor layer 302, the semiconductor layer 303, the semiconductor layer 304, and the semiconductor layer 370 are formed so that a channel formation region of a subsequently formed thin film transistor is formed parallel to the scanning direction of the laser light.

Figure 9:
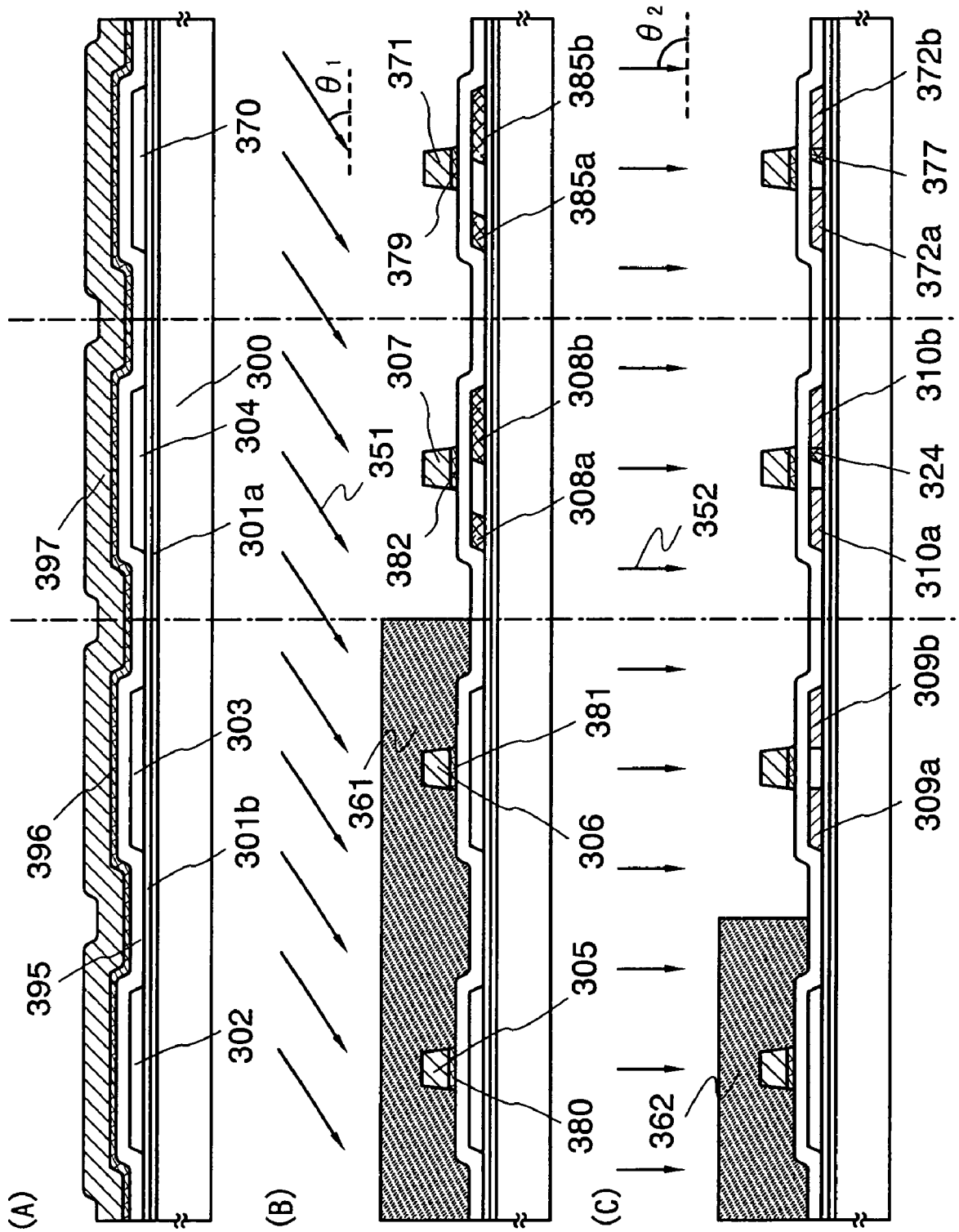
FIGS. 9A to 9C are diagrams for describing a manufacturing method of a semiconductor device of the present invention.

A gate insulating layer 395 is formed over the semiconductor layer 302, the semiconductor layer 303, the semiconductor layer 304, and the semiconductor layer 370 to form a first conductive film 396 and a second conductive film 397 (FIG. 9A). In this embodiment mode, a thin silicon oxide film of from 2 to 5 nm thick is formed as a first insulating film over the semiconductor layer 302, the semiconductor layer 303, the semiconductor layer 304, and the semiconductor layer 370 by a GRTA (gas rapid thermal anneal) method. A silicon nitride film, a silicon oxide film, and a silicon nitride film are stacked over the first insulating film to be used as the gate insulating layer 395. The first conductive film 396 is formed of TaN and the second conductive film 397 is formed of W, by a sputtering method.

The first conductive film 396 and the second conductive film 397 are etched to be a thin line as shown in FIGS. 3A to 3F, thereby forming a first gate electrode layer 305, a first gate electrode layer 306, a first gate electrode layer 307, a first gate electrode layer 371, a second gate electrode layer 380, a second gate electrode layer 381, a second gate electrode layer 382, and a second gate electrode layer 379. A mask 361 is formed of a resist so as to cover the semiconductor device 302 and the semiconductor layer 303.

The semiconductor layer 304 and the semiconductor layer 370 are doped with an impurity element 351 for imparting a p-type at the incident angle $\theta_1$ of from 30° to 90° or from 90° to 150° to the surfaces thereof using the first gate electrode layer 307, the second gate electrode layer 382, the first gate electrode layer 371, and the second gate electrode layer 379 as masks, thereby forming a first p-type impurity region 308a, a first p-type impurity region 308b, a first p-type impurity region 385a, and a first p-type impurity region 385b (FIG. 9B). In this embodiment mode, the incident angle $\theta_1$ is set at the range of from 30° to 90°. The semiconductor layers are doped diagonally with the impurity element 351 for imparting a p-type. Therefore, the first p-type impurity region 308b and the first p-type impurity region 385b are also formed in portions to be covered with the first gate electrode layer 307 and the first gate electrode layer 371 in the semiconductor layer 304 and the semiconductor layer 370. However, the impurity element 351 for imparting a p-type is blocked by the first gate electrode layer 307 and the first gate electrode layer 371 which function as masks; therefore, the first p-type impurity region 308a and the first p-type impurity region 385a are not formed in the regions under the first gate electrode layer 307 and the first gate electrode layer 371 in the semiconductor layer 304 and semiconductor layer 370. The doping is conducted so that the first p-type impurity region 308a, the first p-type impurity region 308b, the first p-type impurity region 385a, and the first p-type impurity region 385b include the impurity elements for imparting a p-type in a concentration of approximately from $5\times10^{17}$ to $5\times10^{18}/cm^3$. In addition, the concentration thereof may be set at approximately from $5\times10^{16}$ to $1\times10^{17}/cm^3$. In this embodiment mode, boron (B) is used as the impurity element for imparting a p-type.

In this embodiment mode, a region where the first p-type impurity region 308b is formed in a subsequently formed thin film transistor having the semiconductor layer 304 is a drain region; and a region where the first p-type impurity region 385b is formed in a subsequently formed thin film transistor having the semiconductor layer 370 is a source region. When channel formation regions of the semiconductor layers are arranged parallel to the scanning direction of the laser light and the semiconductor layers are doped with an impurity element diagonally from one direction using the gate electrode layer as a mask, an impurity region having one conductivity different from the conductivity of the thin film transistor can be formed in only one of the source region and the drain region. According to the present invention, a thin film transistor including a source region with an impurity region having a conductive type different from that of the thin film transistor and a thin film transistor including a drain region with an impurity region having a conductive type different from the thin film transistor can be formed by the same step. Either one of the impurity regions can be designed to be a source region or a drain region freely by a wiring to be connected or the like and the present invention can be adapted to such a circuit adequately. Thus, it becomes possible to control properties of a thin film transistor more minutely and to manufacture varied thin film transistors. Therefore, a high-accuracy semiconductor device which needs a plurality of circuits having different functions can be manufactured with high reliability.

Next, the mask 361 is removed and a mask 362 is formed of a resist which covers the semiconductor layer 302. The mask 362 may be newly formed or may be formed by processing the mask 361. The semiconductor layer 303, the semiconductor layer 304, and the semiconductor layer 370 are doped with an impurity element for imparting an n-type using the first gate electrode layer 306, the first gate electrode layer 307, and the first gate electrode layer 371 as masks in a near-perpendicular incident angle $\theta_2$ to the surfaces thereof, thereby forming a first n-type impurity region 309a, a first n-type impurity region 309b, a first n-type impurity region 310a, a first n-type impurity region 310b, a first n-type impurity region 372a, and a first n-type impurity region 372b (FIG. 9C). The first p-type impurity region 308a, the first p-type impurity region 308b, the first p-type impurity region 385a, and the first p-type impurity region 385b have been doped with the impurity element for imparting a p-type; therefore, they are required to be doped with an impurity element for imparting an n-type in order to be changed into n-type impurity regions. The first n-type impurity region 309a, the first n-type impurity region 309b, the first n-type impurity region 310a, the first n-type impurity region 310b, the first n-type impurity region 372a, and the first n-type impurity region 372b are formed to include the impurity elements for imparting an n-type typically in a concentration of from $1\times10^{17}$ to $5\times10^{18}/cm^3$. In this embodiment mode, phosphorous (P) is used as the impurity elements for imparting an n-type. The impurity element 352 is blocked by the first gate electrode layer 306, the first gate electrode layer 307, and the first gate electrode layer 371 since the impurity element 352 for imparting an n-type is added perpendicularly. Consequently, regions to be covered with the first gate electrode layer 306, the first gate electrode layer 307, and the first gate electrode layer 371 in the semiconductor layer 303, the semiconductor layer 304, and the semiconductor layer 370 are not doped with the impurity element 352 for imparting an n-type. Therefore, a part of the first p-type impurity region formed in a region under the first gate electrode layer 307 and the first gate electrode layer 371 in semiconductor layers is left, and becomes a second p-type impurity region 324 and a second p-type impurity region 377. The second p-type impurity region 324 is formed on a drain side as an Lov region and the second p-type impurity region 377 is formed on a source region as an Lov region.

Figure 10:
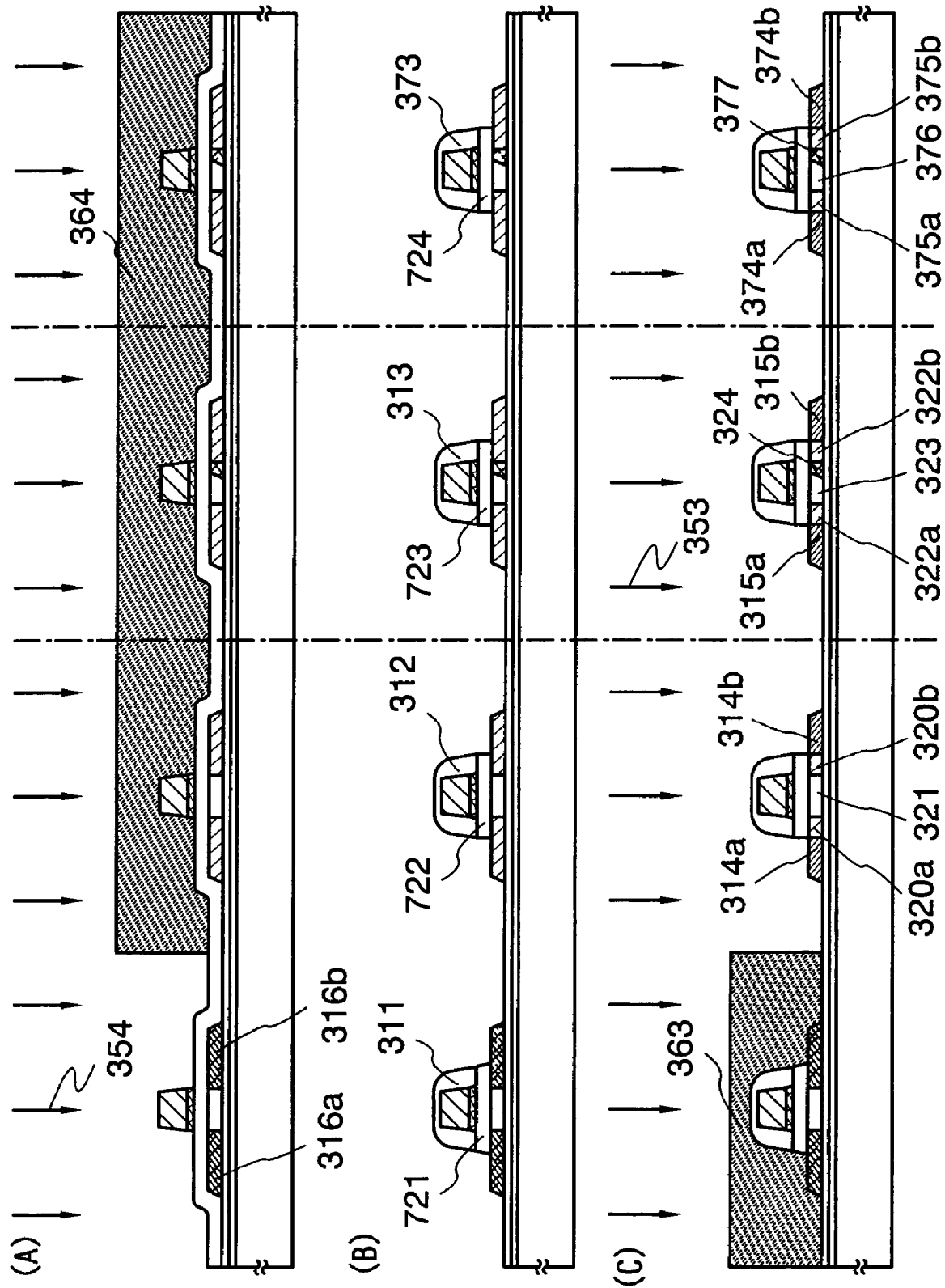
FIGS. 10A to 10C are diagrams for describing a manufacturing method of a semiconductor device of the present invention.

The mask 362 is removed by etching or the like. A mask 364 is formed of a resist to cover the semiconductor layer 303, the semiconductor layer 304, and the semiconductor layer 370. The semiconductor layer 302 is doped with an impurity element 354 for imparting a p-type to have a near-perpendicular incident angle to the surface of thereof using the mask 364 and the first gate electrode layer 305 as a mask to form a third p-type impurity region 316a and a third p-type impurity region 316b (FIG. 10A). Here, the doping is conducted so that the third p-type impurity region 316a and the third p-type impurity region 316b include the impurity elements for imparting a p-type in a concentration of approximately from $1\times10^{20}$ to $5\times10^{21}/cm^3$. In this embodiment mode, boron (B) is used as the impurity element for imparting a p-type.

The mask 364 is removed by etching or the like. An insulating layer is formed over the gate insulating layer 395, the first gate electrode layer 305, the first gate electrode layer 306, the first gate electrode layer 307, the first gate electrode layer 371, the second gate electrode layer 380, the second gate electrode layer 381, the second gate electrode layer 382, and the second gate electrode layer 379. The insulating layer is etched by anisotropic etching, thereby forming a sidewall 311, a sidewall 312, a sidewall 313, and a sidewall 373 on side surfaces of the first gate electrode layer 305, the second gate electrode layer 380, the first gate electrode layer 306, the second gate electrode layer 381, the first gate electrode layer 307, the first gate electrode layer 382, the first gate electrode layer 371, and the second gate electrode layer 379 (FIG. 10B). The sidewalls prevent the gate electrode layers and the suicides contained in the source region and the drain region in the semiconductor layer from being short-circuited. In this embodiment mode, silicon oxide is used as an insulating layer for forming a sidewall. When the sidewall 311, the sidewall 312, the sidewall 313, and the sidewall 373 are formed, etching is conducted using the semiconductor layer 302, the semiconductor layer 303, the semiconductor layer 304, and the semiconductor layer 370 as etching stoppers, thereby exposing the semiconductor layer 302, the semiconductor layer 303, the semiconductor layer 304, and the semiconductor layer 370, thus, an insulating layer 721, an insulating layer 722, an insulating layer 723, and an insulating layer 724 are formed.

In this embodiment mode, when etching the insulating layer, the sidewall 311, the sidewall 312, the sidewall 313, and the sidewall 373 are formed so that the insulating layer is left over the first gate electrode layer 305, the first gate electrode layer 306, the first gate electrode layer 307, and the first gate electrode layer 371. Additionally, the insulating layer is etched until the first gate electrode layer 305, the first gate electrode layer 306, the first gate electrode layer 307, and the first gate electrode layer 371 are exposed, and the sidewalls are formed, then, a protective film may be formed over the first gate electrode layer 305, the first gate electrode layer 306, the first gate electrode layer 307, and the firsts gate electrode layer 371. Protecting the first gate electrode layer 305, the first gate electrode layer 306, the first gate electrode layer 307, and the first gate electrode layer 371 prevents the first gate electrode layer 305, the first gate electrode layer 306, the first gate electrode layer 307, and the first gate electrode layer 371 from being reduced when etching is conducted.

A mask 363 is formed of a resist to cover the semiconductor layer 302. The semiconductor layer 303, the semiconductor layer 304, the semiconductor layer 370 are doped with an impurity element 353 for imparting an n-type at a near-perpendicular incident angle to the surfaces thereof using the sidewall 312, the sidewall 313, the sidewall 373, the first gate electrode layer 306, the first gate electrode layer 307, the first gate electrode layer 371 as masks, thereby forming a second n-type impurity region 314a, a second n-type impurity region 314b, a second n-type impurity region 315a, a second n-type impurity region 315b, a second n-type impurity region 374a, and a second n-type impurity region 374b (FIG. 10C). The semiconductor layers which are covered with the sidewalls are not doped with the impurity element 353 for imparting an n-type; therefore, they become lightly doped n-type impurity regions, that is, a third n-type impurity region 320a, a third n-type impurity region 320b, a third n-type impurity region 322a, a third n-type impurity region 322b, and a third n-type impurity region 375a, and a third n-type impurity region 375b. Note that a channel formation region 321, a channel formation region 323, a channel formation region 376 are formed in the semiconductor layer 303, the semiconductor layer 304, and the semiconductor layer 370. The second n-type impurity region 314a, the second n-type impurity region 314b, the second n-type impurity region 315a, the second n-type impurity region 315b, the second n-type impurity region 374a, and the second n-type impurity region 374b are highly doped impurity regions; therefore, they function as a source region or a drain region. In this embodiment mode, the third n-type impurity region 322b in which the second p-type impurity region 324 is formed is a drain region, and the third n-type impurity region 374b in which the second p-type impurity region 377 is formed is a source region. Therefore, the second n-type impurity region 315a functions as a source region and the second n-type impurity region 374a functions as a drain region. The second n-type impurity region 314a, the second n-type impurity region 314b, the second n-type impurity region 315a, and the second n-type impurity region 315b are formed to include the impurity elements for imparting an n-type in a concentration of approximately from $5\times10^{19}$ to $5\times10^{20}$/cm$^3$. In this embodiment mode, phosphorous (P) is used as the impurity element for imparting an n-type.

On the other hand, the third n-type impurity region 320a, the third n-type impurity region 320b, the third n-type impurity region 322a, and the third n-type impurity region 322b the third n-type impurity region 375a, the third n-type impurity region 375b which are lightly doped impurity regions are Loff regions which are not covered with the first gate electrode layer and the second electrode layer. Therefore, an electric field located adjacent to a drain can be relieved and deterioration due to hot carrier injection can be controlled and off-state current can be reduced. Hereby, a semiconductor device capable of high speed operation with high reliability and low power consumption can be formed.

Figure 11:
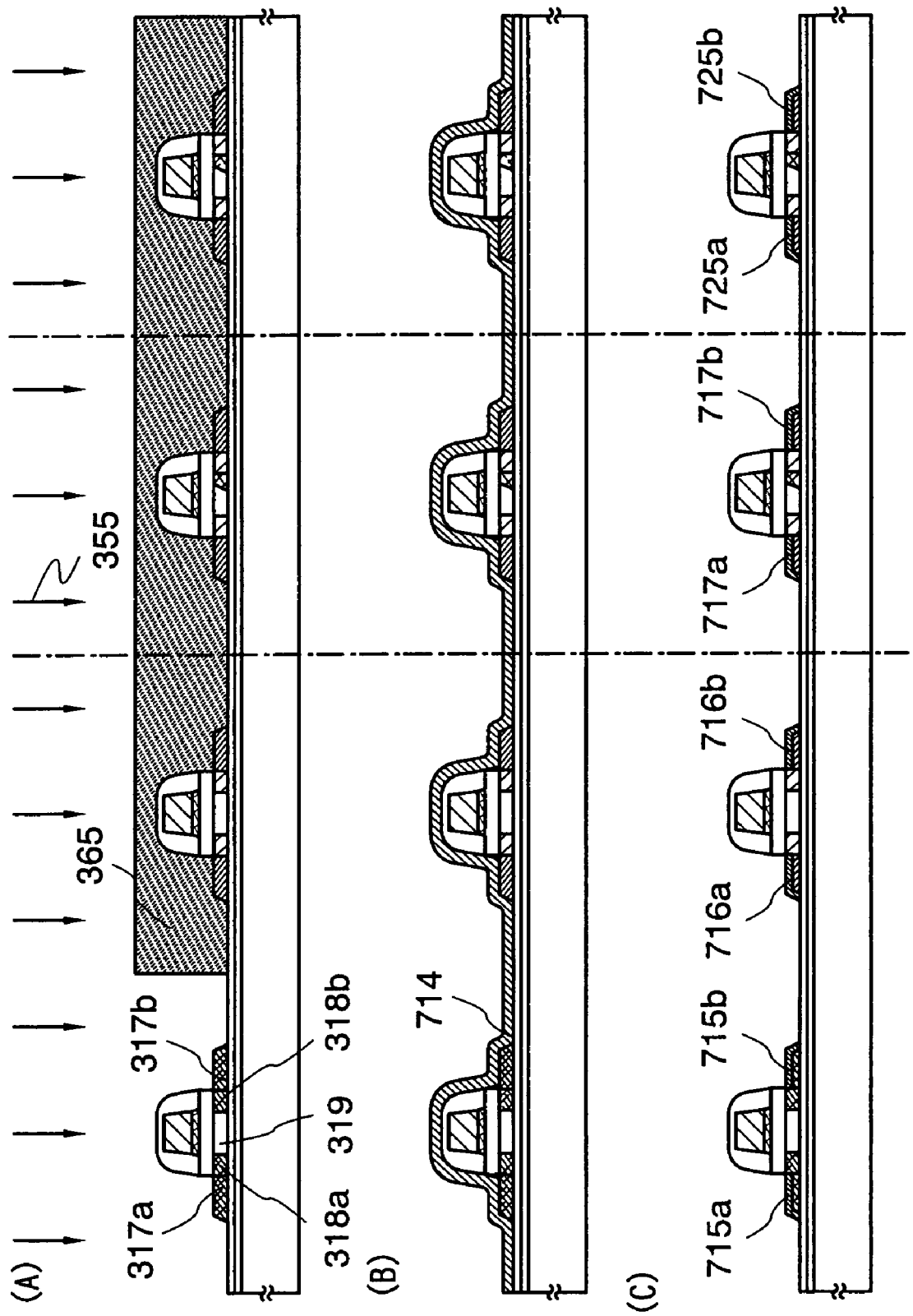
FIGS. 11A to 11C are diagrams for describing a manufacturing method of a semiconductor device of the present invention.

A mask 365 is formed of a resist to cover the semiconductor layer 303, the semiconductor layer 304, and the semiconductor layer 370. The mask 365 may be formed using the mask 364 without removing the mask 364, may be formed by processing the mask 364, or may be formed newly, of course. The semiconductor layer 302 is doped with an impurity element 355 for imparting a p-type to have a perpendicular incident angle to the surface thereof using the mask 365 and the first gate electrode layer 305 as a mask, thereby forming a fourth p-type impurity region 317a, a fourth p-type impurity region 317b, a fifth p-type impurity region 318a, and a fifth p-type impurity region 318b (FIG. 11A). Here, the doping is conducted so that the fourth p-type impurity region 317a and the fourth p-type impurity region 317b include the impurity elements for imparting a p-type in a concentration of approximately from $1\times10^{20}$ to $5\times10^{21}$/cm$^3$. And the doping is conducted so that the fifth p-type impurity region 318a and the fifth p-type impurity region 318b include the impurity elements for imparting a p-type in a concentration of approximately from $5\times10^{18}$ to $5\times10^{19}$/cm$^3$. In this embodiment mode, boron (B) is used as the impurity element for imparting a p-type. Note that a channel formation region 319 is formed in the semiconductor layer 302.

The fourth p-type impurity region 317a and the fourth p-type impurity region 317b are highly doped impurity regions; therefore, they function as a source region or a drain region. On the other hand, the fifth p-type impurity region 318a and the fifth p-type impurity region 318b which are lightly doped impurity regions are Loff regions which are not covered with the gate electrode layer. Therefore, an electric field located adjacent to a drain can be relieved and deterioration due to hot carrier injection can be prevented, and additionally, off-state current can be reduced. Hereby, a semiconductor device with high reliability and low power consumption can be formed.

A conductive film 714 is formed over the semiconductor layer 302, the semiconductor layer 303, the semiconductor layer 304, the semiconductor layer 370, the side wall 311, the sidewall 312, the sidewall 313, and the sidewall 373 (FIG. 11B). As the material for the conductive film 714, titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like are used. Here, a titanium film is formed by a sputtering method.

Next, a silicide 715a, a silicide 715b, a silicide 716a, a silicide 716b, a silicide 717a, a silicide 717b, and a silicide 725a, and a silicide 725b are formed by the reaction of silicon of the semiconductor layer in the exposed source and drain regions, and the conductive film 714 by heat treatment, a GRTA method, an LRTA method, or the like. Thereafter, a part of the conductive film 714 that does not react with the semiconductor layer is removed (FIG. 11C).

An insulating film 325 for hydrogenation is appropriately formed by heat treatment, laser irradiation, or the like for activating an impurity element. Hydrogenation is conducted by heat treatment to form an insulating layer 326. The heat treatment for activating an impurity element may be conducted in conjunction with the heat treatment for hydrogenation; therefore, steps can be simplified.

Figure 12:
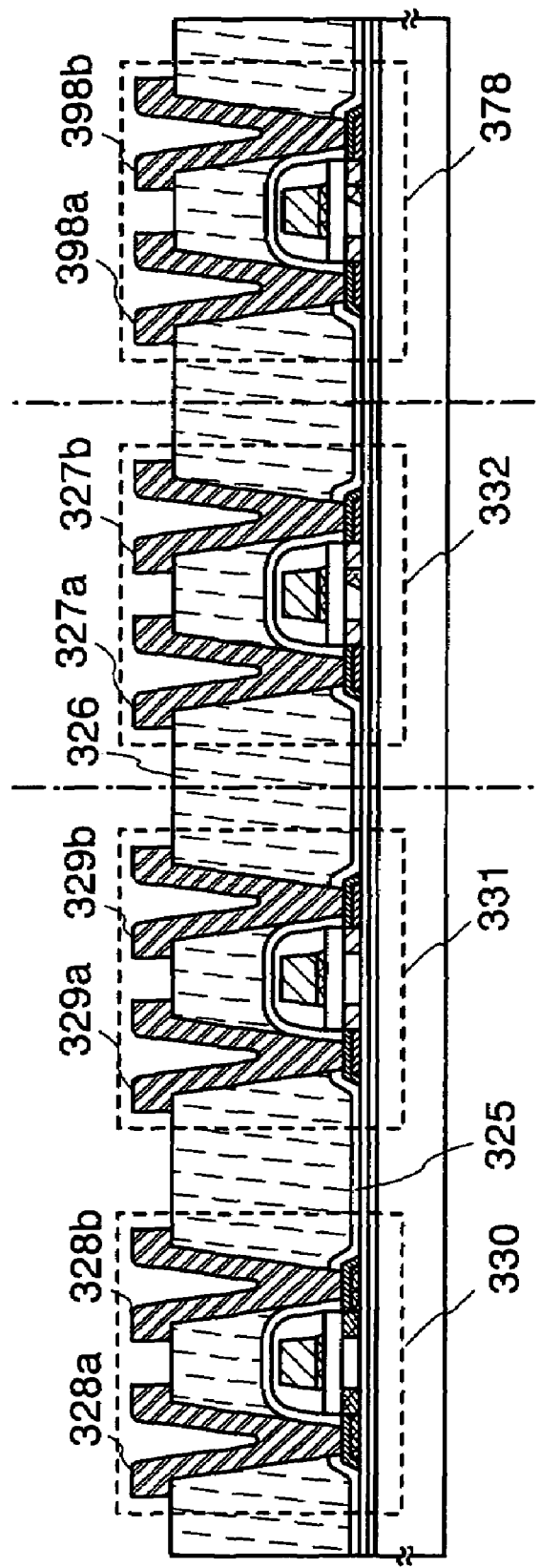
FIG. 12 is a diagram for describing a manufacturing method of a semiconductor device of the present invention.

An opening (a contact hole) reaching a source region and a drain region is formed in the insulating layer 326, the insulating film 325, and the gate insulating layer 395. A source or drain electrode layer 328a, a source or drain electrode layer 328b, a source or drain electrode layer 329a, a source or drain electrode layer 329b, a source or drain electrode layer 327a, a source or drain electrode layer 327b, a source or drain electrode layer 398a, and a source or drain electrode layer 398b which are in contact with a source region or a drain region are formed in the opening (FIG. 12). In this embodiment mode, the source or drain electrode layer 327a is a source electrode layer and the source or drain electrode layer 327b is a drain electrode layer. On the other hand, the source or drain electrode layer 398a is a drain electrode layer and the source or drain electrode layer 398b is a source electrode layer. Thus, a p-channel thin film transistor 330, an n-channel thin film transistor 331, an n-channel thin film transistor 332 having a lightly doped p-type impurity region on the drain side, and an n-channel thin film transistor 378 having a lightly doped-p-type impurity region on the source region side of this embodiment mode are manufactured and a semiconductor device using them is manufactured. In this embodiment mode, a processor providing a CMOS circuit and a thin film transistor whose properties are controlled for the same substrate is manufactured.

In this embodiment mode, the p-channel thin film transistor 330, the n-channel thin film transistor 331, the n-channel thin film transistor 332 having the p-type impurity region on the drain region side, and the n-channel thin film transistor 378 having a lightly doped p-type impurity region on the source region side have a silicide structure, thereby enabling the resistance of the source region and the drain region to be lower and the semiconductor device to speed up. Additionally, the operation at the lower voltage is possible, therefore, power consumption can be reduced.

According to the present invention, a semiconductor layer is provided with an impurity region having an impurity element for imparting a different conductivity type; therefore, properties of a thin film transistor can be minutely controlled. This enables a thin film transistor having required functions to be formed by brief steps and a semiconductor device with high reliability and better electrical characteristics to be manufactured at a low cost. That is, a functional circuit or the like which emphasizes a high speed operation, such as a processor, a DRAM, an image processing circuit, or a speech processing circuit and a driver circuit or the like which emphasizes high pressure resistance, such as a buffer circuit, a shift register circuit, a level shifter circuit, and a sampling circuit can be formed over the same substrate. Thus, a semiconductor device such as a system LSI, having an element of various functions and structures can be manufactured over the same substrate. In this embodiment mode, a thin film transistor is an n-channel thin film transistor having a lightly doped p-type impurity region; therefore, a semiconductor device capable of high speed operation and reducing power consumption can be formed.

This embodiment mode can be implemented in combination with each of Embodiment Modes 1 to 4.

Embodiment Mode 6

An embodiment mode of the present invention is described with reference to FIGS. 9A to 9C, 10A to 10C, 11A to 11C, and 32A to 32C. This embodiment mode describes an example where an n-channel thin film transistor having two kinds of lightly doped p-type impurity regions is formed in the semiconductor device manufactured in Embodiment Mode 4. Then, repeated descriptions of the same portion and the portion having the same function are omitted.

In Embodiment Mode 5, the thin film transistors each having the impurity region of the same structure are made different in a source region or a drain region, thereby manufacturing the n-channel thin film transistor having the two kinds of lightly doped p-type impurity regions which are different in the properties. In this embodiment mode, an incident angle in adding an impurity element is controlled and an impurity region is formed to have a different structure, thereby manufacturing an n-channel thin film transistor having two kinds of lightly doped p-type impurity regions which are different in the properties.

In Embodiment Mode 5, as shown in FIG. 9B, the semiconductor layers are doped with an impurity element for imparting a p-type at the incident angle $\theta_1$ of from 30° to 90°, when a first p-type impurity region 308a, a first p-type impurity region 308b, a first p-type impurity region 385a, and a first p-type impurity region 385b are formed. In this embodiment mode, a semiconductor layer 304 and a semiconductor layer 370 are doped with an impurity element for imparting a p-type in different incident angles by different steps.

Figure 32:
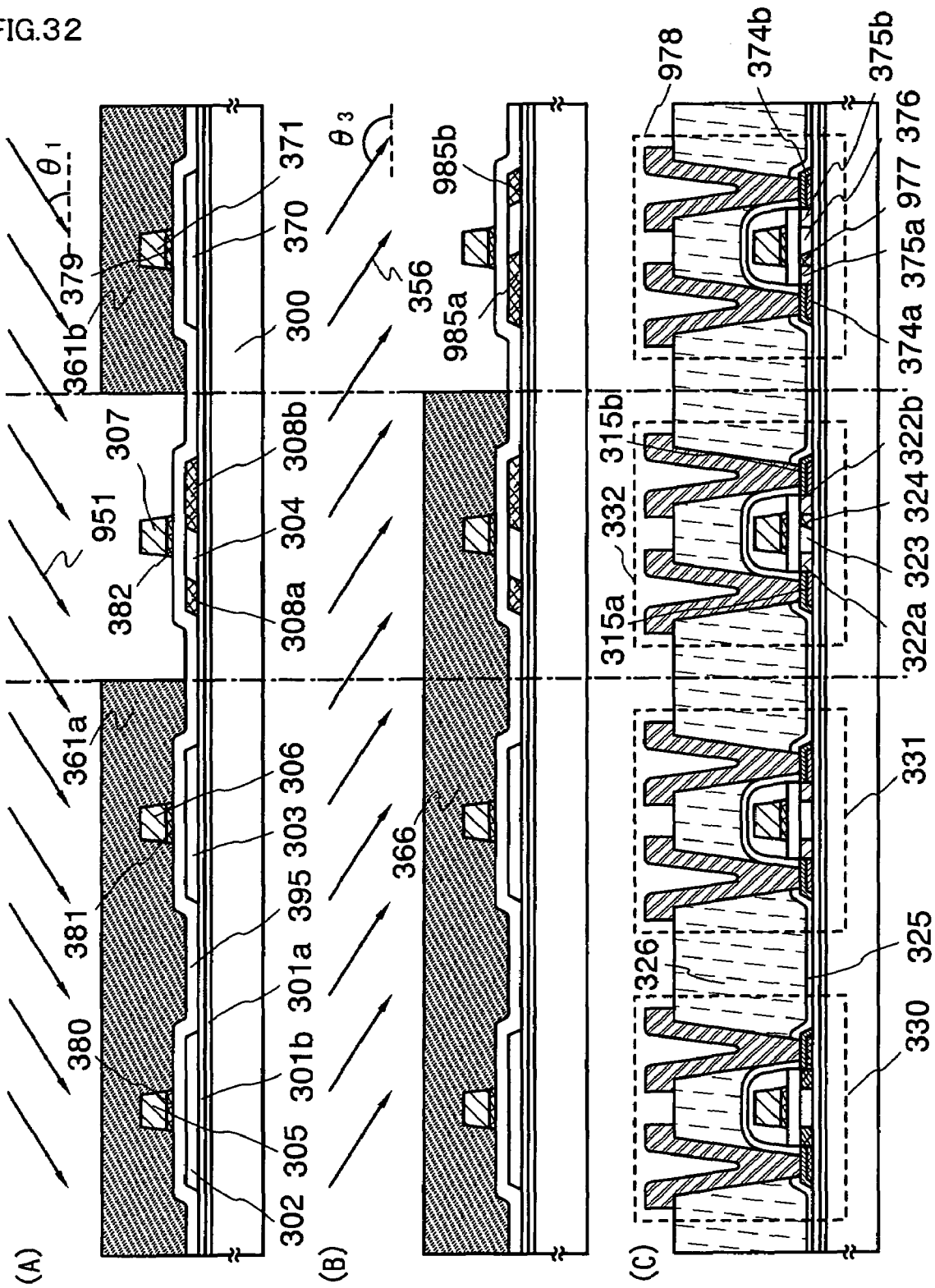
FIGS. 32A to 32C are diagrams for describing a manufacturing method of a semiconductor device of the present invention

First, a mask 361b is formed to cover the semiconductor layer 370. The semiconductor layer 304 is doped with an impurity element 951 for imparting a p-type at the incident angle $\theta_i$ to the surface thereof. The semiconductor layer 304 is doped with the impurity element 951 for imparting a p-type diagonally at the incident angle $\theta_1$ of from 30° to 90° to the surface thereof using the first gate electrode layer 307 and the second gate electrode layer 382 as a mask, thereby forming a first p-type impurity region 308a and a first p-type impurity region 308b (FIG. 32A). The semiconductor layer 304 is doped diagonally with the impurity element 951 for imparting a p-type. Therefore, the first p-type impurity region 308b is also formed in a portion to be covered with the first gate electrode layer 307 and the second gate electrode layer 382 in the semiconductor layer 304. On the other hand, the impurity element 951 for imparting a p-type is blocked by the first gate electrode layer 307 and the second gate electrode layer 382 which function as masks; therefore, the first p-type impurity region 308a is not formed in the region under the first gate electrode layer 307 in the semiconductor layer 304.

Next, the mask 361b to cover the semiconductor layer 370 is removed, and a mask 366 is formed to cover the semiconductor layer 302, the semiconductor layer 303, and the semiconductor layer 304. The semiconductor layer 370 is doped with an impurity element in an incident angle $\theta_3$ to the surface thereof. The semiconductor layer 370 is doped with the impurity element 356 for imparting a p-type diagonally at the incident angle $\theta_3$ of from 90° to 150° to the surface thereof using the first gate electrode layer 371 and the second gate electrode layer 379 as a mask, thereby forming a first p-type impurity region 985a and a first p-type impurity region 985b (FIG. 32B). The semiconductor layer is doped diagonally with the impurity element 356 for imparting a p-type. Therefore, the first p-type impurity region 985a is also formed in a portion to be covered with the first gate electrode layer 371 and the second gate electrode layer 379 in the semiconductor layer 370. However, the impurity element 356 for imparting a p-type is blocked by the first gate electrode layer 371 and the second gate electrode layer 379 which function as masks; therefore, the first p-type impurity region 985b is not formed in a region under the first gate electrode layer 371 in the semiconductor layer 370.

Here, the doping is conducted so that the first p-type impurity region 308a, the first p-type impurity region 308b, the first p-type impurity region 985a and the first p-type impurity region 985b include the impurity elements for imparting a p-type in a concentration of approximately from $5 \times 10^{17}$ to $5 \times 10^{18}/cm^3$. In addition, the concentration thereof may be set at approximately from $5 \times 10^{16}$ to $1 \times 10^{17}/cm^3$. In this embodiment mode, boron (B) is used as the impurity element for imparting a p-type.

Portions where the first p-type impurity regions are formed in the semiconductor layer 304 and the semiconductor layer 370 can be varied by changing the incident angle θ in adding the impurity element for imparting a p-type.

FIG. 32C shows a semiconductor device manufactured in this embodiment mode. In this embodiment mode, a p-channel thin film transistor 330, an n-channel thin film transistor 331, an n-channel thin film transistor 332 having a p-type impurity region, and an n-channel thin film transistor 978 having a p-type impurity region are formed and a semiconductor device using them is formed.

The thin film transistor 332 manufactured in this embodiment mode has a second p-type impurity region 324 which is a lightly doped p-type impurity region between a channel formation region 323 and a third n-type impurity region 322b. On the other hand, a thin film transistor 978 manufactured in this embodiment mode has a second p-type impurity region 977 which is a lightly doped p-type impurity region between a channel formation region 376 and a third n-type impurity region 375a.

When a channel formation region of a semiconductor layer is arranged parallel to a scanning direction of laser light and the semiconductor layer is doped with an impurity element diagonally from one direction at angles which are different in each step using a gate electrode layer as a mask, an impurity region having one conductivity different from that of the thin film transistor can be formed in only one of a source region and a drain region. According to the present invention, a thin film transistor providing a source region with the different one conductive impurity region and a thin film transistor providing a drain region with the different one conductive impurity region can be formed over the same substrate. Thus, it becomes possible to control properties of a thin film transistor more minutely and to manufacture varied thin film transistors. Therefore, a high-accuracy semiconductor device which needs a plurality of circuits having different functions can be manufactured with high reliability.

This embodiment mode can be implemented in combination with each of Embodiment Modes 1 to 5.

Embodiment Mode 7

An embodiment mode of the present invention is described with reference to FIGS. 13A to 13D, 14A to 14C, 15A to 15C, and 16A to 16C. This embodiment mode describes an example where a semiconductor nonvolatile memory element (hereinafter, referred to as a memory-transistor) is formed in a semiconductor device manufactured in Embodiment Mode 4. Then, repeated descriptions of the same portion and the portion having the same function are omitted.

As in Embodiment Mode 4, a base film 401a and a base film 401b are stacked as a base film over a substrate 400 and a semiconductor layer 402, a semiconductor layer 403, a semiconductor layer 404, and a semiconductor layer 405 are formed. An amorphous semiconductor film is irradiated with laser light to be crystallized, and then a formed crystalline semiconductor film is patterned to form the semiconductor layer 402, the semiconductor layer 403, the semiconductor layer 404, and the semiconductor layer 405. In this embodiment mode, a semiconductor layer is formed of silicon, and a crystalline silicon film having a serially grown crystal grain is formed by irradiating an amorphous silicon film with laser light. Note that the semiconductor layer 402, the semiconductor layer 403, the semiconductor layer 404, and the semiconductor layer 405 are formed so that a channel formation region of a subsequently formed thin film transistor is formed parallel to the scanning direction of the laser light. In this embodiment mode, pulsed laser light at a repetition rate of 80 MHz is used as the laser light. A crystal grain of a single crystal which is long extended along a scanning direction of the laser light is formed, thereby becoming it possible to form a semiconductor film having little crystal grain boundary at least which prevents a carrier of a thin film transistor from moving.

An insulating film 480, an insulating film 481, an insulating film 482, and an insulating film 483 are formed over the semiconductor layer 402, the semiconductor layer 403, the semiconductor layer 404, the semiconductor layer 405, and the substrate 400, and a insulating film 406 is formed thereon. The lamination of the insulating film 480, the insulating film 481, the insulating film 482, the insulating film 483, and the insulating film 406 formed thereon is preferably formed to have a thickness of from 1 to 100 nm, more preferably, from 1 to 10 nm, further more preferably, from 2 to 5 nm. The insulating film 480, the insulating film 481, the insulating film 482, the insulating film 483, and the insulating film 406 formed thereon serve as a tunnel oxide film in a memory transistor and as a part of a gate insulating film in a thin film transistor. Accordingly, a tunnel current is easier to flow when thicknesses of the insulating film 480, the insulating film 481, the insulating film 482, the insulating film 483, and the insulating film 406 formed thereon are thinner, and so high speed operation becomes possible. The thinner the thicknesses of the insulating film 480, the insulating film 481, the insulating film 482, the insulating film 483, and the insulating film 406 formed thereon are, the lower the voltage required to store charges in the floating gate electrode is. As a result, power consumption of a semiconductor device that is formed afterwards can be reduced.

As a method for forming the insulating film 480, the insulating film 481, the insulating film 482, and the insulating film 483, a GRTA method, an LRTA method, or the like is used to oxidize a surface of the semiconductor region to form a thermal oxide film, and so an insulating film having a thin thickness can be formed. Alternatively, a CVD method, a coating method, or the like can be used. As the insulating film 406, a silicon oxide film, a silicon nitride film, a silicon oxynitride film, or a silicon nitride oxide film can be used. Further, the insulating film 406 may be formed to have a lamination structure formed by stacking a silicon oxide film and a silicon nitride film sequentially over the substrate 100, or stacking a silicon oxide film, a silicon nitride film, and a silicon oxide film over a substrate 100.

In this embodiment mode, a silicon oxide film is formed as the insulating film 480, the insulating film 481, the insulating film 482, and the insulating film 483, and a silicon nitride film is formed as the insulating film 406. After removing a natural oxidation film formed on the surface of the semiconductor layer 402, the semiconductor layer 403, the semiconductor layer 404, the semiconductor layer 405; the semiconductor layer 402, the semiconductor layer 403, the semiconductor layer 404, the semiconductor layer 405 are exposed to ozone water containing hydroxyl radical for several ten seconds to several minutes and a silicon oxide film is formed on the surfaces of the semiconductor layer 402, the semiconductor layer 403, the semiconductor layer 404, the semiconductor layer 405. Then, the silicon oxide film is made minute by a GRTA method and an insulating film 480, an insulating film 481, an insulating film 482, and an insulating film 483 are formed to each have a film thickness of from 1 to 20 nm. The method enables the process to be conducted for short time and at high temperature; therefore, a minute and thin insulating film can be formed without expanding and contracting the substrate. Next, a silicon nitro oxide film is formed to have a film thickness of from 1 to 5 nm as the insulating film 406 over the silicon oxide film.

Figure 13:
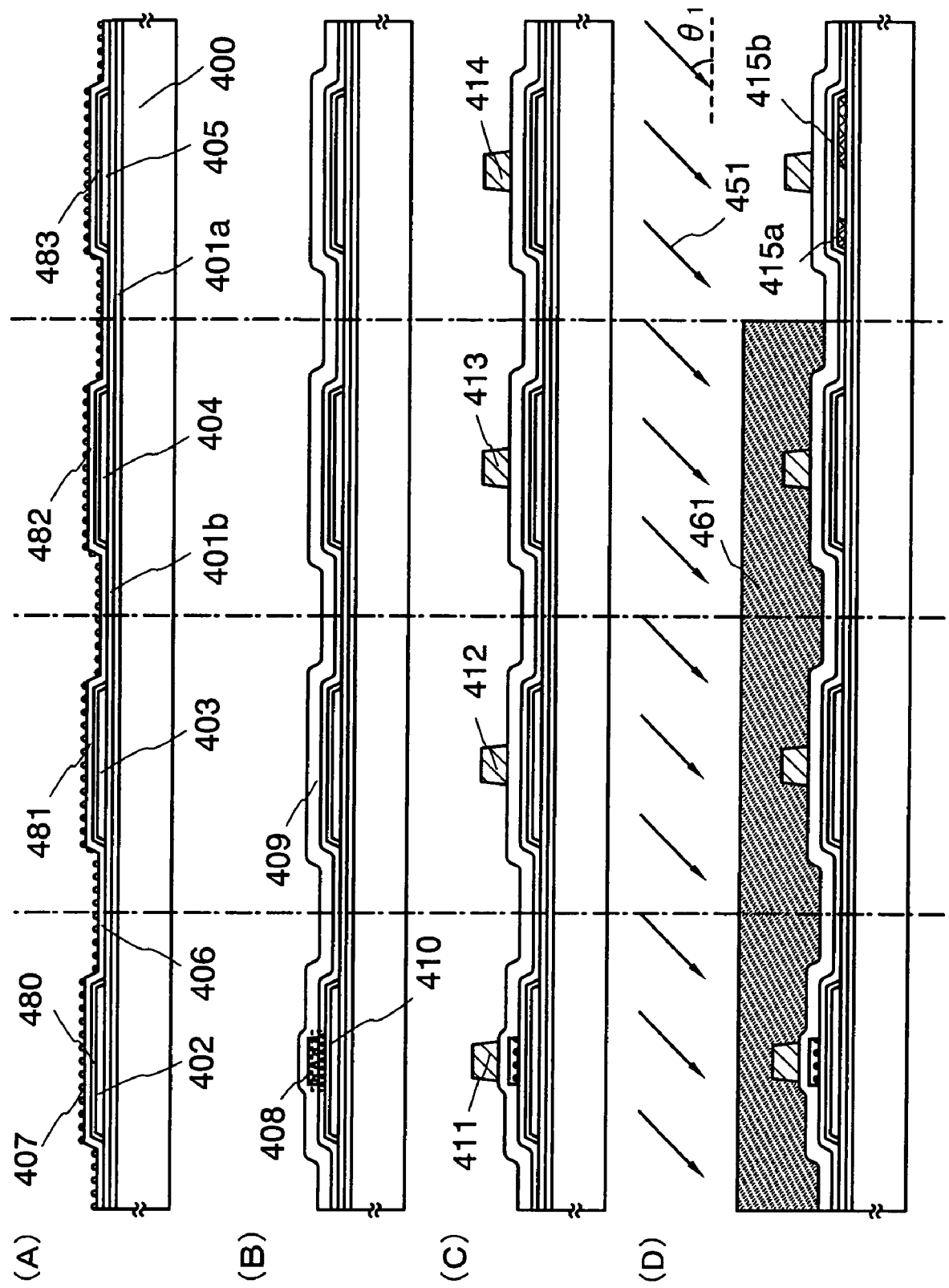
FIGS. 13A to 13D are diagrams for describing a manufacturing method of a semiconductor device of the present invention.

Conductive particles or semiconductor particles (hereinafter, disperse particles) 407 that are dispersed over the insulating film 406 are formed (FIG. 13A). As a manufacturing method for the disperse particles, a known method such as a sputtering method, a plasma CVD method, an LPCVD method, a vapor deposition method, or a droplet discharging method can be used. When the disperse particles are formed by a plasma CVD method, an LPCVD method, a vapor deposition method, or a droplet discharging method, the insulating film 406 is buffered from an impact of forming the disperse particles, and so defects of the insulating film 406 can be prevented from generating. As a result, a semiconductor device having high reliability can be manufactured. The disperse particles can be formed after forming a conductive film or a semiconductor film by the foregoing method to be etched into a desired shape. The size of each disperse particle is from 0.1 to 10 nm, preferably, from 2 to 5 nm. As a material for conductive particles, gold, silver, copper, palladium, platinum, cobalt, tungsten, nickel, and the like can be used. As a material for semiconductor particles, silicon (Si), germanium (Ge), or silicon germanium alloy, and the like can be used. In this embodiment mode, here, silicon microcrystal is formed as the disperse particles 407 by a plasma CVD method.

An insulating film is formed over the disperse particles 407 and the insulating film 406. As the insulating film, a silicon nitride film or a silicon nitride oxide film is formed to have a film thickness of from 10 to 20 nm by a plasma CVD method.

Next, a mask is formed over the disperse particles 407 to be a memory transistor subsequently over the semiconductor layer 402.

An insulating layer 408 having a floating gate electrode 410 is formed by etching a part of the disperse particles 407 using the mask. As a method of removing the insulating film and the disperse particles 407, a known etching method such as a dry etching method or a wet etching method can be used. In this embodiment mode, the insulating film is removed by a dry etching method to expose the disperse particles 407. When a dry etching is used in the case that the thickness of the insulating film 406 provided with the disperse particles 407 is thin, there is a possibility of generating defects in the insulating film 406 by plasma bombardment. Accordingly, the disperse particles 407 are preferably removed by a wet etching method. Here, silicon microcrystals that are the disperse particles are removed by a wet etching method using $NMD_3$ solution (water solution containing from 0.2 to 0.5% of tetramethyl ammonium hydrooxide).

The floating gate electrode is formed by dispersed particles. Accordingly, in the case that defects are occurred in the insulating film 406 serving as a tunnel oxide film, charges stored in the floating gate electrode can be prevented from flowing out entirely form the defects to the semiconductor region. As a result, a semiconductor memory transistor having high reliability can be manufactured.

After removing the mask, the insulating layer 408 having a floating gate electrode 410 and the insulating film 409 over the insulating film 406 are formed (FIG. 13B). The insulating film 409 is preferably formed to have a thickness of from 1 to 100 nm, more preferably, from 10 to 70 nm, and further more preferably from 10 to 30 nm. The insulating film 409 is required to keep the floating gate electrode 410 and a gate electrode layer which is formed afterwards in the memory transistor isolated. Accordingly, the insulating film 409 is preferably formed to have a thickness that does not allow a leak current between the floating gate electrode 410 and the gate electrode layer to increase. The insulating film 409 can be formed by a silicon oxide film, a silicon nitride film, a silicon oxynitride film, or a silicon nitride oxide film as with the insulating film 406. Alternatively, the insulating film 409 may be formed to have a lamination layer structure formed by stacking a silicon oxide film and a silicon nitride film sequentially over the substrate 100, or stacking a silicon oxide film, a silicon nitride film, and a silicon oxide film in this order over the substrate 100. The silicon oxide film is preferably formed on the semiconductor region since an interface state between the gate insulating film and the semiconductor region is lowered. Here, a lamination layer structure is formed by stacking a silicon oxide film with a thickness of 10 nm and a silicon nitride film with a thickness of 20 nm as the insulating film 409.

After forming the insulating film 409, a second floating gate electrode may be formed by forming the disperse particles and the mask pattern which covers the disperse particles. Moreover, a plurality of the floating gate electrode may be stacked by repeating the similar processes.

A conductive film is formed of tungsten (W) over the insulating film 409. In this embodiment mode, the tungsten (W) is used as a gate electrode layer. The conductive film is etched to be a thin line as shown in FIGS. 3A to 3F, thereby forming a gate electrode layer 411, a gate electrode layer 412, a gate electrode 413, and a gate electrode layer 414 (FIG. 13C). A mask 461 is formed of a resist to cover the semiconductor layer 402, the semiconductor layer 403, and the semiconductor layer 404.

The semiconductor layer 405 is doped with an impurity element 451 for imparting a p-type at the incident angle $\theta_1$ to the surface thereof, which is set at from 30° to 90° or from 90° to 150° using the gate electrode layer 414 as a mask, thereby forming a first p-type impurity region 415a and a first p-type impurity region 415b (FIG. 13D). In this embodiment mode, the incident angle $\theta_1$ is set at the range of from 30° to 90°. The semiconductor layer is diagonally doped with the impurity element 451 for imparting a p-type; therefore, the first p-type impurity region 415b is formed in a portion covered with the gate electrode layer 414 in the semiconductor layer 405. However, the impurity element 451 for imparting a p-type is blocked by the gate electrode layer 414 which functions as a mask; therefore, the first p-type impurity region 415a is not formed in the portion to be covered with the gate electrode layer 414 in the semiconductor layer 405. Here, the doping is conducted so that the first p-type impurity region 415a and the first p-type impurity region 415b include the impurity elements for imparting a p-type in a concentration of approximately from $5\times10^{17}$ to $5\times10^{18}/cm^3$. In addition, the concentration thereof may be set at approximately from $5\times10^{16}$ to $1\times10^{17}/cm^3$. In this embodiment mode, boron (B) is used as the impurity elements for imparting a p-type.

Figure 14:
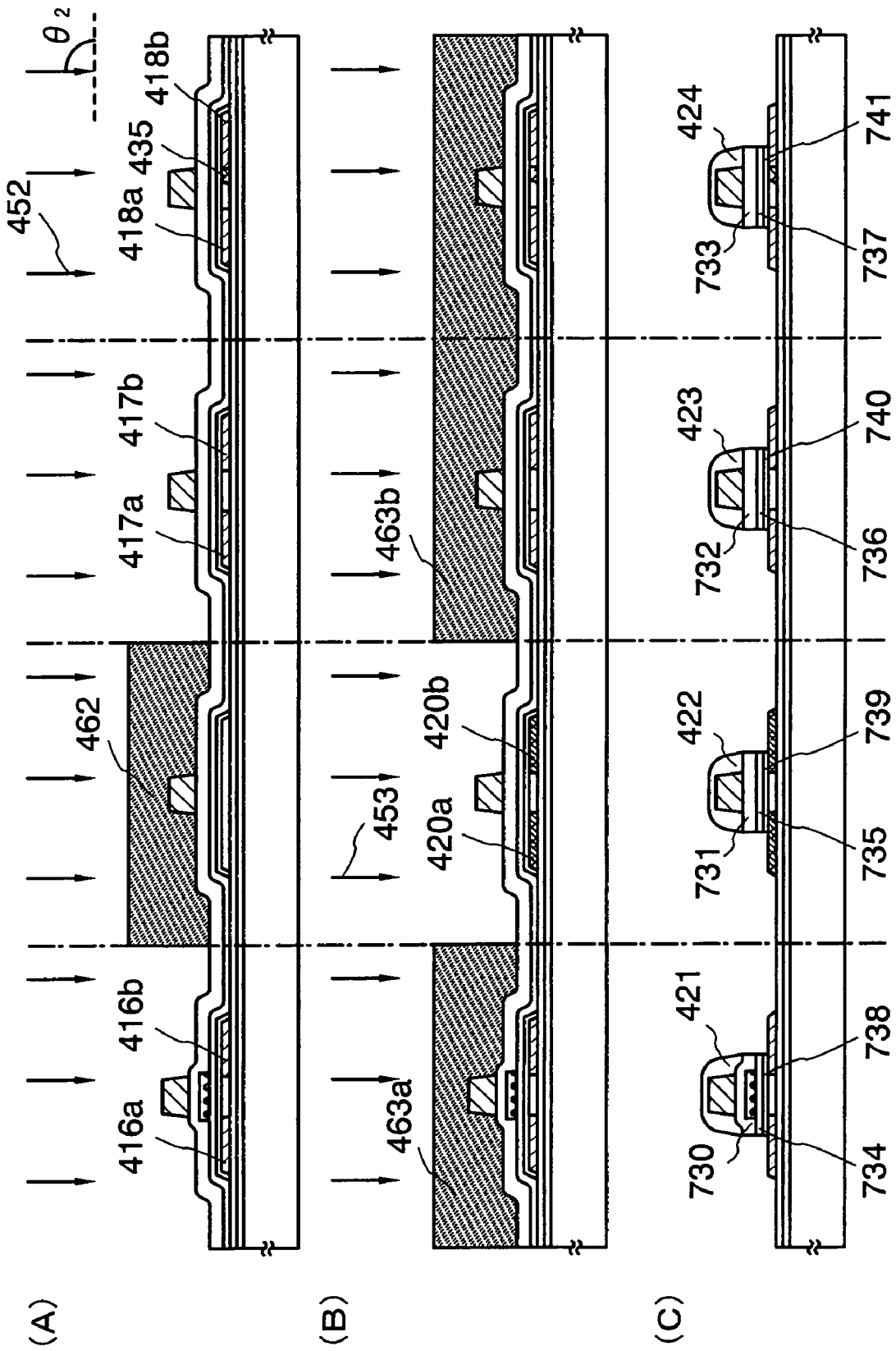
FIGS. 14A to 14C are diagrams for describing a manufacturing method of a semiconductor device of the present invention.

The mask 461 is removed and a mask 462 is formed of a resist to cover the semiconductor layer 403. The mask 462 may be formed newly or formed by processing the mask 461. The semiconductor layer 402, the semiconductor layer 404, and the semiconductor layer 405 are doped with an impurity element for imparting an n-type in a near-perpendicular incident angle $\theta_2$ to the surfaces thereof using the gate electrode layer 411, the gate electrode 413, and the gate electrode layer 414, thereby forming a first n-type impurity region 416a, a first n-type impurity region 416b, a first n-type impurity region 417a, a first n-type impurity region 417b, a first n-type impurity region 418a and a first n-type impurity region 418b (FIG. 14A). The first p-type impurity region 415a and the first p-type impurity region 415b have been doped with the impurity element for imparting a p-type; therefore, they are doped with impurity elements for imparting an n-type in order to be changed into an n-type impurity region. The first n-type impurity region 416a, the first n-type impurity region 416b, the first n-type impurity region 417a, the first n-type impurity region 417b, the first n-type impurity region 418a, and the first n-type impurity region 418b are formed to include the impurity elements for imparting an n-type typically in a concentration of from $1 \times 10^{17}$ to $5 \times 10^{18}/cm^3$. In this embodiment mode, phosphorous (P) is used as the impurity elements for imparting an n-type. Portions to be covered with the gate electrode layer 411, the gate electrode layer 413, and the gate electrode layer 414 in the semiconductor layer 402, the semiconductor layer 404, and the semiconductor layer 405 are not doped by being blocked by the gate electrode layer 411, the gate electrode layer 413, and the gate electrode layer 414, since the impurity element 452 for imparting an n-type is added to perpendicular. Therefore, a part of the first p-type impurity region formed in a portion under the gate electrode layer 414 in the semiconductor layer is left, and becomes a second p-type impurity region 435. The second p-type impurity region 435 is formed as an Lov region.

The mask 462 is etched by etching or the like, and a mask 463a and a mask 463b are formed to cover the semiconductor layer 402, the semiconductor layer 404, and the semiconductor layer 405. The semiconductor layer 403 is doped with an impurity element 453 for imparting a p-type in a near-perpendicular incident angle to the surface thereof using the mask 463a, the mask 463b, and the gate electrode layer 412 as a mask, thereby forming a third p-type impurity region 420a and a third p-type impurity region 420b (FIG. 14B). Here, the doping is conducted so that the third p-type impurity region 420a and the third p-type impurity region 420b include the impurity elements for imparting a p-type in a concentration of approximately from $1 \times 10^{20}$ to $5 \times 10^{21}/cm^3$. In this embodiment mode, boron (B) is used as the impurity element for imparting a p-type.

The mask 463a and the mask 463b are removed by etching or the like. An insulating layer is formed over the insulating film 409, the gate electrode layer 411, the gate electrode layer 412, the gate electrode layer 413, and the gate electrode layer 414, and anisotropic etching is conducted, thereby forming a sidewall 421, a sidewall 422, a sidewall 423, and a sidewall 424 on side surfaces of the gate electrode layer 411, the gate electrode layer 412, the gate electrode layer 413, and the gate electrode layer 414 (FIG. 14C). The sidewalls prevent the gate electrode layers and the silicide contained in the source region and the drain region in the semiconductor layer from being short-circuited. In this embodiment mode, a silicon oxide is used as an insulating layer for forming a sidewall. In addition, when forming the sidewall 421, the sidewall 422, the sidewall 423, and the sidewall 424, etching is conducted using the semiconductor layer 402, the semiconductor layer 403, the semiconductor layer 404, and the semiconductor layer 405 as etching stoppers and the semiconductor layer 402, the semiconductor layer 403, the semiconductor layer 404, and the semiconductor layer 405 are exposed. As the result, the insulating film 409, the insulating film 406, the insulating film 480, the insulating film 481, the insulating film 482, and the insulating film 488 are etched, thereby forming an insulating film 738, an insulating film 734, and an insulating layer 730 over the semiconductor layer 402, forming an insulating film 739, an insulating film 735, an insulating layer 731 over the semiconductor layer 403, forming an insulating film 740, an insulating film 736, and an insulating layer 732 over the semiconductor layer 404, and forming an insulating film 741, an insulating film 737, and an insulating layer 733 over the semiconductor layer 405.

As in this embodiment mode, when the sidewall 421, the sidewall 422, the sidewall 423, and the sidewall 424 are formed, the insulating layer may be formed to be left over the gate electrode layer 411, the gate electrode layer 412, the gate electrode layer 413, and the gate electrode layer 414 or a protective film may be formed over the gate electrode layer. Protecting the gate electrode layers prevents the gate electrode layers from being reduced when etching is conducted.

Figure 15:
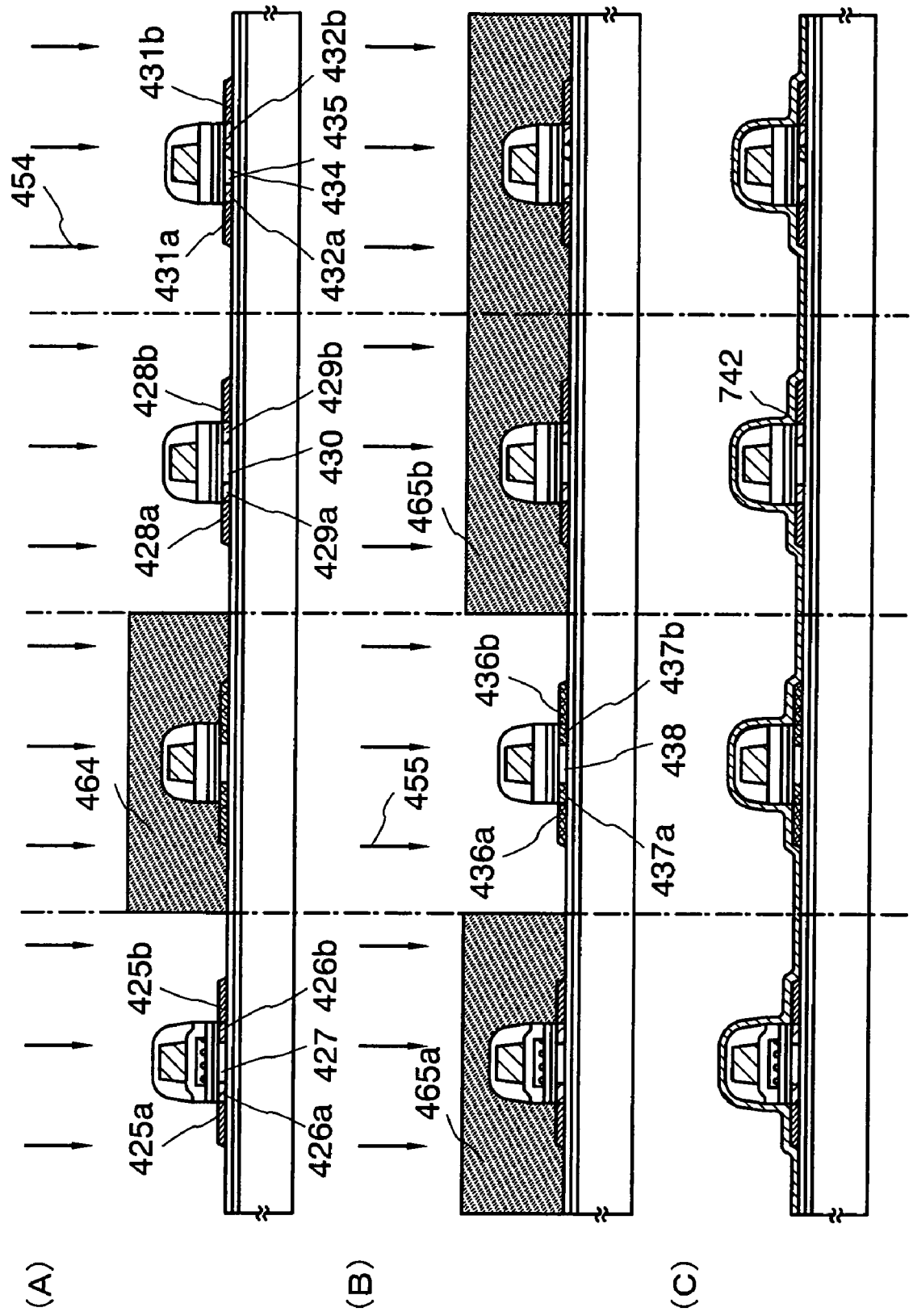
FIGS. 15A to 15C are diagrams for describing a manufacturing method of a semiconductor device of the present invention.

A mask 464 is formed of a resist to cover the semiconductor layer 403. The semiconductor layer 402, the semiconductor layer 404, and the semiconductor layer 405 are doped with an impurity element 454 for imparting an n-type in a near-perpendicular incident angle to the surfaces thereof using the sidewall 421, the sidewall 423, the sidewall 424, the gate electrode layer 411, the gate electrode layer 413, and the gate electrode layer 414 as masks, thereby forming a second n-type impurity region 425a, a second n-type impurity region 425b, a second n-type impurity region 428a, a second n-type impurity region 428b, a second n-type impurity region 431a, and a second n-type impurity region 431b (FIG. 15A). The semiconductor layers which are covered with the sidewalls are not doped with the impurity element 454 for imparting an n-type; therefore, they become a third n-type impurity region 426a, a third n-type impurity region 426b, a third n-type impurity region 429a, a third n-type impurity region 429b, a third n-type impurity region 432a, and a third n-type impurity region 432b. The second n-type impurity region 425a, the second n-type impurity region 425b, the second n-type impurity region 428a, the second n-type impurity region 428b, the second n-type impurity region 431a, and the second n-type impurity region 431b are highly doped impurity regions; therefore, they function as a source region or a drain region. The second n-type impurity region 425a, the second n-type impurity region 425b, the second n-type impurity region 428a, the second n-type impurity region 428b, the second n-type impurity region 431a, and the second n-type impurity region 431b are formed to include the impurity elements for imparting an n-type in a concentration of approximately from $5 \times 10^{19}$ to $5 \times 10^{20}/cm^3$. In this embodiment mode, phosphorous (P) is used as the impurity element for imparting an n-type.

On the other hand, the third n-type impurity region 426a, the third n-type impurity region 426b, the third n-type impurity region 429a, the third n-type impurity region 429b, the third n-type impurity region 432a, and the third n-type impurity region 432b which are lightly doped impurity regions are Loff regions which are not covered with the gate electrode layer 411, the gate electrode layer 413, and the gate electrode layer 414. Therefore, an electric field located adjacent to a drain can be relieved and deterioration due to hot carrier injection can be controlled and of off-state current can be reduced. Hereby, a semiconductor device with high reliability and low power consumption can be formed. Note that a channel formation region 427, a channel formation region 430, and a channel formation region 434 are formed in the semiconductor layer 402, the semiconductor layer 404, and the semiconductor layer 405.

A mask 465a and a mask 465b are formed of a resist to cover the semiconductor layer 402, the semiconductor layer 404, and the semiconductor layer 405. The semiconductor layer 403 is doped with an impurity element 455 for imparting a p-type in a perpendicular incident angle to the surface thereof using the mask 465a, the mask 465b, the sidewall 422, and the gate electrode layer 412 as masks, thereby forming a fourth p-type impurity region 436a, a fourth p-type impurity region 436b, a fifth p-type impurity region 437a, and a fifth p-type impurity region 437b (FIG. 15B). Here, the doping is conducted so that the fourth p-type impurity region 436a and the fourth p-type impurity region 436b include the impurity elements for imparting a p-type in a concentration of approximately from $1 \times 10^{20}$ to $5 \times 10^{21}/cm^3$. And the doping is conducted so that the fifth p-type impurity region 337a and the fifth p-type impurity region 337b include the impurity elements for imparting a p-type with a concentration of approximately from $5 \times 10^{18}$ to $5 \times 10^{19}/cm^3$. In this embodiment mode, boron (B) is used as the impurity element for imparting a p-type. Note that a channel formation region 438 is formed in the semiconductor layer 403.

The fourth p-type impurity region 436a and the fourth p-type impurity region 436b are highly doped impurity regions, and they function as a source region or a drain region. On the other hand, the fifth p-type impurity region 437a and the fifth p-type impurity region 437b which are lightly doped p-type impurity regions are formed of Loff regions which are not covered with the gate electrode layer. An electric field located adjacent to a drain can be relieved and deterioration due to hot carrier injection can be prevented, and additionally, an off-state current can be reduced, since the fifth p-type impurity region 437a and the fifth p-type impurity region 437b are not cover with the gate electrode layer. Hereby, a semiconductor device with high reliability and low power consumption can be formed.

A conductive film 742 is formed over the semiconductor layer 402, the semiconductor layer 403, the semiconductor layer 404, the semiconductor layer 405, the sidewall 421, and the sidewall 422, the sidewall 423, the sidewall 424 (FIG. 15C). As the material for the conductive film 742, titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like are used. Here, a titanium film is formed by a sputtering method.

Next, a silicide 743a, a silicide 743b, a silicide 744a, a silicide 744b, a silicide 745a, a silicide 745b, a silicide 746a, and a silicide 746b are formed by the reaction of silicon of exposed source and drain regions in a semiconductor layer and the conductive film 742 by heat treatment, a GRTA method, an LRTA method, or the like. Thereafter, a part of the conductive film 742 that does not react with the semiconductor layer is removed (FIG. 16A).

An insulating film 443 for hydrogenation is appropriately formed by heat treatment, laser irradiation, or the like for activating an impurity element. Hydrogenation is conducted by heat treatment to form an insulating layer 446. The heat treatment for activating an impurity element may be conducted in conjunction with the heat treatment for hydrogenation; therefore, steps can be simplified. In this embodiment mode, a silicon nitride oxide film and a silicon oxynitride film are stacked in serial order as the insulating layer 446 to have a lamination structure.

An opening (a contact hole) reaching a source region and a drain region is formed in the insulating layer 446 and the insulating film 443. A source or drain electrode layer 439a, a source or drain electrode layer 439b, a source or drain electrode layer 440a, a source or drain electrode layer 440b, a source or drain electrode layer 441a, a source or drain electrode layer 441b, a source or drain electrode layer 442a, and a source or drain electrode layer 442b are formed in the opening (FIG. 16B). In this embodiment mode, a lamination of aluminum (Al), titanium (Ti), and aluminum (Al) is used as a source electrode layer or a drain electrode layer.

Figure 16:
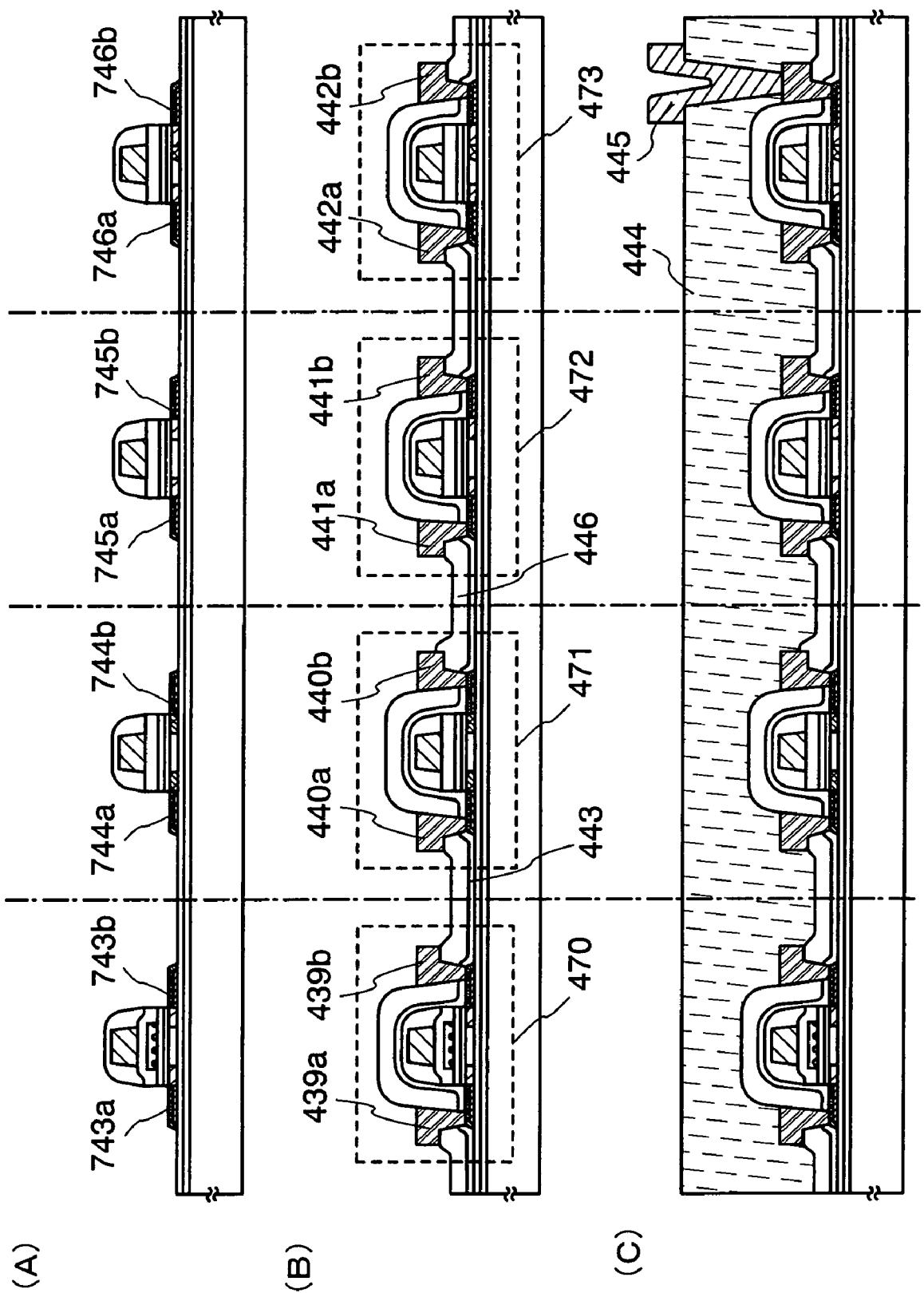
FIGS. 16A to 16C are diagrams for describing a manufacturing method of a semiconductor device of the present invention.

In addition, as shown in FIG. 16C, an insulating layer 444 having an opening may be formed to reach a source electrode layer or a drain electrode layer over the source electrode layer or the drain electrode layer and a wiring layer 445 may be formed in the opening. In this embodiment mode, an insulating layer containing siloxane polymer is used for the insulating layer 444, and a lamination of aluminum (Al) and titanium (Ti) is used for the wiring layer 445.

A semiconductor device providing a memory transistor 470, a p-channel thin film transistor 471, an n-channel thin film transistor 472, and an n-channel thin film transistor 473 having a lightly doped p-type impurity region over the same substrate can be formed. A memory transistor and a thin film transistor of a semiconductor device in this embodiment mode is formed of a semiconductor region having little crystal grain boundary in a channel direction; therefore, high speed operation can be performed. Additionally, the semiconductor device has an n-channel thin film transistor having a lightly doped p-type impurity region; therefore, a semiconductor device of an ID chip or the like capable of high speed operation and reducing power consumption can be formed.

The memory transistor 470, the p-channel thin film transistor 471, an n-channel thin film transistor 472, and an n-channel thin film transistor 473 having a lightly doped p-channel impurity region in this embodiment mode have silicide structures, thereby enabling the resistance of the source region and the drain region to be lower and the semiconductor device to speed up. Additionally, the operation at the lower voltage is possible, therefore, power consumption can be reduced.

In addition, the p-channel thin film transistor 471, the n-channel thin film transistor 472, and the n-channel thin film transistor having a lightly doped p-type impurity region formed in this embodiment mode are formed using a lamination of the insulating film 481, the insulating film 482, and the insulating film 483 which are formed over each surface of the semiconductor devices and the insulating layer 406 and the insulating layer 409 which are formed thereon as a gate insulating layer. Therefore, a thin film transistor can have high pressure resistance. Note that when the insulating film 409 is removed, and the gate insulating layer is formed of a lamination of the insulating film 481, the insulating film 482, and the insulating film 483 and the insulating film 406 which is formed thereon, a thin film transistor capable of high speed operation can, be formed. In this way, a thin film transistor having properties capable of responding to required functions can be formed and a semiconductor device can be manufactured.

According to the present invention, a semiconductor layer is provided with an impurity region having an impurity element for imparting a different conductivity type; therefore, properties of a thin film transistor can be minutely controlled. This enables a thin film transistor having required functions to be formed by brief steps and a semiconductor device with high reliability and better electrical characteristics to be manufactured at a low cost. That is, a functional circuit or the like which emphasizes a high speed operation, such as a processor, a DRAM, an image processing circuit, or a speech processing circuit and a driver circuit or the like which emphasizes high pressure resistance, such as a buffer circuit, a shift register circuit, a level shifter circuit, and a sampling circuit can be formed over the same substrate. Thus, a semiconductor device such as a system LSI, having an element of various functions and structures can be manufactured over the same substrate.

This embodiment mode can be implemented in combination with each of Embodiment Modes 1 to 6.

Embodiment Mode 8

One of semiconductor devices which can be manufactured according to a manufacturing method of the present invention is an ID chip. An ID chip is a semiconductor device which can wirelessly transmit/receive data such as identifying information, and is developed for practical use in various fields. An ID chip is also referred to as a wireless tag, an RFID (radio frequency identification) tag, an IC tag, or the like. Further, an ID chip using a glass substrate can be referred to as an IDG chip (identification glass chip), and an ID chip using a flexible substrate can be referred to as an IDF chip (identification flexible chip). The present invention can be applied to either of them.

Figure 30:
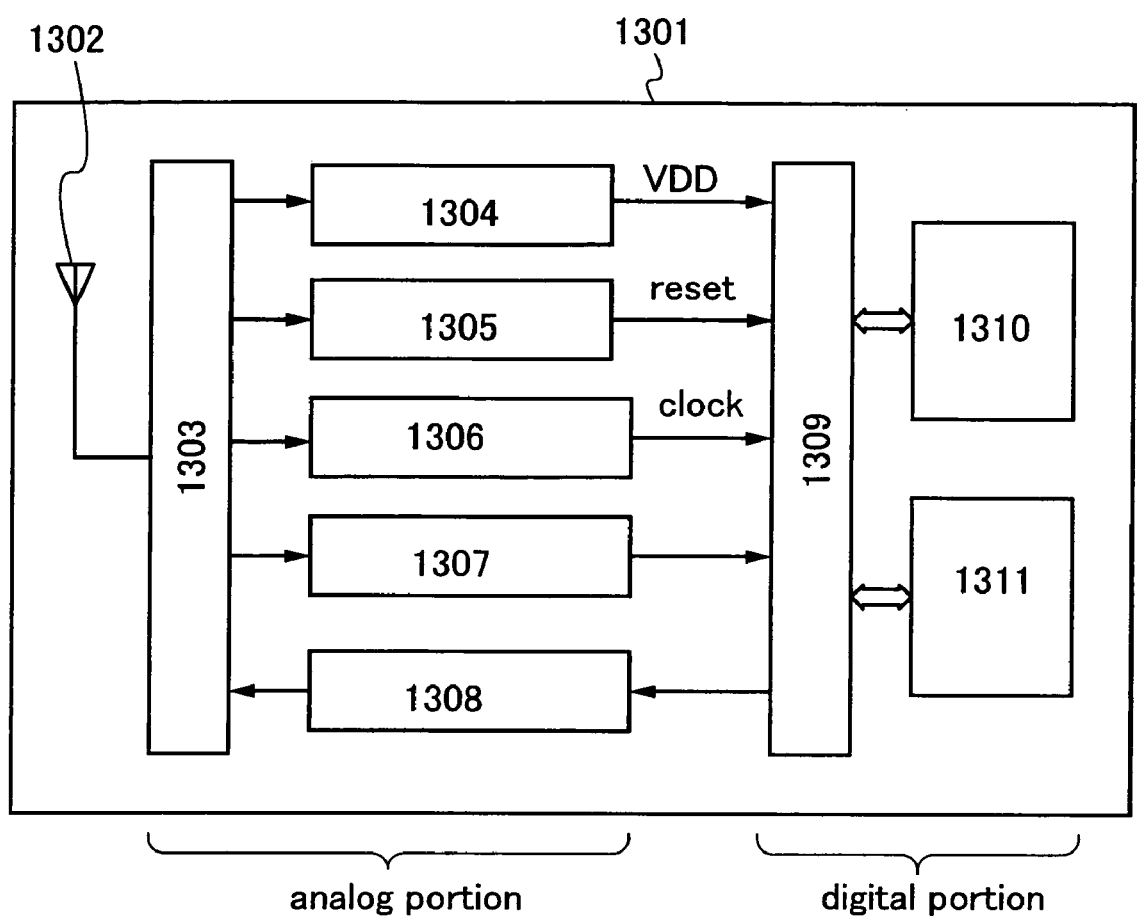
FIG. 30 is a block diagram showing a structure of the semiconductor device of the present invention.

FIG. 30 is a typical block diagram of an ID chip typified by a non-contact RFID (Radio Frequency Identification) tag, a wireless tag, or the like which are typical examples of the semiconductor device of the present invention. FIG. 30 shows a configuration having a simple function to read out fixed data such as authentication data. In FIG. 30, an ID chip 1301 includes an antenna 1302, a high frequency circuit 1303, a power source circuit 1304, a reset circuit 1305, a clock generating circuit 1306, a data demodulating circuit 1307, a data modulating circuit 1308, a controlling circuit 1309, a nonvolatile memory (referred to as NVM) 1310, and a ROM 1311.

In this embodiment mode, a thin film transistor of a memory transistor formed according to the Embodiment Mode 5 with controlled electric properties to response to functions required for each circuit is used as the nonvolatile memory 1310. When a transistor capable of high speed operation is required as a transistor including the high frequency circuit 1303, the reset circuit 1305, the clock generating circuit 1306, the data demodulating circuit 1307, the data modulating circuit 1308, the controlling circuit 1309, and the ROM 1311, the transistor capable of high speed operation can be also manufactured by the same step by applying the present invention. When a high pressure resistant transistor is required as a transistor containing the power source circuit 1304, it can be manufactured at the same time as the memory transistor by applying the present invention. In this manner, an RFID tag can be manufactured efficiently over the same substrate. Further, the ID chip 1301 that realizes cost reduction and downsizing can be provided.

The circuits shown in FIG. 30 are all formed on a glass substrate, a flexible substrate, or a semiconductor substrate. The antenna 1302 may be formed on the glass substrate, the flexible substrate, or the semiconductor substrate. Otherwise, it may be provided outside the substrate and be connected to a semiconductor integrated circuit inside the substrate.

The high frequency circuit 1303 receives an analog signal from the antenna 1302 and outputs an analog signal received from the data modulating circuit 1308 from the antenna 1302. The power source circuit 1304 generates a constant power source from the received signals, the reset circuit 1305 generates a reset signal, the clock generating circuit 1306 generates a clock signal, the data demodulating circuit 1307 extracts data from the received signals, and the data modulating circuit 1308 generates an analog signal to be outputted to the antenna or changes antenna characteristics based on a digital signal received from the controlling circuit. An analog portion is formed of the aforementioned circuits.

On the other hand, the controlling circuit 1309 reads data by receiving data extracted from the received signal. In specific, the controlling circuit 1309 generates an address signal of the NVM 1310 and the ROM 1311, reads data, and transmits the read data to the data modulating circuit. A digital portion is formed of the aforementioned circuits.

In this manner, an ID chip having a high reliability and high functions can be manufactured, according to the present invention. This embodiment mode can be implemented in combination with Embodiment Modes 1 to 7.

Embodiment 9

FIG. 17A is a perspective view showing one mode of an ID chip that is one of the semiconductor devices of the present invention. A processor which is an aggregate having various signal processing functions and a system processor having a processor as a system can be used as an integrated circuit. Reference numeral 1101 denotes an integrated circuit, and 1102 denotes an antenna which is connected to the integrated circuit 1101. Reference numeral 1103 denotes a support which also functions as a cover material and 1110 denotes a cover material. The integrated circuit 1101 and the antenna 1102 are formed over the support 1103, and the cover material 1110 overlaps the support 1103 so as to cover the integrated circuit 1101 and the antenna 1102. The cover material 1110 is not necessarily used, though the mechanical strength of the ID chip can be increased by covering the integrated circuit 1101 and the antenna 1102 with the cover material 1110.

FIG. 17B is a perspective view showing one mode of an IC card that is one of the semiconductor devices of the present invention. Reference numeral 1105 denotes an integrated circuit, and 1106 denotes an antenna that is connected to the integrated circuit 1105. Reference numeral 1108 denotes a substrate functioning as an inlet sheet and 1107 and 1109 denote cover materials. The integrated circuit 1105 and the antenna 1106 are formed over the substrate 1108, and the substrate 1108 is sandwiched between the two cover materials 1107 and 1109. The IC card of the present invention may have a display device connected to the integrated circuit 1105.

Next, FIGS. 18A and 18B show cross sectional views in a line E-F of an ID chip shown in FIG. 17A. FIGS. 18A and 18B show examples where a thinner cover film 1150 is used instead of the cover material 1104 and the integrated circuit 1101 is directly formed on a support. Of course, the cover material 1104 may be formed over the cover film 1150. The ID chip is sealed with the support 1103 which also functions as a cover material and the cover film 1150, and has the integrated circuit 1101 and an antenna 1102 connected thereto.

The integrated circuit 1101 can be formed using an integrated circuit shown in any one of Embodiment Modes 1 to 8. Additionally, a semiconductor element used for the integrated circuit 1101 is not limited to this. For example, a memory element, a diode, a photoelectric conversion element, a resistance element, coil, a capacitor element, an inductor, and the like can be used as well as a thin film transistor.

As shown in FIG. 18A, an interlayer insulating film 1110 is formed over a thin film transistor of the integrated circuit 1101 and the antenna 1102 is formed over the interlayer insulating film 1110, and is covered with the cover film 1150 which functions as a protective film.

On the other hand, as shown in FIG. 18B, a barrier film 1121 may be formed of a silicon nitride film or the like over the interlayer insulating film 1110 and the antenna 1102 may be formed thereon.

Providing a barrier film enables an ID chip having an improved reliability to be provided without contaminating the integrated circuit 1101. In FIGS. 18A and 18B, a base film is formed of a silicon nitride film or the like between the integrated circuit 1101 and the support 1103 and the integrated circuit is covered with a film having a barrier function, such as a silicon nitride film or the like; therefore it becomes possible further to eliminate pollution of moisture or the like and to improve the reliability.

The antenna 1102 is preferably formed of gold, silver, copper, aluminum or a metal coated with them.

In this embodiment mode, an example where an integrated circuit is adhered to a lamination body comprising an antenna formed over an interlayer insulating film of the integrated circuit by a different cover member is shown; however, it is not limited to this, the integrated circuit may be adhered to a cover material provided with an antenna by an adhesive agent. In this time, an integrated circuit is adhered to an antenna by conducting UV treatment or ultrasonication by using an aerotropic conductive adhesive or an aerotropic electrical conduction film; however, the present invention can use various methods without being limited by this method. Additionally, an antenna does not have to be always equal with the size of an ID chip, and it may be bigger or may be smaller and may be set suitably. In addition, in transmitting or receiving a signal can use electromagnetic wave of radio, light, or the like.

In this embodiment mode, an integrated circuit is directly formed in a support and a dense film of silicon nitride or the like is used as the cover film 1150; however, an integrated circuit may be formed by an exfoliation process to adhere the support and the cover material. A support and a cover material can be formed of a material having flexibility such as plastic, an organic resin, paper, a fiber, carbon graphite, or the like. A cover material is disassembled by bacteria, and it is returned to soil by using a biodegradable resin. The Integrated circuit of this embodiment mode is formed of silicon, aluminum, oxygen, nitrogen, or the like; therefore, a nonpolluting ID chip can be formed. Additionally, a used ID chip can be burnt up or cut by using an incineration nonpolluting material such as paper, a fiber, carbon paper graphite. In addition, an ID chip using these materials is nonpolluting, since it does not generate a poisonous gas either even when it is burnt up.

When an integrated circuit formed by an exfoliation process adheres to a support and a cover material, the integrated circuit interposed between the support and the cover material, is preferably formed to have a thickness of 5 µm or less, more preferably, from 0.1 to 3 µm. Additionally, when the thickness in the case of overlapping the support and the cover material is denoted by d, the thickness of the support and the cover material is preferably (d/2)±30 µm, more preferably, (d/2)±10 µm. Further, the support 1103 and the second cover material are preferably formed to have thicknesses of from 10 µm to 200 µm. Moreover, the area of the integrated circuit 1101 is 5 mm square (25 mm$^2$) or less, preferably, 0.3 mm square to 4 mm square (0.09 mm$^2$ to 16 mm$^2$). When the support 1103 and the cover material are made from organic resin materials, the support 1103 and the cover material have a high property with respect to bending. The integrated circuit formed by an exfoliation process has a high property with respect to bending compared to a single crystalline semiconductor. Since the integrated circuit, the support, and the cover material can be stuck together with no space between them, the complete ID chip itself has a high property with respect to bending. The integrated circuit surrounded by the support and the cover material may be placed over the surface or interior of another solid material or embedded in paper.

This embodiment mode can be implemented in combination with each of Embodiment Modes 1 to 8 freely.

Embodiment Mode 10

This embodiment mode is described with reference to FIG. 19 which is a block diagram showing a chip of a processor (a CPU or the like) which is a typical example of a semiconductor device of the present invention.

Upon inputting an op-code to a data bus interface 1001, the code is decoded by an analysis circuit 1003 (also referred to as Instruction Decoder), and a signal is inputted to a control signal generation circuit 1004 (CPU Timing Control). Upon inputting the signal to the control signal generation circuit 1004, a control signal is outputted from the control signal generation circuit 1004 to an arithmetic circuit 1009 (hereinafter, ALU) and to a storage circuit 1010 (hereinafter, Register).

The control signal generation circuit 1004 comprises an ALU controller 1005 for controlling the ALU 1009 (hereinafter, ACON), a circuit 1006 for controlling the Register (hereinafter, RCON), a timing controller 1007 for controlling timing (hereinafter, TCON), and an interruption controller 1008 for controlling interruption (hereinafter, ICON).

Upon inputting an operand to the data bus interface 1001, the operand is outputted to the ALU 1009 and the Register 1010. Then, a process based on a control signal inputted from the control signal generation circuit 1004 (for example, memory read cycle, memory write cycle, I/O read cycle, I/O write cycle, or the like) is carried out.

In addition, the Register 1010 is composed of a general register, a stack pointer (SP), a program counter (PC), and the like.

Further, an address controller 1011 (hereinafter, ADRC) outputs 16 bits address.

The configuration of the processor described in this embodiment is one example of a processor manufactured according to the present invention, and does not limit the configuration according to the present invention. Therefore a known processor having other than configuration which is described in this embodiment can be also used.

This embodiment mode can be implemented in combined with each of Embodiment Modes 1 to 9.

Embodiment Mode 11

A case where a system LSI is an example of a semiconductor device of the invention is described with reference to FIG. 20.

Note that the system LSI is an LSI that is incorporated in a device having a specific application and constitutes a system for controlling the device and processing data. The application ranges widely, such as a portable phone, a PDA, a DSC, a television, a printer, a FAX, a game machine, a car navigation system, a DVD player, and the like.

FIG. 20 shows an example of the system LSI. The system LSI typically includes a processor (CPU) core 1601, a nonvolatile memory (referred to as an NVM) 1604, a clock controller 1603, a main memory 1602, a memory controller 1605, an interrupt controller 1606, an I/O port 1607, and the like. It is needless to say that the system LSI shown in FIG. 20 is only a simplified example and a wide variety of circuit designs are laid out according to the application of an actual system LSI.

As an I/O port 1607, an antenna or the like which can use electromagnetic waves having various frequencies (such as radio), light, or the like can be used as a signal.

A memory transistor manufactured in Embodiment Mode 7 can be applied to the NVM 1604.

A transistor capable of high speed operation that is manufactured according to the present invention can be used to constitute the processor (CPU) core 1601, the clock controller 1603, the main memory 1602, the memory controller 1605, the interrupt controller 1606, and the I/O port 1607. This enables various circuits to be manufactured over the same substrate.

This embodiment mode can be implemented in combination with each of Embodiment Modes 1 to 10.

Embodiment Mode 12

A semiconductor device of the present invention is used for various purposes. For example, an ID chip 20 which is one mode of the semiconductor device of the present invention can be used by being mounted on bills, coins, securities, documents, bearer bonds, packing cases, books, a recording medium, personal belongings, vehicles, foods, clothes, health items, livingwares, medicals, electronics devices, or the like. In addition, a processor chip can also be used instead of an ID chip.

The bills and the coins mean currency in the market and include a thing that is used in the same way as a currency in a specific area (a cash voucher), memorial coins, and the like. The securities mean a check, a stock certificate, a promissory note, and the like and can be provided with an ID chip 20 (FIG. 21A). The certificates mean a driver's license, a resident card, and the like and can be provided with an ID chip 21 (FIG. 21B). The bearer bonds mean a stamp, a coupon for rice, various gift coupons, and the like. The packing cases mean a wrapping paper for a lunch box or the like, a plastic bottle, and the like and can be provided with an ID chip 23 (FIG. 21D). The books mean a book, a volume, and the like and can be provided with an ID chip 24 (FIG. 21E). The recording medium means DVD software, a video tape, and the like and can be provided with an ID chip 25 (FIG. 21F). The personal items mean a bag, glasses, and the like and can be provided with an ID chip 26 (FIG. 21G). The vehicles mean a wheeled vehicle such as a bicycle, a vessel, and the like and can be provided with an ID chip 27 (FIG. 21H). The foods mean eatables, beverages, and the like. The clothes mean wear, footwear, and the like. The health items mean medical devices, health appliances, and the like. The livingwares mean furniture, a lighting apparatus, and the like. The medicals mean medicines, agricultural chemicals, and the like. The electronic devices mean a liquid crystal display device, an EL display device, a television apparatus (a TV set and a thin television set), a mobile phone, and the like.

When an ID chip is mounted on the bills, the coins, the securities, the documents, the bearer bonds, and the like, counterfeiting thereof can be prevented. When an ID chip is mounted on the packing cases, the books, the recording medium, the personal belongings, the foods, the livingwares, the electronic devices, and the like, the efficiency of the inspection system, the rental system, and the like can be improved. When an ID chip is mounted on the vehicles, the health items, the medicals, and the like, counterfeiting and theft thereof can be prevented and the medicines can be prevented from being taken in the wrong manner. The ID chip may be attached to a surface of a product or mounted inside a product. For example, the ID chip may be mounted inside a page of a book, or mounted inside an organic resin of a package.

A processor chip can be used as a device for measuring evaluation on biological reaction of beings (a biological signal (a brain wave, electrocardiogram, electromyogram, blood pressure, or the like)), thus, it can be used in a medical field. FIG. 21C shows an example where a brain wave is measured by mounting a plurality of processor chips on a human body. The brain wave is measured by analyzing information obtained from a processor chip 22a, a processor chip 22b, and a processor chip 22c which are mounted on a human body. A physical health condition and a mental condition can be known by information obtained from the brain wave and the processor chip. Additionally, a processor chip is small size and lightweight; therefore, it can cut down on a burden of an examinee.

An example where the processor chip can be applied to material management and a distribution system is described with reference to FIGS. 22A and 22B. Here, a case where an ID chip is mounted on merchandise. As shown in FIG. 22A, an ID chip 1402 is mounted on a label 1401 of a beer bottle 1400.

The ID chip 1402 stores basic points such as a date manufactured, a manufacturing place, and a material thereof. Such basic points are not required to be rewritten, thus, it is preferable to use a memory medium which is not capable of being rewritten, such as a mask ROM or a memory transistor in the present invention to store them. In addition, the ID chip 1402 stores individual points such as a delivery address, delivery date and time, or the like of the beer bottle. For example, as shown in a FIG. 22B, the delivery address and the delivery date and time can be stored, when a beer bottle 1400 passes through a writer device 1413 with a flow of a belt conveyor 1412. Such individual points may be stored in a memory medium which is capable of being rewritten and cleared, such as an EEROM.

In addition, a system may be preferably built so that when data on the merchandise purchased is sent from a shop to a physical distribution management center through network, a writer device, a personal computer for controlling the writer device, or the like calculates a delivery address and delivery date and time to store in the ID chip.

Note that a beer bottle is delivered per case. In view of this, it is possible that an ID chip is mounted per case or per a plurality of cases to store an individual point.

As for such merchandise as is set several delivery addresses, time required for inputting manually can be suppressed, thereby input miss due to the manual procedures can be reduced, by mounting an ID chip. In addition to this, manpower cost that is the most expensive in the field of the physical distribution management can be reduced. Accordingly, physical distribution management can be conducted with less miss at a low cost by mounting an ID chip.

In addition, applied points such as grocery matched with a beer and a recipe using beer can be stored by a receiver. Then, advertisements of the grocery and the like can be carried out at the same time, which drives the consumers to buy. Such an applied point may be preferably stored in a memory medium which is capable of being rewritten and cleared, such as an EEROM. By mounting an ID chip (processor chip) as described above, the volume of information for being provided for a consumer can be increased, so that the consumer can purchase the merchandise without anxiety.

Example 1

In this embodiment mode, an effect of the present invention is described based on an experimental result.

An experiment about a current-voltage (I-V) characteristic of a thin film transistor manufactured according to the present invention is conducted by a simulation. Thin film transistors which are measured are a total of ten types which are an n-channel thin film transistor (Structure A), four types (Structures B, C, D, and E) of n-channel thin film transistors each having a lightly doped p-type impurity region, a p-channel thin film transistor (Structure F), and four types (Structures G, H, I, and J) of p-channel thin film transistors each having a lightly doped n-type impurity region. Each structure of the thin film transistors is illustrated in FIGS. 23B, 24B, 25B, and 26B.

A simulation result of a current-voltage (I-V) characteristic of the n-channel thin film transistor having the light doped p-type impurity region is explained with reference to FIGS. 23A, 23B, 24A, and 24B. FIG. 23A shows an I-V characteristic of a standard n-channel thin film transistor and an n-channel thin film transistor in which the lightly doped p-type impurity region (hereinafter, $p^-$) is provided to a drain side by assuming a model diagram of a thin film transistor illustrated in FIG. 23B.

FIG. 23B shows structures of the thin film transistors. Structure A is a standard n-channel thin film transistor having Loff, Structure B is an n-channel thin film transistor having a $p^-$ with a width of 100 nm, and Structure C is an n-channel thin film transistor having a $p^-$ with a width of 300 nm. Simulation of an I-V characteristic is performed in the conditions in each thin film transistor, that is, L/W is 1000/20000 nm, an Loff region width is 300 nm, a gate insulating film thickness is 20 nm, impurity concentration in source and drain regions (denoted by $n^+$) is $1 \times 10^{20}$ cm$^{-3}$, impurity concentration in the Loff region is $1 \times 10^{18}$ cm$^{-3}$, and impurity concentration of a $p^-$ is $1 \times 10^{18}$ cm$^{-3}$.

In FIG. 23A, a full line indicates the I-V characteristic of Structure A and a broken line indicates the I-V characteristics of Structure B and Structure C having a $p^-$. Since Structure B and C have the $p^-$, it is found that a threshold value is shifted to a positive side. Further, it can be found that the threshold value is shifted as the width of the $p^-$ is increased (that is, the threshold value of Structure C is more shifted than that of Structure B).

FIGS. 24A and 24B show a simulation result of an I-V characteristic of a thin film transistor provided with a $p^-$ at its source side. FIG. 24A shows an I-V characteristic of an n-channel thin film transistor provided with a standard n-channel thin film transistor and a lightly doped p-type impurity region (hereinafter, $p^-$) at its source side assuming a model diagram of a thin film transistor illustrated in FIG. 24B.

FIG. 24B shows structures of thin film transistors. In FIG. 24B, Structure A is the same as the standard n-channel thin film transistor illustrated in FIG. 23B, Structure D is an n-channel thin film transistor having a $p^-$ with a width of 100 nm, and Structure E is an n-channel thin film transistor having a $p^-$ with a width of 300 nm. The level of the L/W, the Loff region width, the gate insulating film thickness, and $n^+$ concentration were the same as those in FIGS. 23A and 23B.

In FIG. 24A, a full line indicates the I-V characteristic of Structure A and broken lines respectively indicate the I-V characteristics of Structure D and Structure E having a $p^-$. Since Structure D and E have the $p^-$, it is found that a threshold value is shifted to a positive side. Further, it can be found that the threshold value is shifted as the width of the $p^-$ is increased (that is, the threshold value of Structure E is more shifted than that of Structure D). Moreover, a cutoff current (Icut) is lowered than that of the standard n-channel thin film transistor. The cutoff current (Icut) is the value of a drain current Id at gate voltage Vg of 0 V in an Id-Vg characteristic.

As noted above, by using an n-channel thin film transistor that is covered by a gate electrode and that has a p-type lightly doped drain region in a channel formation region and either of source or drain regions, a threshold value is shifted and a cutoff current is reduced. Conventionally, a thin film transistor that is required to operate at high speed such as a processor, a DRAM, an image processing circuit, or a voice processing circuit has a short channel structure; however, there is a problem that a short channel length causes the reduction of a threshold value and the increase of a cutoff current. A thin film transistor according to this example can reduce a cutoff current despite of having a short channel structure. By using such the thin film transistor in all important positions in a semiconductor device, power consumption of the entire semiconductor device can be reduced. For instance, such the thin film transistor connected between a thin film transistor for logic and a power source to be turned on in operating and to be turned off in nonoperating, power consumption in a standby state can be reduced. Alternatively, by forming a logic by the thin film transistor in a block that does not require high speed operation, power consumption of the entire semiconductor device can be reduced.

A simulation result of a current-voltage (I-V) characteristic of the p-channel thin film transistor having the lightly doped n-type impurity region is explained with reference to FIGS. 25A, 25B, 26A and 26B. FIG. 25A shows an I-V characteristic of a standard p-channel thin film transistor and a p-channel thin film transistor in which the lightly doped n-type impurity region (hereinafter, $n^-$) is provided to a drain side by assuming a model diagram illustrated in FIG. 25B.

FIG. 25B shows structures of the thin film transistors. Structure E is a standard p-channel thin film transistor having an Loff, Structure F is a p-channel thin film transistor having an $n^-$ with a width of 100 nm, and Structure C is a p-channel thin film transistor having an $n^-$ with a width of 300 nm. Simulation of an I-V characteristic is performed in the conditions in each thin film transistor, that is, L/W is 1000/20000 nm, an Loff region width is 300 nm, a gate insulating film thickness is 20 nm, impurity concentration in source and drain regions (denoted by $p^+$) is $1 \times 10^{20}$ cm$^{-3}$, impurity concentration in the Loff region is $1 \times 10^{18}$ cm$^{-3}$, and impurity concentration of $p^-$ is $1 \times 10^{18}$ cm$^{-3}$.

In FIG. 25A, a full line indicates the I-V characteristic of Structure F and broken lines respectively indicate the I-V characteristics of Structure G and Structure H having an $n^-$. Since Structure G and H have the $n^-$, it is found that a threshold value is shifted to a negative side. Further, it can be found that the threshold value is shifted as the width of the $n^-$ is increased (that is, the threshold value of Structure H is more shifted than that of Structure G).

FIGS. 26A and 26B show a simulation result of an I-V characteristic of a p-channel thin film transistor provided with an $n^-$ at its source side. FIG. 26A shows an I-V characteristic of a standard p-channel thin film transistor and a p-channel thin, film transistor provided with a lightly doped n-type impurity region (hereinafter, $n^-$) at its source side assuming a model diagram illustrated in FIG. 26B.

FIG. 26B shows structures of thin film transistors. Structure F is the same as the standard p-channel thin film transistor illustrated in FIG. 26B, Structure I is a p-channel thin film transistor having an $n^-$ with a width of 100 nm, and Structure J is a p-channel thin film transistor having an $n^-$ with a width of 300 nm. The level of the L/W, the Loff region width, the gate insulating layer thickness, and $p^+$ concentration are the same as those in FIGS. 26A and 26B.

In FIG. 26A, a full line indicates the I-V characteristic of Structure F and broken lines respectively indicate the I-V characteristics of Structure I and Structure J having an $n^-$ Since Structures I and J have the n⁻, it is found that a threshold value is shifted to a negative side. Further, it can be found that the threshold value is shifted as the width of the n⁻ is increased (that is, the threshold value of Structure J is more shifted than that of Structure I). Moreover, a cutoff current (Icut) is lowered than that of the standard p-channel thin film transistor. That is, high speed operation and reducing power consumption are possible as the n-channel thin film transistor.

The invention claimed is:

1. A method for manufacturing a semiconductor device, comprising:

forming an amorphous semiconductor film over an insulating surface;

emitting laser light to the amorphous semiconductor film to form a crystalline semiconductor film;

patterning the crystalline semiconductor film to form a first semiconductor layer and a second semiconductor layer;

forming a gate insulating film over the first semiconductor layer and the second semiconductor layer;

forming a first gate electrode layer and a second gate electrode layer over the gate insulating film;

doping an impurity element for imparting a first one conductive type to the first semiconductor layer and the second semiconductor layer from one direction diagonally to surfaces of the first semiconductor layer and the second semiconductor layer using the first gate electrode layer and the second gate electrode layer as masks in order to form first impurity regions in the first semiconductor layer and second impurity regions in the second semiconductor layer;

doping an impurity element for imparting a second one conductive type to the first semiconductor layer and the second semiconductor layer perpendicularly to the surfaces of the first semiconductor layer and the second semiconductor layer using the first gate electrode layer and the second gate electrode layer as masks in order to form a third impurity region, fifth impurity regions, and a first channel formation region in the first semiconductor layer so that the third impurity region is covered with the first gate electrode layer and between the first channel formation region and one of the fifth impurity regions, and the first channel formation region is in contact with the other of the fifth impurity regions and forming a fourth impurity region, sixth impurity regions, and a second channel formation region in the second semiconductor layer so that the fourth impurity region is covered with the second gate electrode layer and is between the second channel formation region and one of the sixth impurity regions, and the second channel formation region is in contact with the other of the sixth impurity regions;

forming first side walls on sides of the first gate electrode layer and second side walls on sides of the second gate electrode layer;

etching parts of a gate insulating film to form first and second gate insulating layers;

doping an impurity element for imparting the second one conductive type to the first semiconductor layer and the second semiconductor layer perpendicularly to the surfaces of the first semiconductor layer and the second semiconductor layer using the first gate electrode layer and the second gate electrode layer as masks in order to form seventh impurity regions, a first source region, and a first drain region in the first semiconductor layer so that one of the seventh impurity regions is covered with one of the first side walls and is between the third impurity region and the first source region, the other of seventh impurity regions is covered with the other of the first side walls and is in contact with the first drain region and in order to form eighth impurity regions, a second source region, and a second drain region in the second semiconductor layer so that one of the eighth impurity regions is covered with one of the second side walls and is between the fourth impurity region and the second drain region, the other of eighth impurity regions is covered with the other of the second side walls and is in contact with the second source region;

forming a silicide in contact with surfaces of the first source region, the second source region, the first drain region, and the second drain region; and forming a first source electrode layer, a second source electrode layer, a first drain electrode layer, a second drain electrode layer to be in contact with the silicide.

2. The method for manufacturing a semiconductor device according to claim 1, wherein the first impurity regions, the second impurity regions, the third impurity region, and the fourth impurity region are formed by adding an impurity element for imparting a p-type as the impurity element for imparting the first one conductive type, and wherein the first source region, the second source region, the first drain region, and the second drain region are formed by adding an impurity element for imparting an n-type as the impurity element for imparting the second one conductive type.

3. The method for manufacturing a semiconductor device according to claim 1, wherein the first impurity regions, the second impurity regions, the third impurity region, and the fourth impurity region are formed by adding an impurity element for imparting an n-type as the impurity element for imparting the first one conductive type, and wherein the first source region, the second source region, the first drain region, and the second drain region are formed by adding an impurity element for imparting a p-type as the impurity element for imparting the second one conductive type.

4. The method for manufacturing a semiconductor device according to claim 1, wherein the laser light is continuous-wave laser light.

5. The method for manufacturing a semiconductor device according to claim 1, wherein the laser light is pulsed laser light, and a pulse repetition frequency of the pulsed laser light is 0.5 MHz or more.

6. The method for manufacturing a semiconductor device according to claim 1, wherein the first impurity regions are formed using only the first gate electrode layer and the second gate electrode layer as masks.

7. The method for manufacturing a semiconductor device according to claim 1, wherein the insulating surface is a surface over a glass substrate or a quartz substrate.

8. The method for manufacturing a semiconductor device according to claim 1, wherein the insulating surface is a surface of an insulating film over one selected from the group of a silicon substrate, a metal substrate, and a stainless substrate.

9. The method for manufacturing a semiconductor device according to claim 1, wherein the crystalline semiconductor film is patterned by a photolithography method.

* * * * *